(12) United States Patent
Kodama

(10) Patent No.: US 6,830,867 B2
(45) Date of Patent: Dec. 14, 2004

(54) POSITIVE PHOTOSENSITIVE COMPOSITION

(75) Inventor: Kunihiko Kodama, Shizuoka (JP)

(73) Assignee: Fuji Photo Film Co., Ltd., Kanagawa (JP)

(*) Notice: Subject to any disclaimer, the term of this patent is extended or adjusted under 35 U.S.C. 154(b) by 85 days.

(21) Appl. No.: 10/261,655

(22) Filed: Oct. 2, 2002

(65) Prior Publication Data

US 2003/0148206 A1 Aug. 7, 2003

(30) Foreign Application Priority Data

Oct. 3, 2001 (JP) ................................ P.2001-307537

(51) Int. Cl.$^7$ .............................................. G03F 7/004
(52) U.S. Cl. .................... 430/270.1; 430/921; 430/905
(58) Field of Search ............................ 430/270.1, 905, 430/921

(56) References Cited

U.S. PATENT DOCUMENTS 6,291,130 B1   9/2001   Kodama et al.

2001/0041303 A1   11/2001   Sato
2002/0098440 A1   7/2002   Sato et al.
2003/0017415 A1   1/2003   Kodama et al.

FOREIGN PATENT DOCUMENTS

| | | |
|---|---|---|
| DE | 100 54 550 A1 | 5/2001 |
| EP | 0 877 293 A2 | 11/1998 |
| EP | 1 091 248 A1 | 4/2001 |
| EP | 1 096 319 A1 | 5/2001 |
| EP | 1 267 210 A2 | 12/2002 |
| EP | 1 296 190 A1 | 3/2003 |
| JP | 2000-292917 | 10/2000 |

OTHER PUBLICATIONS

European Search Report dated Aug. 27, 2003.

*Primary Examiner*—Rosemary Ashton
(74) *Attorney, Agent, or Firm*—Sughrue Mion, PLLC

(57) ABSTRACT

A positive photosensitive composition containing (A) an acid generator capable of generating an acid by irradiation with actinic ray or radiation and having a structure represented by formula (I) defined in the specification and (B) a resin having a monocyclic or polycyclic alicyclic hydrocarbon structure and being decomposed by the action of an acid to increase solubility in an alkali developer.

16 Claims, No Drawings

POSITIVE PHOTOSENSITIVE COMPOSITION

FIELD OF THE INVENTION

The present invention relates to a positive photosensitive composition used in a manufacturing process of semiconductors, such as ICs, in a process of producing circuit boards for liquid crystal display and thermal head, and in other photofabrication processes. More specifically, the invention is concerned with a positive photosensitive composition suitable for using far ultraviolet radiation having a wavelength of not longer than 250 nm or the like as an exposure light source.

BACKGROUND OF THE INVENTION

Chemical amplification positive resist compositions are materials for forming patterns on substrates. Specifically, when those resist compositions are irradiated with far ultraviolet radiation or the like, they generate acids in the irradiated areas, and undergo reaction utilizing the acids as a catalyst to cause a difference in solubility in a developer between the unirradiated areas and irradiated areas with such radiation, thereby enabling the pattern formation.

In the case where KrF excimer laser is used as an exposure light source, a resin containing as its basic skeleton poly(hydroxystyrene) showing weak absorption in the region of 248 nm are used as a main component. Therefore, such a resist composition has high sensitivity and high resolution and can form good-quality patterns compared with traditional resist compositions containing naphthoquinonediazide/navolak resin combination.

However, when a light source of a shorter wavelength, such as ArF exceimer laser (193 nm), is used for exposure, even the aforementioned resist composition of chemical amplification type is not satisfactory, because compound having aromatic group inherently has strong absorption at a wavelength around 193 nm.

Utilization of poly(meth)acrylate as a polymer having weak absorption in the region of 193 nm is described in *J. Vac. Sci. Technol.*, B9, 3357 (1991). However, such a polymer has a problem of being inferior to currently used phenol resins having aromatic groups in resistance to dry etching ordinarily carried out in a manufacturing process of semiconductors.

Japanese Patent Laid-Open No. 2000-292917 discloses the chemical amplification positive resist composition using as an acid generator a mixture of a triarylsulfonium salt type of acid generator and a phenacylsulfonium salt type of acid generator. However, resist compositions currently in use have a problem in that when it is attempted to resolve fine patterns, a pattern collapsing is caused to result in deterioration of resolution. Therefore, solution of such a problem and improvement in line profile are required.

SUMMERY OF THE INVENTION

It is therefore an object of the invention to provide a positive photosensitive composition that can form patterns prevented from pattern collapsing even when attempts to resolve fine patterns are made, and achieves improvement in line profile.

Other objects of the invention will become apparent from the following description.

The objects of the invention are attained with positive photosensitive compositions having the following constitutions.

(1) A positive photosensitive composition comprising (A) an acid generator, which generates an acid upon irradiation with actinic ray or radiation, represented by formula (I) shown below, and (B) a resin having a monocyclic or polycyclic alicyclic hydrocarbon structure and being decomposed by the action of an acid to increase dissolution speed in an alkali developer.

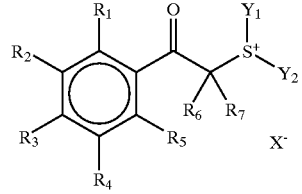

wherein $R_1$ to $R_5$, which may be the same or different, each represent a hydrogen atom, a nitro group, a halogen atom, or an unsubstituted or substituted alkyl, alkoxy, alkyloxycarbonyl, aryl or acylamino group, or at least two of $R_1$ to $R_5$ may combine with each other to form a cyclic structure; $R_6$ and $R_7$, which may be the same or different, each represent a hydrogen atom, a cyano group, or an unsubstituted or substituted alkyl or aryl group; $Y_1$ and $Y_2$, which may be the same or different, each represent an unsubstituted alkyl group, an alkyl group having a substituent, an ether linkage group or a sulfide linkage group, or an unsubstituted or substituted alkenyl group, provided that when both $Y_1$ and $Y_2$ are alkyl groups, at least either $Y_1$ or $Y_2$ has a hydroxy group, an ether linkage group or a sulfide linkage group, or each of the alkyl groups contains at least 2 carbon atoms; at least one of $R_1$ to $R_5$ and at least either $Y_1$ or $Y_2$ may combine with each other to complete a ring, at least one of $R_1$ to $R_5$ and at least either $R_6$ or $R_7$ may combine with each other to complete a ring, at least two structures represented by formula (I) may be linked together in any of the positions of $R_1$ to $R_7$, $Y_1$ and $Y_2$ via a linkage group; and $X^-$ represents a non-nucleophilic anion.

(2) The positive photosensitive composition as described in (1), which further comprises (C) a basic compound and (D) a fluorine-contained and/or silicon-contained surfactant.

(3) The positive photosensitive composition as described in (2), wherein the basic compound (C) is a compound having at least one structure selected from an imidazole structure, a diazabicyclo structure, an onium hydroxide structure, an onium carboxylate structure, a trialkylamine structure and an aniline structure.

(4) The positive photosensitive composition as described in any one of (1) to (3), which further comprises (F) a dissolution-inhibiting low-molecular compound having a molecular weight of at most 3,000 and a group capable of being decomposed by the action of an acid to increase solubility in an alkali developer.

(5) The positive photosensitive composition as described in any one of (1) to (4), wherein the resin (B) further contains a repeating unit having a lactone structure.

In addition, a preferred embodiment of the invention is described below.

(6) The positive photosensitive composition as described in any one of (1) to (5), which further comprises (E) a mixture of a hydroxyl group-containing solvent and a hydroxyl group-free solvent.

DETAILED DESCRIPTION OF THE INVENTION

<<(A) Acid Generator>>

The acid generator used in the invention is a compound represented by the foregoing formula (I), which can generate an acid when irradiated with actinic ray or radiation.

In formula (I), $R_1$ to $R_5$ may be the same or different, and each of them represents a hydrogen atom, a nitro group, a halogen atom, or an unsubstituted or substituted alkyl, alkoxy, alkyloxycarbonyl, aryl or acylamino group. Alternatively, at least any two of $R_1$ to $R_5$ groups may combine with each other to complete a ring structure.

$R_6$ and $R_7$ may be the same or different, and each of them represents a hydrogen atom, a cyano group, or an unsubstituted or substituted alkyl or aryl group.

$Y_1$ and $Y_2$ may be the same or different, and each of them represents an alkyl group which may contain a substituent, an ether linkage group or a sulfide linkage group, or an alkenyl group which may have a substituent, provided that when both $Y_1$ and $Y_2$ are alkyl groups, at least either $Y_1$ or $Y_2$ has a hydroxy group, an ether linkage group or a sulfide linkage group, or each of the alkyl groups contains at least 2 carbon atoms.

At least any one of $R_1$ to $R_5$ and at least either $Y_1$ or $Y_2$ may combine with each other to complete a ring.

At least any one of $R_1$ to $R_5$ and at least either $R_6$ or $R_7$ may combine with each other to complete a ring.

In addition, at least two structures represented by formula (I) may be present in the compound of formula (I) by being linked together in any of the positions of $R_1$ to $R_7$, $Y_1$ and $Y_2$ via a linkage group.

$X^-$ represents a non-nucleophilic anion.

The alkyl groups and the alkyl moieties in acylamino groups represented by $R_1$ to $R_5$ are preferably $C_1$–$C_{10}$ alkyl groups, with examples including linear, branched and cyclic alkyl groups, such as a methyl group, an ethyl group, a propyl group, a n-butyl group, a sec-butyl group, a cyclobutyl group, a pentyl group, a neopentyl group, a cyclopentyl group, a hexyl group, a cyclohexyl group, a heptyl group, an octyl group, a nonyl group and a decyl group.

The alkoxy groups and the alkoxy moieties in alkyloxycarbonyl groups represented by $R_1$ to $R_5$ are preferably $C_1$–$C_{10}$ alkoxy groups, with examples including a methoxy group, an ethoxy group, a propoxy group, a butoxy group, a pentyloxy group, a hexyloxy group, a cyclohexyloxy group, a heptyloxy group, an octyloxy group, a nonyloxy group and a decyloxy group.

The aryl groups represented by $R_1$ to $R_5$ are preferably $C_6$–$C_{14}$ aryl groups, with examples including a phenyl group, a tolyl group and a naphthyl group.

The halogen atoms represented by $R_1$ to $R_5$ are, e.g., fluorine, chlorine, bromine and iodine atoms.

The alkyl groups represented by $Y_1$ and $Y_2$ are preferably $C_1$–$C_{20}$ alkyl groups, with examples including linear, branched and cyclic alkyl groups, such as a methyl group, an ethyl group, a propyl group, an isopropyl group, a n-butyl group, an isobutyl group, a tert-butyl group, a n-hexyl group, a cyclohexyl group, an octyl group and a dodecyl group. Of these groups, $C_3$–$C_{20}$ alkyl groups including linear, branched and cyclic ones, such as a propyl group, an isopropyl group, a n-butyl group, an isobutyl group, a tert-butyl group, a n-hexyl group, a cyclohexyl group, an octyl group and a dodecyl group are preferred. In particular, $C_4$–$C_{12}$ alkyl groups including linear, branched and cyclic ones, such as a n-butyl group, an isobutyl group, a tert-butyl group, a n-hexyl group, a cyclohexyl group, an octyl group and a dodecyl group are preferred.

The alkenyl groups represented by $Y_1$ and $Y_2$ are preferably $C_2$–$C_6$ alkenyl groups, with examples including a vinyl group, a propenyl group, a butenyl group and a hexenyl group.

At least any two of $R_1$ to $R_5$ may combine with each other to complete a ring structure.

In such case, the group formed by binding at least two of $R_1$ to $R_5$ together is preferably a $C_4$–$C_{10}$ alkylene group, such as a butylene group, a pentylene group or a hexylene group.

Each of the alkyl groups, the alkoxy groups, the alkoxycarbonyl groups, the aryl groups, the aralkyl groups and the alkenyl groups may be substituted with, e.g., a nitro group, a halogen atom, a carboxyl group, a hydroxy group, an amino group, a cyano group, an alkoxy group (preferably containing 1 to 5 carbon atoms), or an alkylthio group (preferably containing 1 to 5 carbon atoms).

Of these substituents, halogen atoms are preferred as substituents of the alkyl groups.

When both $Y_1$ and $Y_2$ are alkyl groups, at least either $Y_1$ or $Y_2$ is an alkyl group having a hydroxy group, an ether linkage group or a sulfide linkage group, or each of the alkyl groups contains at least 2 carbon atoms.

When both $Y_1$ and $Y_2$ are alkyl groups having neither substituent nor linkage group, it is preferred that each of the alkyl groups contain at least 3 carbon atoms, more preferably at least 4 carbon atoms.

It is particularly preferred that $Y_1$ and $Y_2$ each represent a butyl group or a hydroxyethyl group.

The case where $Y_1$ and $Y_2$ combine with each other to form a ring structure is undesirable, because it causes pattern collapsing.

The total number of carbon atoms contained in $R_1$ to $R_5$ is preferably at least 1, and the case where all of $R_1$ to $R_5$ are hydrogen atoms is preferable in particular.

Examples of a non-nucleophilic anion represented by $X^-$ include a sulfonic acid anion, a carboxylic acid anion, bis(alkylsulfonyl)imide anions and tris(alkylsulfonyl) methyl anions.

The term "a non-nucleophilic anion" as used herein means an anion having a very low capability to cause nucleophilic reaction, and can prevent the acid generator from decomposing through intramolecular nucleophilic reaction with the passage of time. The presence of such an anion results in improved storage stability of the resist.

Examples of a sulfonic acid anion include alkylsulfonic acid anions, arylsulfonic acid anions, and a camphorsulfonic acid anion.

Examples of a carboxylic acid anion include alkylcarboxylic acid anions, arylcarboxylic acid anions and aralkylcarboxylic acid anions.

Preferred examples of alkyl moieties in the alkylsulfonic acid anions include $C_1$–$C_{30}$ alkyl groups, such as a methyl group, an ethyl group, a propyl group, an isopropyl group, a n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group and a bornyl group.

Preferred examples of aryl moieties in the arylsulfonic acid anions include $C_6$–$C_{14}$ aryl groups, such as a phenyl group, a tolyl group and a naphthyl group.

The alkyl moieties and the aryl moieties in the alkylsulfonic acid anions and the arylsulfonic acid anions may have a substituent.

Examples of such a substituent include a halogen atom, an alkyl group, an alkoxy group and an alkylthio group.

Examples of the halogen atom include a chlorine atom, a bromine atom, a fluorine atom and an iodine atom.

Preferred examples of the alkyl group include $C_1$–$C_{15}$ alkyl groups, such as a methyl group, an ethyl group, a propyl group, an isopropyl group, a n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group and an eicosyl group.

Preferred examples of the alkoxy group include $C_1$–$C_5$ alkoxy groups, such as a methoxy group, an ethoxy group, a propoxy group and a butoxy group.

Preferred examples of the alkylthio group include $C_1$–$C_{15}$ alkylthio groups, such as a methylthio group, an ethylthio group, a propylthio group, an isopropylthio group, a n-butylthio group, an isobutylthio group, a sec-butylthio group, a pentylthio group, a neopentylthio group, a hexylthio group, a heptylthio group, an octylthio group, a nonylthio group, a decylthio group, an undecylthio group, a dodecylthio group, a tridecylthio group, a tetradecylthio group, a pentadecylthio group, a hexadecylthio group, a heptadecylthio group, an octadecylthio group, a nonadecylthio group and an eicosylthio group.

The alkyl group, alkoxy group and alkylthio group may further be substituted with a halogen atom (preferably a fluorine atom).

Examples of alkyl moieties in the alkylcarboxylic acid anions include the same alkyl groups as recited for the alkyl moieties in the alkylsulfonic acid anions.

Examples of aryl moieties in the arylcarboxylic acid anions include the same aryl groups as recited for the aryl moieties in the arylsulfonic acid anions.

Preferred examples of the aralkyl moieties in the aralkylcarboxylic acid anions include $C_7$–$C_{12}$ aralkyl groups, such as a benzyl group, a phenetyl group, a naphthylmethyl group and a naphthylethyl group.

The alkyl moieties, aryl moieties and aralkyl moieties in the alkylcaroxylic acid anions, the arylcarboxylic acid anions and the aralkylcarboxylic acid anions may have a substituent. Examples of the substituent include a halogen atom, an alkyl group, an alkoxy group and an alkylthio group similarly to the case of arylsulfonic acid anions.

The alkyl moieties in the bis(alkylsulfonyl)imide anions and tris(alkylsulfonyl)methyl anions are preferably $C_1$–$C_5$ alkyl groups, such as a methyl group, an ethyl group, a propyl group, an isopropyl group, a n-butyl group, an isobutyl group, a sec-butyl group, a pentyl group and a neopentyl group. The alkyl moieties may have a substituent, such as a halogen atom, an alkoxy group and an alkylthio group.

Examples of other non-nucleophilic anions include phosphorus fluoride anion, boron fluoride anion and antimony fluoride anion.

As to the non-nucleophilic anion represented by $X^-$, a sulfonic acid anion substituted with a fluorine atom in its 1-position is preferred, and a perfluoroalkanesulfonic acid anion is more preferred.

In addition to these anions, a benzenesulfonic acid anion substituted with a fluorine atom or a fluorine-containing substituent is preferred as the non-nucleophilic acid anion represented by $X^-$.

In formula (I), at least any one of $R_1$ to $R_5$ and at least either $Y_1$ or $Y_2$ may be bound together to complete a ring, or at least any one of $R_1$ to $R_5$ and either $R_6$ or $R_7$ may be bound together to complete a ring.

In such a case, the group formed by binding at least one of $R_1$ to $R_5$ and at least either $Y_1$ or $Y_2$ together, or the group formed by binding at least one of $R_1$ to $R_5$ and at least either $R_6$ or $R_7$ is preferably $C_2$–$C_{10}$ alkylene group, such as an ethylene group, a propylene group, a butylene group, a pentylene group and a hexylene group.

By the formation of ring in the compound represented by formula (I), the steric configuration of the compound is fixed and the photolysis efficiency of the compound increases.

The present compound may have at least two structures represented by formula (I) by being bound together via at least one linkage group in any of the positions of $R_1$ to $R_5$, $Y_1$ and $Y_2$.

Specific examples of the compound represented by formula (I) according to the invention are illustrated below, but these examples should not be construed as limiting the scope of the invention in any way.

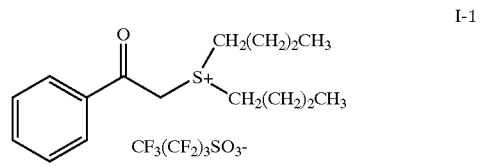

I-1

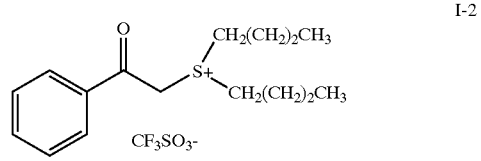

I-2

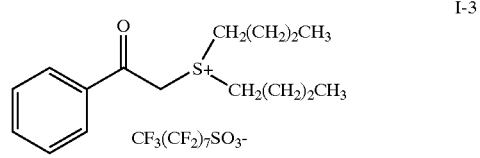

I-3

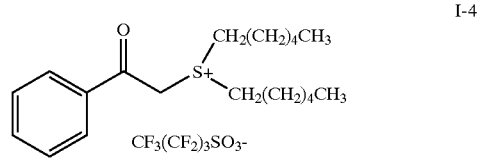

I-4

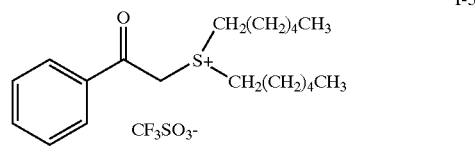

I-5

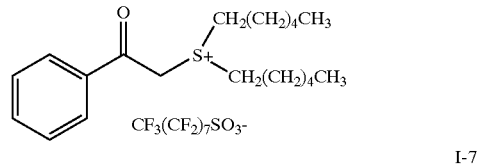

I-6

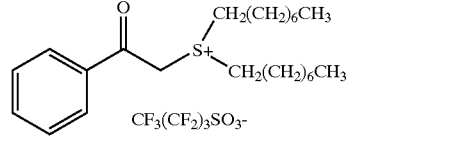

I-7

-continued
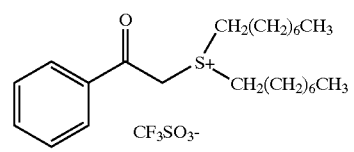
I-8
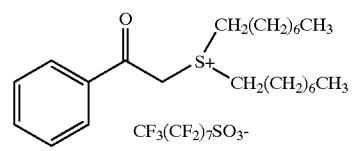
I-9
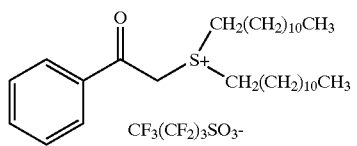
I-10
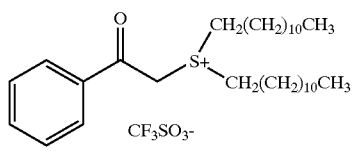
I-11
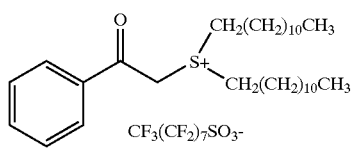
I-12
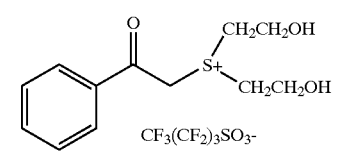
I-13
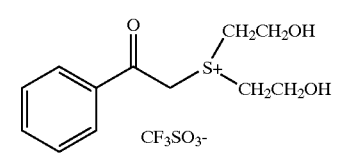
I-14
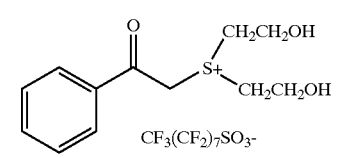
I-15
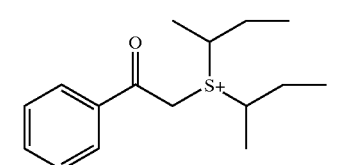
I-16
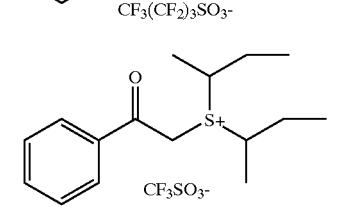
I-17
-continued
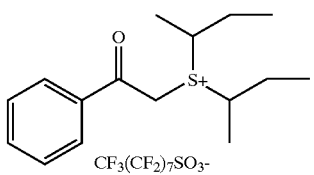
I-18
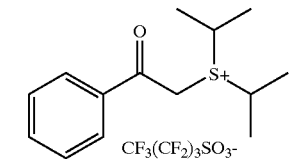
I-19
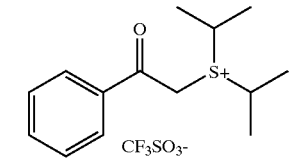
I-20
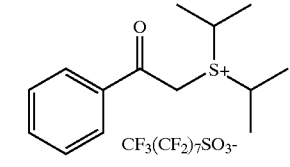
I-21
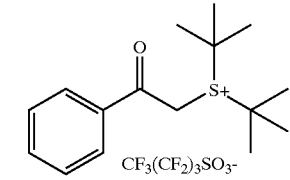
I-22
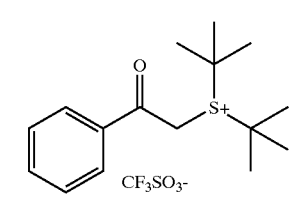
I-23
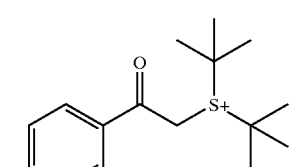
I-24
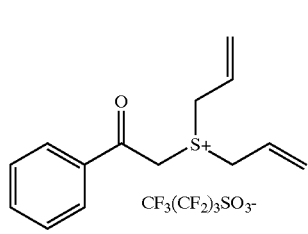
I-25

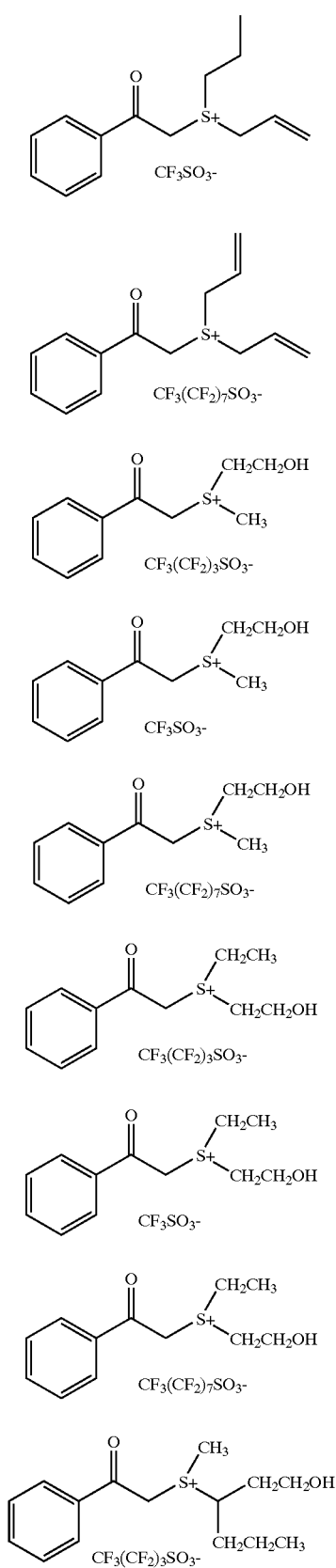
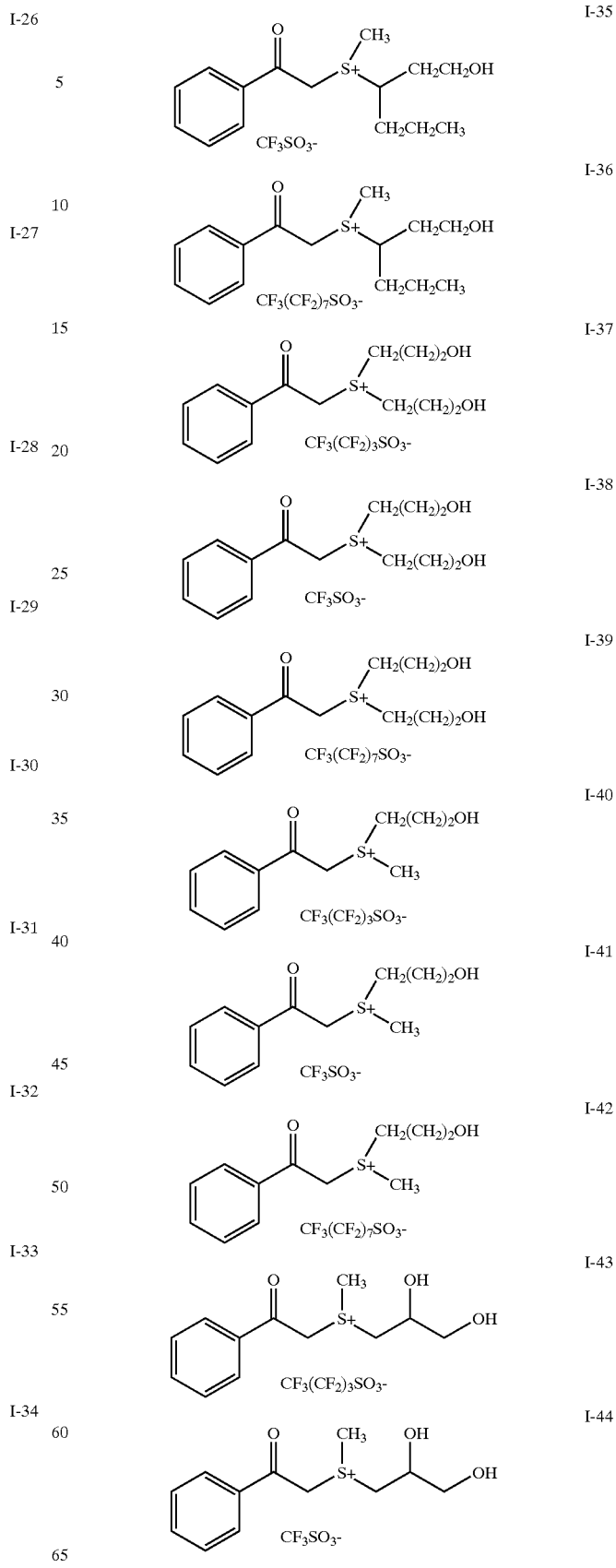

-continued
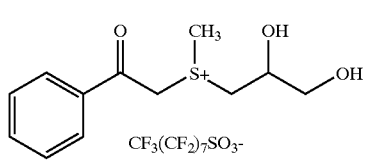
I-45
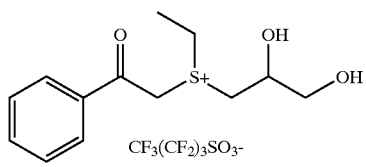
I-46
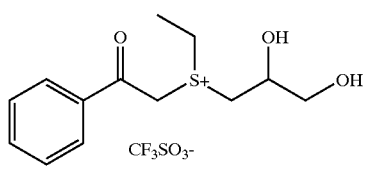
I-47
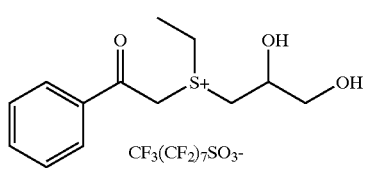
I-48
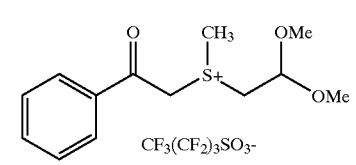
I-49
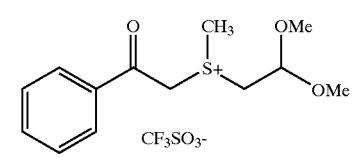
I-50
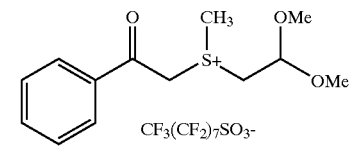
I-51
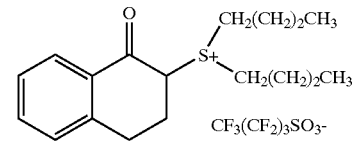
I-52
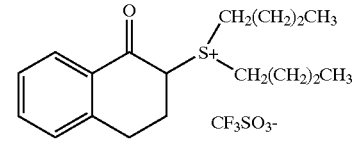
I-53
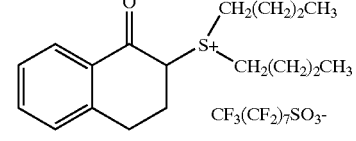
I-54
-continued
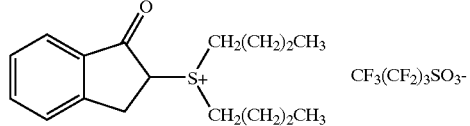
I-55
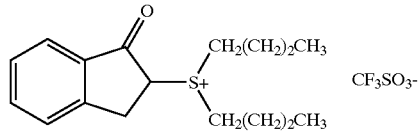
I-56
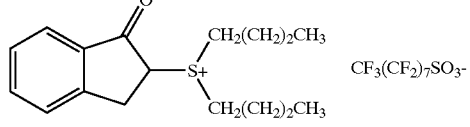
I-57
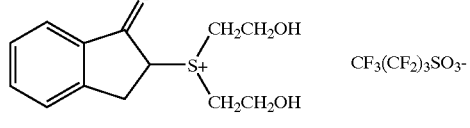
I-58
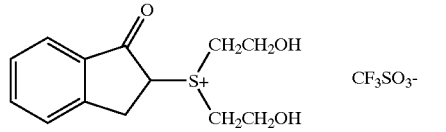
I-59
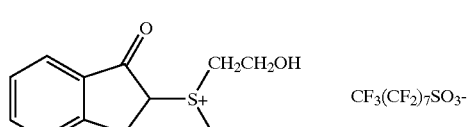
I-60
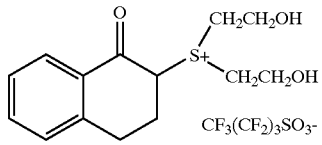
I-61
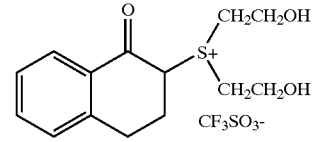
I-62
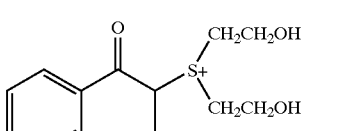
I-63
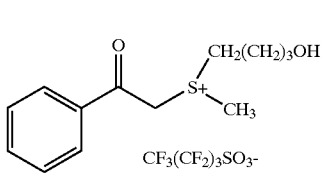
I-64

I-65 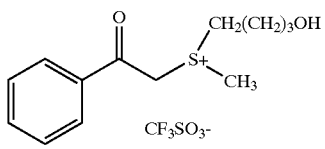

I-66 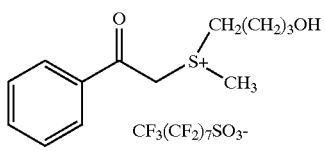

I-67 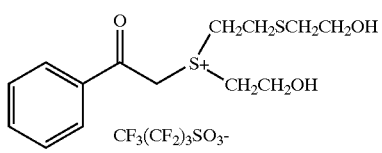

I-68 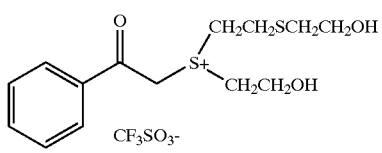

I-69 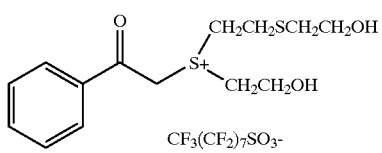

I-70 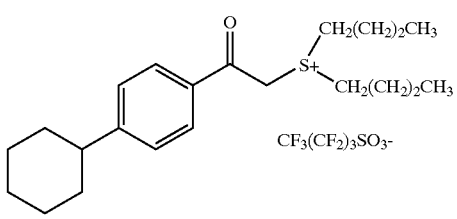

I-71 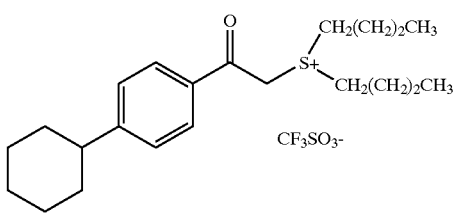

I-72 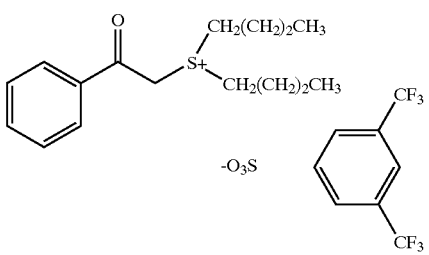

I-73 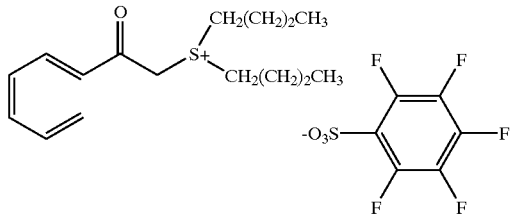

I-74 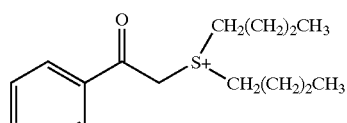

I-75 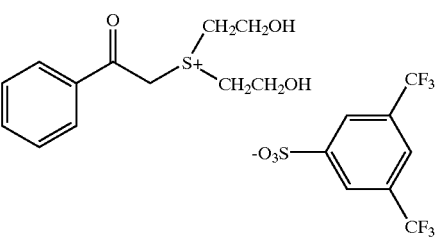

The compounds represented by formula (I) can be used alone or as a combination of two or more thereof.

The compound of formula (I) can be obtained by reacting a phenacyl halogenide derivative such as a phenacyl bromide with sulfide in an appropriate solvent in the absence of a catalyst or in the presence of a silver catalyst to produce a phenacyldialkylsulfonium salt, and then by carrying out salt exchange between the sulfonium salt produced and the corresponding anion.

The content of the compound as Component (A) in the positive photosensitive composition of the invention is preferably from 0.1 to 20 weight %, more preferably from 0.5 to 10 weight %, and still more preferably from 1 to 7 weight %, on the basis of solids in the composition.

<Acid-Generating Compounds, Other than Component (A), Usable in Combination with Component (A)>

In addition to Component (A), other compounds capable of generating acids through decomposition by irradiation with actinic ray or radiation may be used in the invention.

A ratio of the amount of Component (A) used to the amount of photo-acid generator used together with Component (A) is ordinarily from 100/0 to 20/80, preferably from 100/0 to 40/60, and more preferably from 100/0 to 50/50.

The photo-acid generator usable together with Component (A) can be selected appropriately from photo-initiators for cationic photopolymerization, photo-initiators for radical photopolymerization, photodecoloring agents for dyes, photodiscoloring agents, known compounds which can generate acids upon irradiation with actinic ray or radiation used in microresist, and a mixture thereof.

Examples of such a photo-acid generator include diazonium salts, phosphonium salts, sulfonium salts, iodonium salts, imidosulfonate, oxime sulfonate, diazodisulfone, disulfone, and o-nitrobenzylsulfonate.

In addition, it is also possible to use polymers having the groups or compounds capable of generating acids when irradiated with actinic ray or radiation introduced into the main or side chains thereof. Examples of such polymers include the compounds disclosed in U.S. Pat. No. 3,849,137, German Patent No. 3,914,407, and Japanese Patent Laid-Open Nos. 26653/1988, 164824/1980, 69263/1987, 146038/1988, 163452/1988, 153853/1987 and 146029/1988.

Further, the compounds capable of generating acids upon exposure to light as disclosed in U.S. Pat. No. 3,779,778 and European Patent No. 126,712 can be employed.

Of the compounds capable of generating acid when irradiated with actinic ray or radiation which may be used together with Component (A), specific examples of particularly preferred compound are illustrated below.

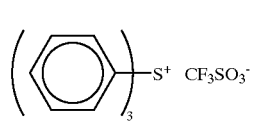(z1)

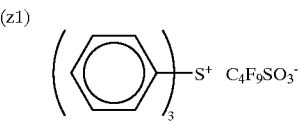(z2)

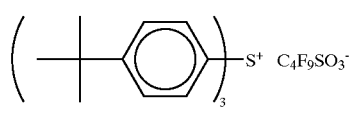(z3)

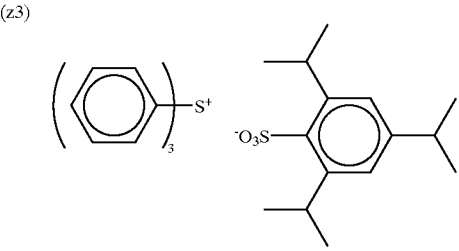(z4)

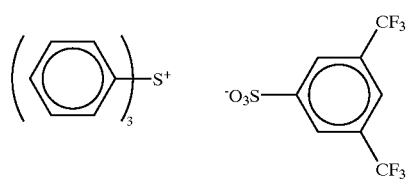(z5)

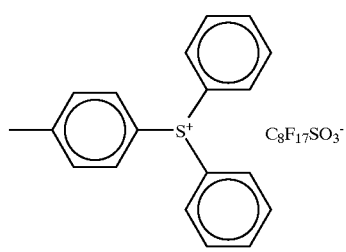(z6)

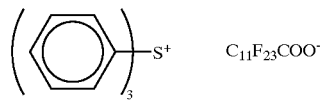(z7)

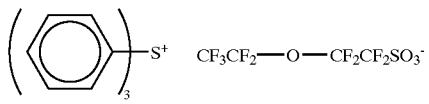(z8)

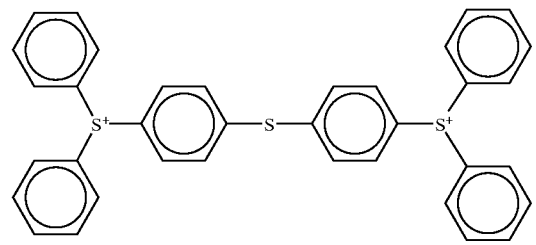

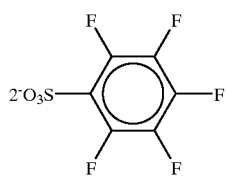(z9)

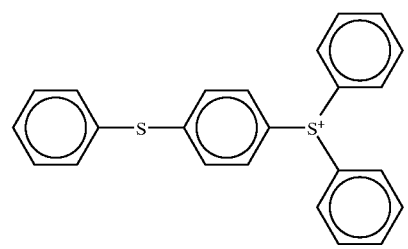(z10)

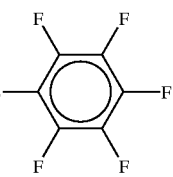

(z11) 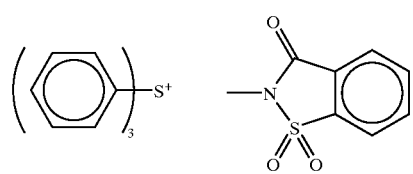
(z12) 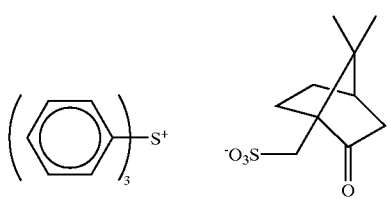
(z13) 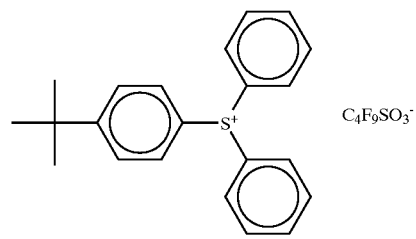
(z14) 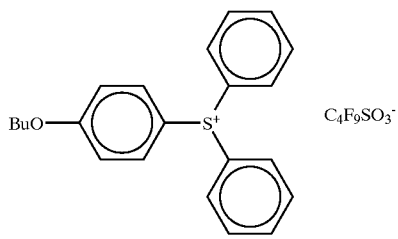
(z15) 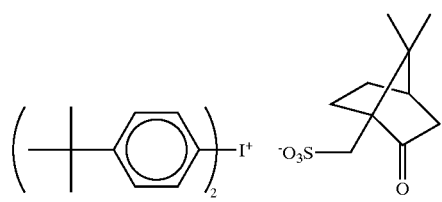
(z16) 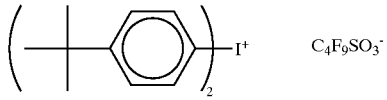
(z17) 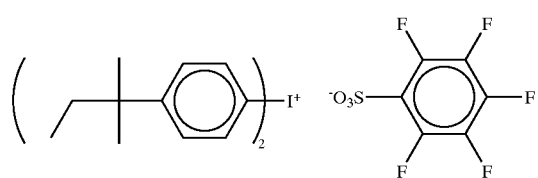
(z18) 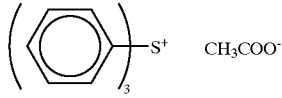
(z19) 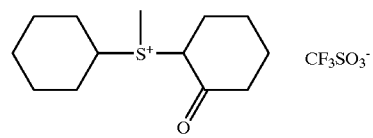
(z20) 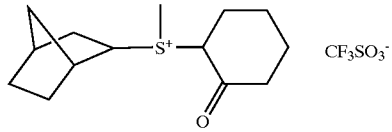
(z21) 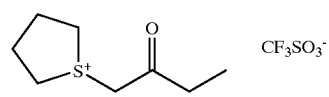
(z22) 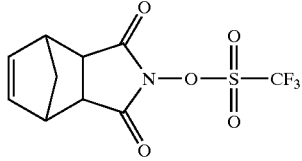
(z23) 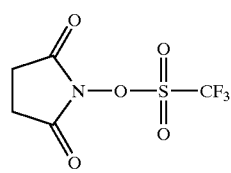
(z24) 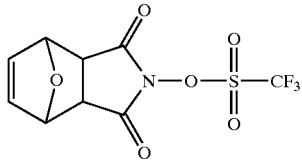
(z25) 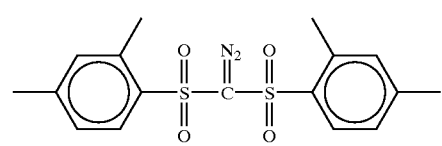
(z26) 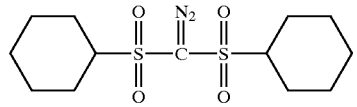
(z27) 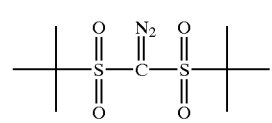
(z28) 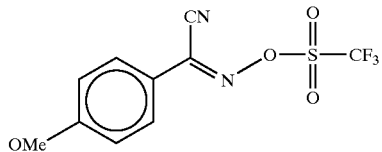

-continued

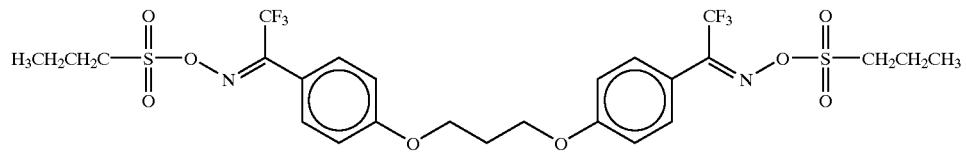
(z29)

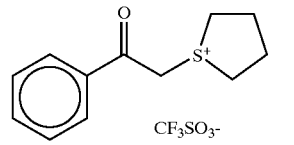
(z30)

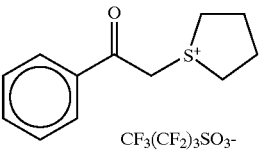
(z31)

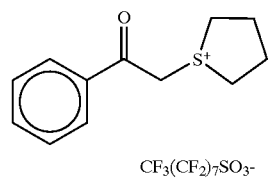
(z32)

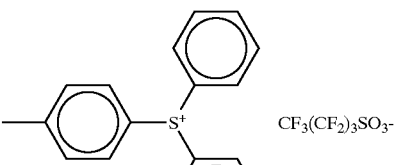
(z33)

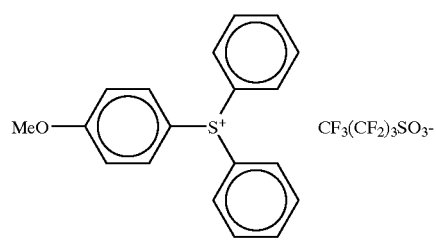
(z34)

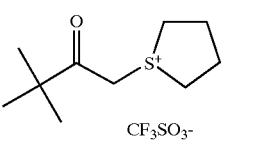
(z35)

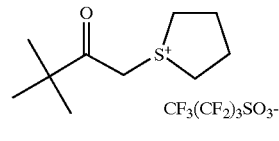
(z36)

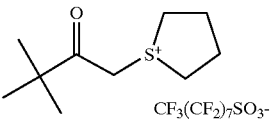
(z37)

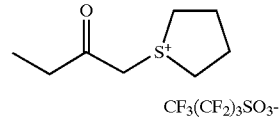
(z38)

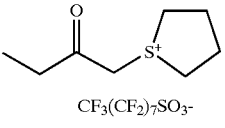
(z39)

<<(B) Resin Capable of Increasing Dissolution Speed in Alkali Developer by Action of Acid (Also Referred to as Acid-Decomposable Resin)>>

The acid-decomposable resin of Component (B) according to the invention may be any resin so far as it has monocyclic or polycyclic alicyclic hydrocarbon structure and increases its dissolution speed in an alkali developer through the action of an acid. However, Resin (B) is preferably a resin having at least one repeating unit selected from repeating units containing as partial structures alicyclic hydrocarbon moieties represented by formula (pI), (pII), (pIII), (pIV), (pV) or (pVI) shown below and repeating units represented by formula (II-AB) shown below.

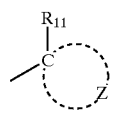
(pI)

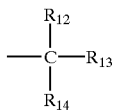
(pII)

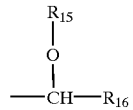
(pIII)

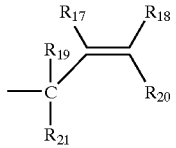
(pIV)

(pV)

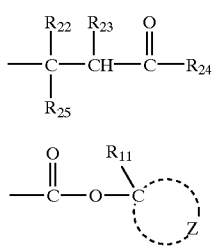

(pVI)

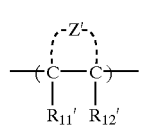

In the above formulae, $R_{11}$ represents a methyl group, an ethyl group, a n-propyl group, an isopropyl group, a n-butyl group, an isobutyl group or a sec-butyl group, and Z represents atoms forming an alicyclic hydrocarbon group together with the carbon atom.

$R_{12}$ to $R_{16}$ independently represent a $C_1$–$C_4$ linear or branched alkyl group or an alicyclic hydrocarbon group, provided that at least one of $R_{12}$, $R_{13}$ and $R_{14}$ or either $R_{15}$ or $R_{16}$ is an aliphatic hydrocarbon group.

$R_{17}$ to $R_{21}$ independently represent a hydrogen atom, a $C_1$–$C_4$ linear or branched alkyl group or an alicyclic hydrocarbon group, provided that at least one of $R_{17}$ to $R_{21}$ is an aliphatic hydrocarbon group and either $R_{19}$ or $R_{21}$ is a $C_1$–$C_4$ linear or branched alkyl group or an alicyclic hydrocarbon group.

$R_{22}$ to $R_{25}$ independently represent a $C_1$–$C_4$ linear or branched alkyl group or an alicyclic hydrocarbon group, provided that at least one of $R_{22}$ to $R_{25}$ is an alicyclic hydrocarbon group, or $R_{23}$ and $R_{24}$ may combine with each other to form a ring.

(II-AB)

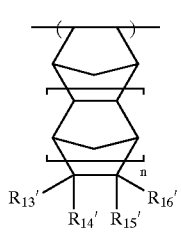

In formula (II-AB), $R_{11}'$ and $R_{12}'$ independently represent a hydrogen atom, a cyano group, a halogen atom, or an unsubstituted or substituted alkyl group.

Z' represents atoms forming an unsubstituted or substituted alicyclic structure together with the bonded two carbon atoms (C—C).

The repeating unit of formula (II-AB) is preferably a repeating unit represented by the following formula (II-A) or (II-B):

(II-A)

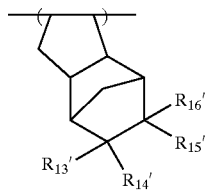

(II-B)

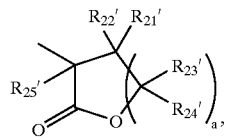

In formulae (II-A) and (II-B), $R_{13}'$ to $R_{16}'$ independently represent a hydrogen atom, a halogen atom, a cyano group, —COOH, —COOR$_5$, a group decomposing through the action of an acid, —C(=O)—X—A'—R$_{17}'$, or an unsubstituted or substituted alkyl or cyclic hydrocarbon group.

Herein, $R_5$ represents an unsubstituted or substituted alkyl or cyclic hydrocarbon group, or —Y illustrated below.

X represents an oxygen atom, a sulfur atom, —NH—, —NHSO$_2$— or —NHSO$_2$NH—.

A' represents a single bond or a divalent linkage group.

At least two of $R_{13}'$ to $R_{16}'$ may combine with each other to form a ring. n represents 0 or 1.

$R_{17}'$ represents —COOH, —COOR$_5$, —CN, a hydroxy group, an unsubstituted or substituted alkoxy group, —CO—NH—R$_6$, —CO—NH—SO$_2$—R$_6$, or —Y illustrated below.

$R_6$ represents an unsubstituted or substituted alkyl or cyclic hydrocarbon group.

The group —Y is as follows:

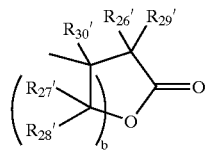

wherein $R_{21}'$ to $R_{30}'$ independently represent a hydrogen atom, or an unsubstituted or substituted alkyl group; and a and b are each 1 or 2.

In formulae (pI) to (pVI), the alkyl group represented by each of $R_{12}$ to $R_{25}$ is a substituted or unsubstituted, $C_1$–$C_4$ linear or branched alkyl group. Examples of such an alkyl group include a methyl group, an ethyl group, a n-propyl group, an isopropyl group, a n-butyl group, an isobutyl group, a sec-butyl group and a tert-butyl group.

Examples of a substituent the alkyl group can have include a $C_1$–$C_4$ alkoxy group, a halogen atom (e.g., fluorine, chlorine, bromine, or iodine), an acyl group, an acyloxy group, a cyano group, a hydroxy group, a carboxy group, an alkoxycarbonyl group and a nitro group.

The alicyclic hydrocarbon group represented by each of $R_{11}$ to $R_{25}$ or formed by combining Z with the carbon atoms may be monocyclic or polycyclic. Specifically, such an alicyclic hydrocarbon group may have any of monocyclic, bicyclic, tricyclic and tetracyclic structures and contain at least 5 carbon atoms. Further, it is preferable that the number of carbon atoms constituting the cyclic structure be from 6 to 30, particularly from 7 to 25. The alicyclic hydrocarbon group may have a substituent.

Examples of an alicyclic moiety structure of the alicyclic hydrocarbon group are illustrated below.

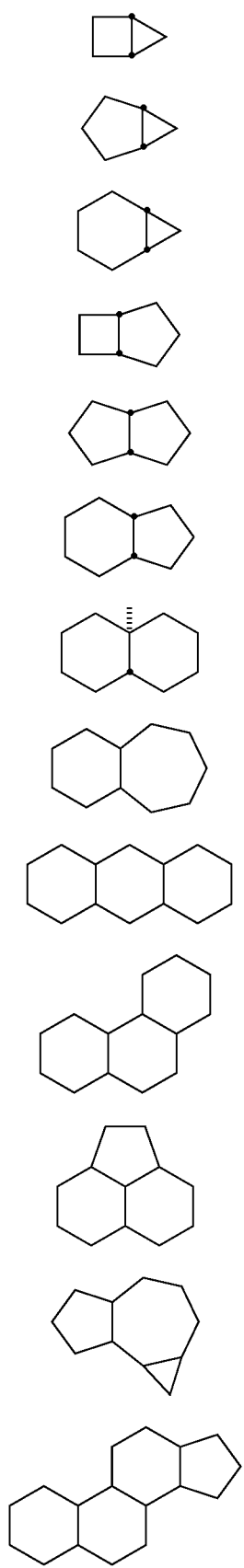
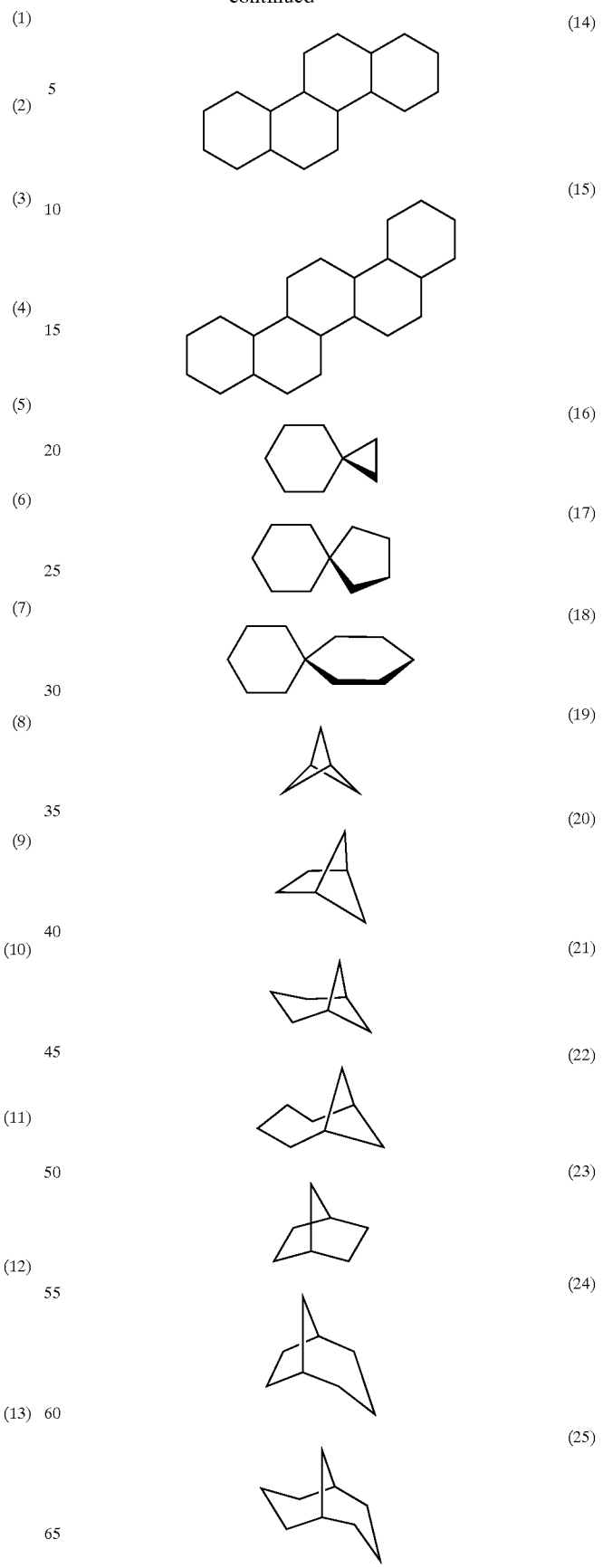

(26) 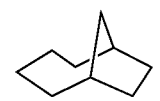
(27) 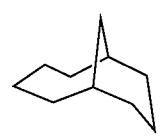
(28) 
(29) 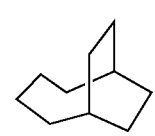
(30) 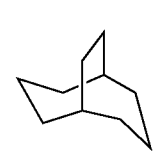
(31) 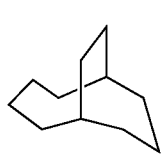
(32) 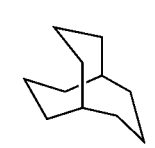
(33) 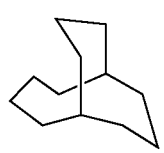
(34) 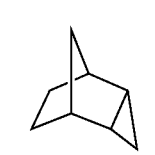
(35) 
(36) 
(37) 
(38) 
(39) 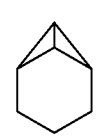
(40) 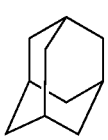
(41) 
(42) 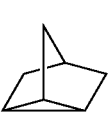
(43) 
(44) 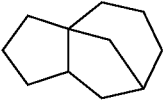
(45) 
(46) 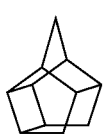
(47) 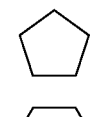
(48) 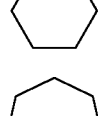
(49) 
(50) 
Examples of the alicyclic moiety suitable for the invention include an adamantyl group, a noradamantyl group, a decaline residue, a tricyclodecanyl group, a tetracyclododecanyl group, a norbornyl group, a sedorol group, a cyclohexyl group, a cycloheptyl group, a cyclooctyl group, a cyclodecanyl group and a cyclododecanyl group. Of these groups, an adamantyl group, a decaline residue, a norbornyl group, a sedorol group, a cyclohexyl group, a cycloheptyl group, a cyclooctyl group, a cyclodecanyl group and a cyclododecanyl group are preferred.

Examples of the substituent for the alicyclic hydrocarbon group include an unsubstituted or substituted alkyl group, a halogen atom, a hydroxy group, an alkoxy group, a carboxy group and an alkoxycarbonyl group. As the unsubstituted alkyl group, a lower alkyl group such as methyl, ethyl, propyl, isopropyl or butyl group is preferred. More preferably, the unsubstituted alkyl group is a group selected from methyl, ethyl, propyl or isopropyl group. Examples of a substituent of the substituted alkyl group include a hydroxyl group, a halogen atom and an alkoxy group. Examples of the alkoxy group include $C_1$–$C_4$ alkoxy groups, such as a methoxy group, an ethoxy group, a propoxy group and a butoxy group.

The structures represented by formulae (pI) to (pVI) in Resin (B) can be used for the protection of alkali-soluble group. Examples of the alkali-soluble group include various groups known in this technical field.

Specifically, the alkali-soluble group includes a carboxylic acid group, a sulfonic acid group, a phenol group and a thiol group, preferably a carboxylic acid group and a sulfonic acid group.

Preferred examples of the alkali-soluble group protected by the structure represented by any one of formulae (pI) to (pVI) in the resin include groups represented by the following formulae (pVII) to (pXI):

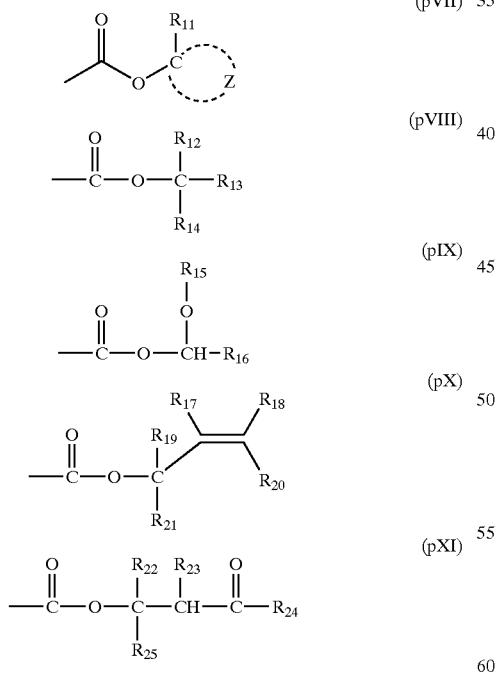

wherein $R_{11}$ to $R_{25}$ and Z have the same meanings as defined hereinbefore.

As the repeating unit having alkali-soluble group protected by the structure represented by any one of formulae (pI) to (pVI), a repeating unit represented by the following formula (pA) is preferred.

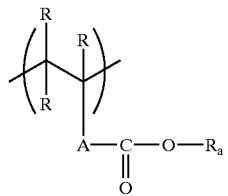

wherein each R represents a hydrogen atom, a halogen atom, or a $C_1$–$C_4$ substituted or unsubstituted, linear or branched alkyl group, and three R groups may be the same or different.

A represents a single bond, a single group selected from an unsubstituted alkylene group, a substituted alkylene group, an ether group, a thioether group, a carbonyl group, an ester group, an amido group, a sulfonamido group, an urethane group and an urea group, or a combination of at least two of these groups.

$R_a$ represents any one of the groups represented by formulae (pI) to (pVI).

Examples of monomer corresponding to the repeating unit represented by formulae (pA) are illustrated below.

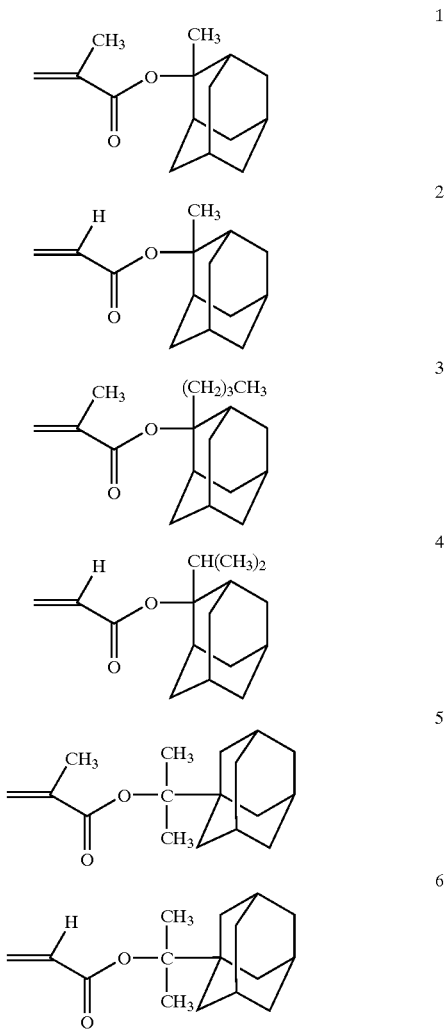

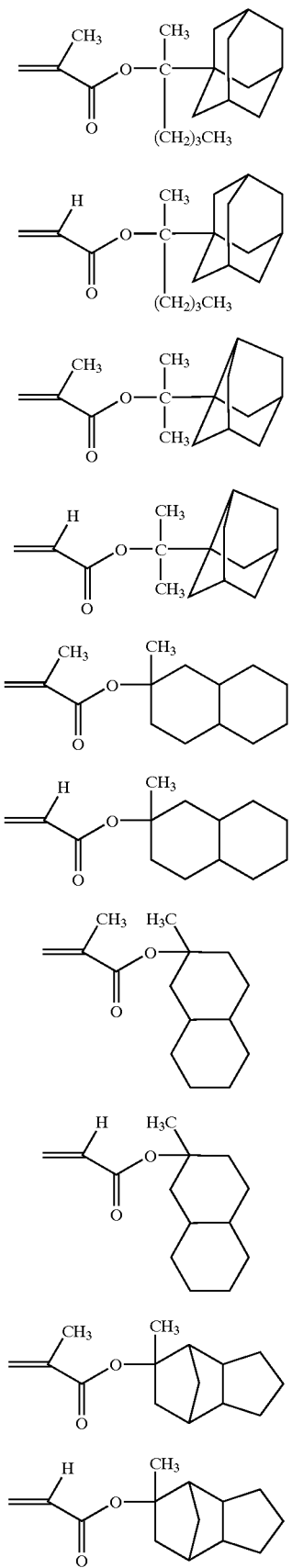
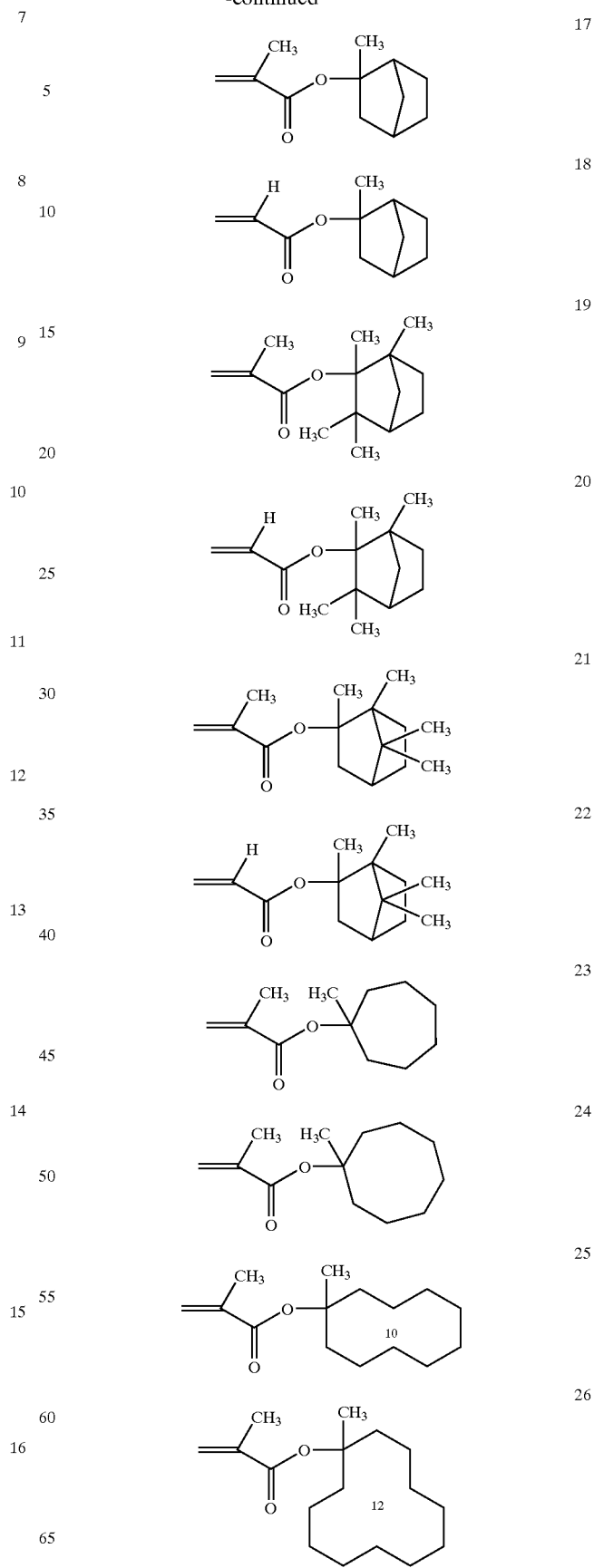

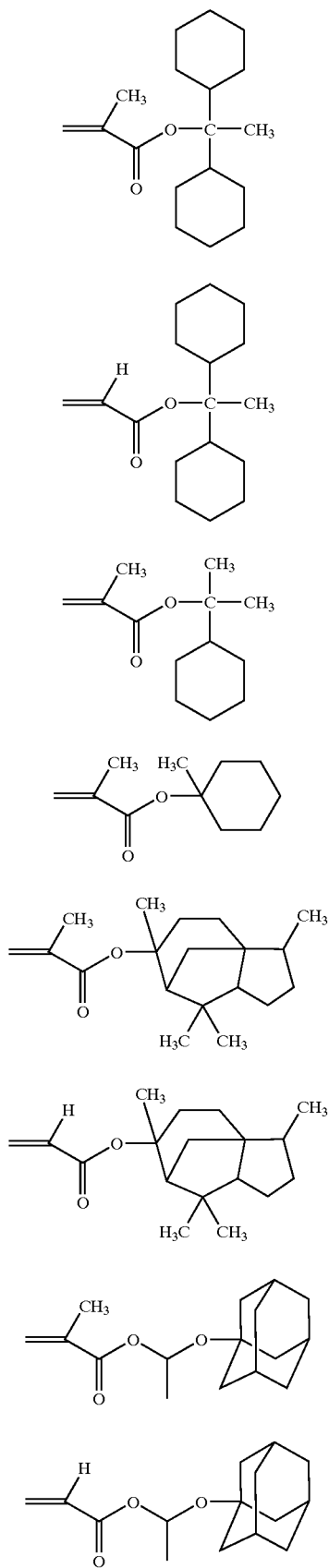

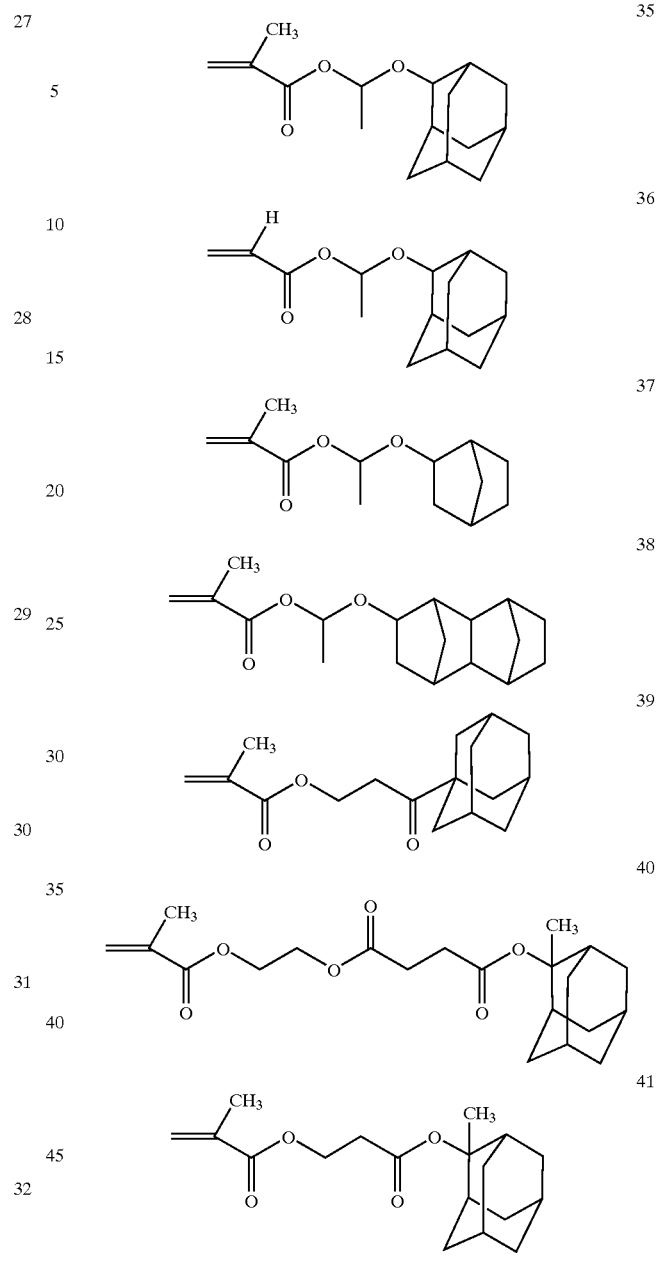

In formula (II-AB), $R_{11}'$ and $R_{12}'$ independently represent a hydrogen atom, a cyano group, a halogen atom, or an unsubstituted or substituted alkyl group.

Z' represents atoms forming an unsubstituted or substituted alicyclic structure in which the bonded two carbon atoms (C—C) are contained.

The halogen atom represented by $R_{11}'$ or $R_{12}'$ includes a chlorine, bromine, fluorine or iodine atom.

The alkyl group represented by any one of $R_{11}'$, $R_{12}'$ and $R_{21}'$ to $R_{30}'$ is preferably a $C_1$–$C_{10}$ linear or branched alkyl group, more preferably a $C_1$–$C_6$ linear or branched alkyl group, and still more preferably a methyl group, an ethyl group, a propyl group, an isopropyl group, a n-butyl group, an isobutyl group, a sec-butyl group or a tert-butyl group.

The alkyl group may further have a substituent, such as a hydroxy group, a halogen atom, a carboxy group, an alkoxy group, an acyl group, a cyano group or an acyloxy group. Examples of the halogen atom include chlorine, bromine, fluorine and iodine atoms. Examples of the alkoxy group include $C_1$–$C_4$ alkoxy groups, such as methoxy, ethoxy, propoxy and butoxy groups. Examples of the acyl group include a formyl group and an acetyl group. Examples of the acyloxy group include an acetoxy group.

The atoms for forming an alicyclic structure represented by Z' are atoms for constituting a repeating unit having unsubstituted or substituted alicyclic hydrocarbon group in Resin (B). In particular, the atoms forming a bridged alicyclic structure to constitute a bridged alicyclic hydrocarbon repeating unit is preferred.

The structures illustrated below are examples of skeleton of the alicyclic hydrocarbon formed.

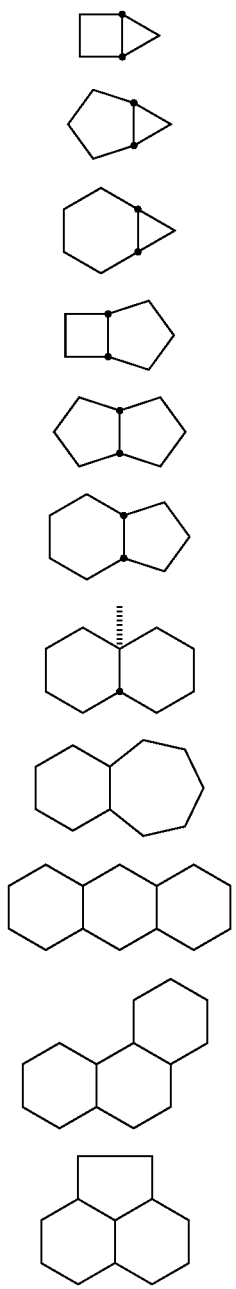

-continued

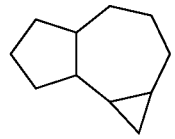
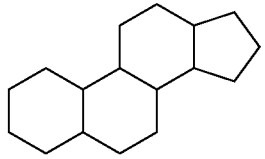
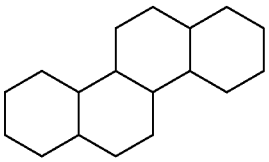
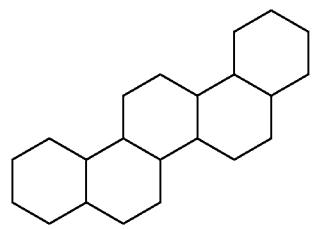
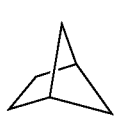
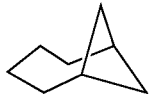

-continued
(24) 
(25) 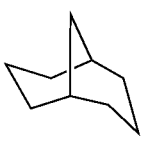
(26) 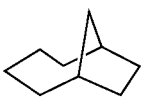
(27) 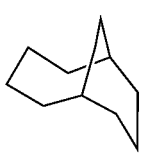
(28) 
(29) 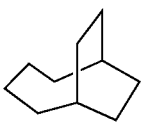
(30) 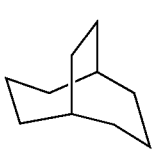
(31) 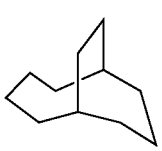
(32) 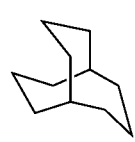
(33) 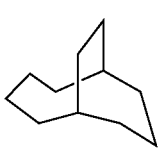
(34) 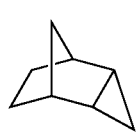
-continued
(35) 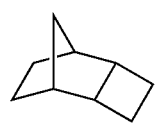
(36) 
(37) 
(38) 
(39) 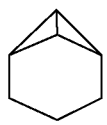
(40) 
(41) 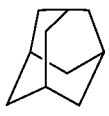
(42) 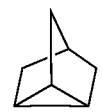
(43) 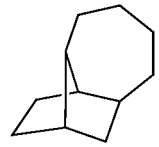
(44) 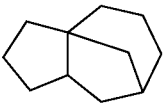
(45) 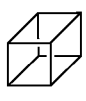
(46) 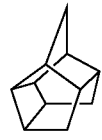

(47)

Of the structures illustrated above, the bridged alicyclic hydrocarbon skeletons (5), (6), (7), (9), (10), (13), (14), (15), (23), (28), (36), (37), (42) and (47) are preferred.

The alicyclic hydrocarbon skeleton may have a substituent. Examples of the substituent include $R_{13}'$ to $R_{16}'$ in formula (II-A) or (II-B).

Of the repeating units having the bridged alicyclic hydrocarbon moiety, the repeating units represented by formulae (II-A) and (II-B) are more preferred.

In formulae (II-A) and (II-B), $R_{13}'$ to $R_{16}'$ independently represent a hydrogen atom, a halogen atom, a cyano group, —COOH, —COOR$_5$, an acid-decomposable group, —C(=O)—X—A'—R$_{17}$', or an unsubstituted or substituted alkyl or cyclic hydrocarbon group.

$R_5$ represents an unsubstituted or substituted alkyl or cyclic hydrocarbon group, or a group —Y as illustrated above.

X represents —O—, —S—, —NH—, —NHSO$_2$— or —NHSO$_2$NH—.

A' represents a single bond or a divalent linkage group.

At least two of $R_{13}'$ to $R_{16}'$ may combine with each other to form a ring. n represents 0 or 1.

$R_{17}'$ represents —COOH, —COOR$_5$, —CN, a hydroxy group, an unsubstituted or substituted alkoxy group, —CO—NH—R$_6$, —CO—NH—SO$_2$—R$_6$, or a group —Y as illustrated above.

$R_6$ represents an unsubstituted or substituted alkyl or cyclic hydrocarbon group.

In the group —Y, $R_{21}'$ to $R_{30}'$ independently represent a hydrogen atom, or an unsubstituted or substituted alkyl group, and a and b are each 1 or 2.

In the resin according to the invention, the acid-decomposable group may be contained in the group —C(=O)—X—A'—R$_{17}'$ defined above, or as substituent of Z' in formula (II-AB).

The structure of acid-decomposable group is represented by formula —C(=O)—X$_1$—R$_0$.

Examples of $R_0$ in the above formula include a tertiary alkyl group such as tert-butyl or tert-amyl group, an isobornyl group, a 1-alkoxyethyl group such as 1-ethoxyethyl, 1-butoxyethyl, 1-isobutoxyethyl or 1-cyclohexyloxyethyl group, an alkoxymethyl group such as 1-methoxymethyl or 1-ethoxymethyl group, a 3-oxoalkyl group, a tetrahydropyranyl group, a tetrahydrofuryl group, a trialkylsilyl ester group, a 3-oxocyclohexyl ester group, a 2-methyl-2-adamantyl group, and a mevalonic lactone residue. $X_1$ has the same meaning as the foregoing X.

Examples of the halogen atom represented by $R_{13}'$ to $R_{16}'$ each, include chlorine, bromine, fluorine and iodine atoms.

It is preferred that the alkyl group represented by each of $R_5$, $R_6$ and $R_{13}'$ to $R_{16}'$ is a $C_1$–$C_{10}$ linear or branched alkyl group, more preferably a $C_1$–$C_6$ linear or branched alkyl group, and still more preferably a methyl group, an ethyl group, a propyl group, an isopropyl group, a n-butyl group, an isobutyl group, a sec-butyl group or a tert-butyl group.

The cyclic hydrocarbon group represented by each of $R_5$, $R_6$ and $R_{13}'$ to $R_{16}'$ includes, e.g., a cycloalkyl group or a bridged hydrocarbon group, with examples including a cyclopropyl group, a cyclopentyl group, a cyclohexyl group, an adamantyl group, a 2-methyl-2-adamantyl group, a norbornyl group, a bornyl group, an isobornyl group, a tricyclodecanyl group, a dicyclopentenyl group, a norbornane epoxy group, a menthyl group, an isomenthyl group, a neomenthyl group and a tetracyclododecanyl group.

The ring formed by combining at least two of $R_{13}'$ to $R_{16}'$ includes $C_5$–$C_{12}$ rings such as cyclopentene, cyclohexene, cycloheptane and cyclooctane.

The alkoxy group represented by $R_{17}'$ includes $C_1$–$C_4$ alkoxy groups such as a methoxy group, an ethoxy group, a propoxy group and a butoxy group.

Examples of the substituent, which may be present in each of the alkyl, cyclic hydrocarbon and alkoxy groups, include a hydroxy group, a halogen atom, a carboxy group, an alkoxy group, an acyl group, a cyano group, an acyloxy group, an alkyl group and a cyclic hydrocarbon group. Examples of the halogen atom include chlorine, bromine, fluorine and iodine atoms. Examples of the alkoxy group include $C_1$–$C_4$ alkoxy groups, such as methoxy, ethoxy, propoxy and butoxy groups. Examples of the acyl group include a formyl group and an acetyl group. Examples of the acyloxy group include an acetoxy group.

The alkyl group and cyclic hydrocarbon group include those described above.

The divalent linkage group represented by A' includes a single group and a combination of at least two groups selected from an unsubstituted alkylene group, a substituted alkylene group, an ether group, a thioether group, a carbonyl group, an ester group, an amido group, a sulfonamido group, an urethane group and an urea group.

Examples of the unsubstituted or substituted alkylene group represented by A' include groups represented by the following formula:

wherein Ra and Rb, which may be the same or different, each represent a hydrogen atom, an unsubstituted or substituted alkyl group, a halogen atom, a hydroxy group, or an alkoxy group. The alkyl group is preferably a lower alkyl group such as methyl, ethyl, propyl, isopropyl orbutyl group, and preferably a methyl group, an ethyl group, a propyl group or an isopropyl group. Examples of the substituent of the substituted alkyl group include a hydroxy group, a halogen atom and an alkoxy group. The alkoxy group includes a $C_1$–$C_4$ alkoxy group such as a methoxy group, an ethoxy group, a propoxy group or a butoxy group. The halogen atom includes a chlorine atom, a bromine atom, a fluorine atom and an iodine atom. r is an integer of 1 to 10.

The resins according to the invention can contain the group decomposing through the action of an acid in at least one repeating unit selected from the repeating units containing as their partial structures alicyclic hydrocarbon moieties represented by any one of formulae (pI) to (pVI), the repeating units represented by formula (II-AB) and repeating units derived from copolymerization components as described hereinafter.

The various substituents of $R_{13}'$ to $R_{16}'$ in each of formulae (II-A) and (II-B) constitute substituents of the atomic group Z which forms an alicyclic structure or a bridged alicyclic structure in formula (II-AB).

Repeating units [II-1] to [II-175] shown below are specific examples of repeating units represented by formulae (II-A) and (II-B), but these examples should not be construed as limiting the scope of the invention in any way.

[II-1] 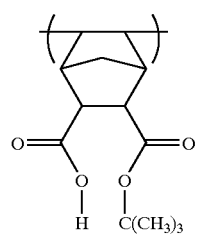
[II-2] 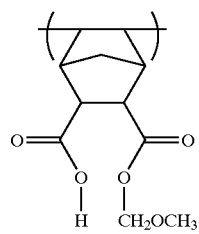
[II-3] 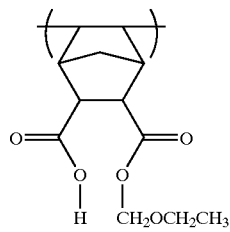
[II-4] 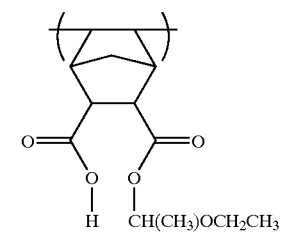
[II-5] 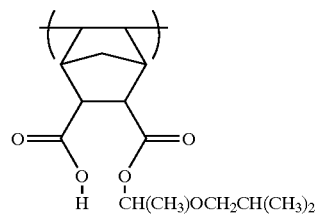
[II-6] 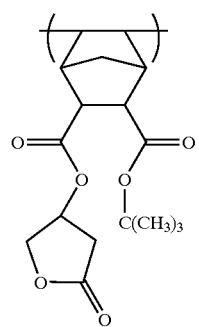
-continued
[II-7] 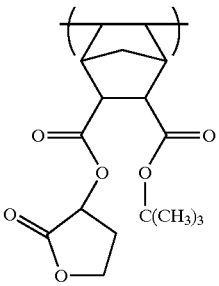
[II-8] 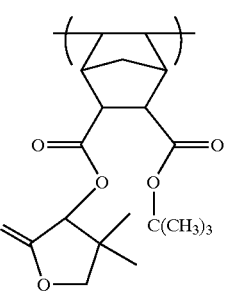
[II-9] 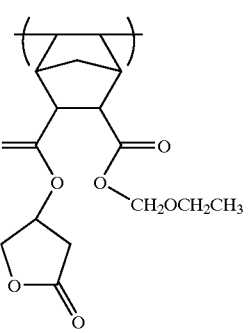
[II-10] 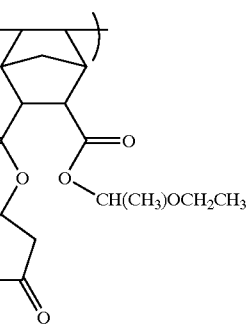
[II-11] 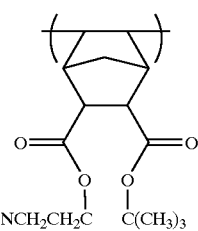

[II-12] 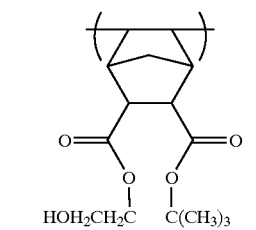
[II-13] 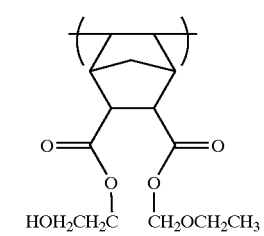
[II-14] 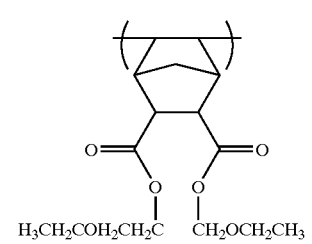
[II-15] 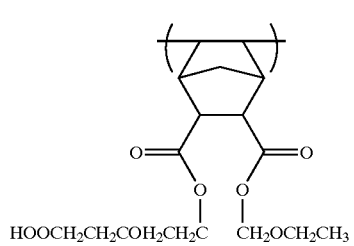
[II-16] 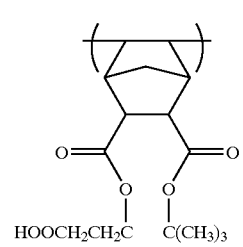
[II-17] 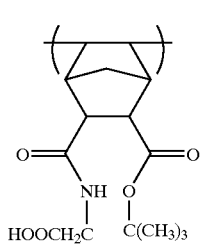
[II-18] 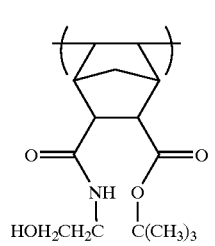
[II-19] 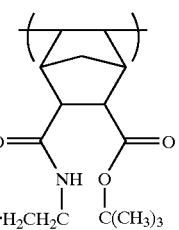
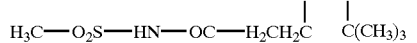
[II-20] 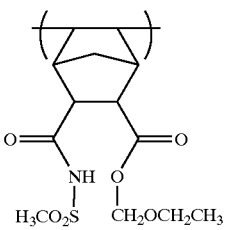
[II-21] 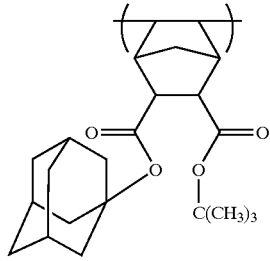
[II-22] 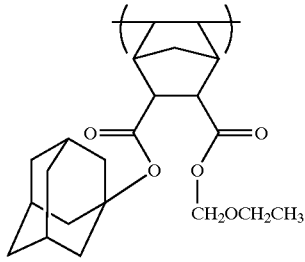
[II-23] 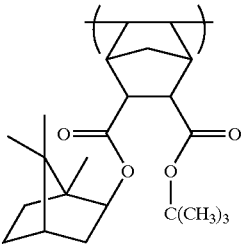
[II-24] 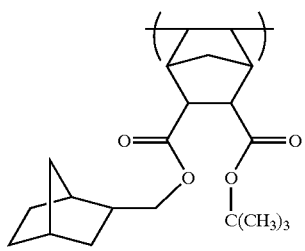

[II-25] 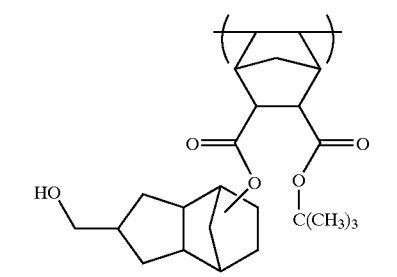
[II-26] 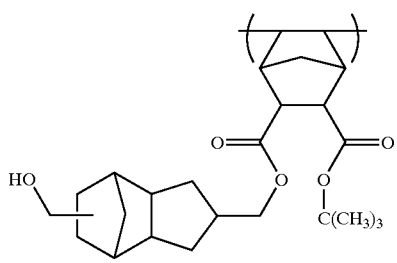
[II-27] 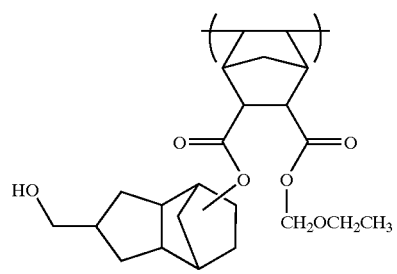
[II-28] 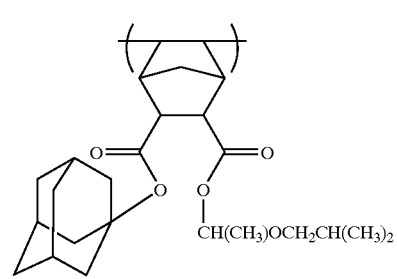
[II-29] 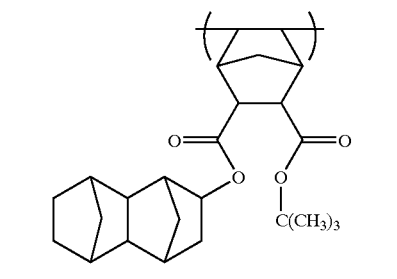
[II-30] 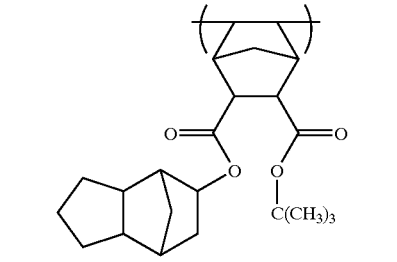
[II-81] 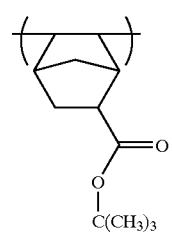
[II-82] 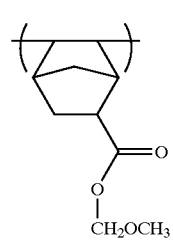
[II-83] 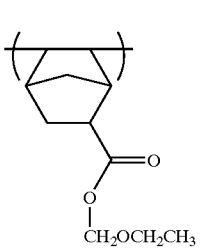
[II-84] 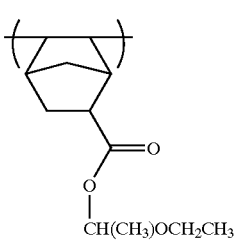
[II-85] 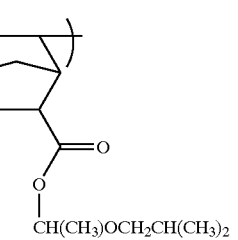
[II-86] 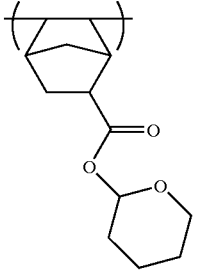

[II-87]
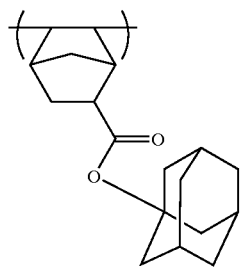
[II-88]
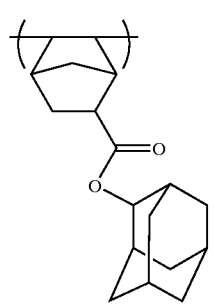
[II-89]
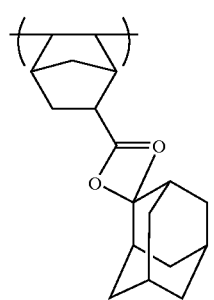
[II-90]
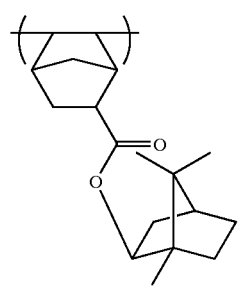
[II-91]
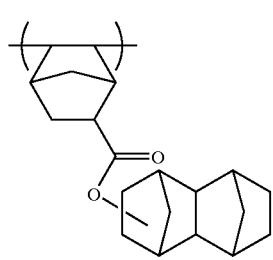
[II-92]
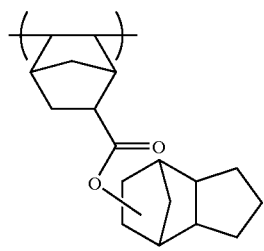
[II-93]
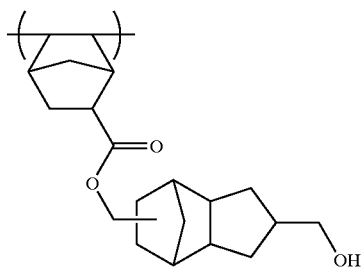
[II-94]
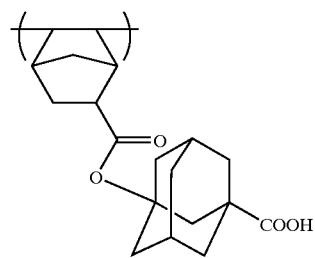
[II-95]
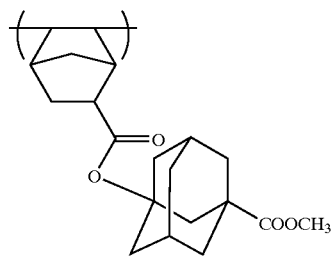
[II-96]
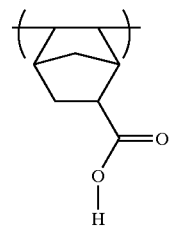
[II-97]
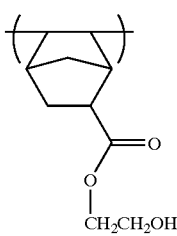

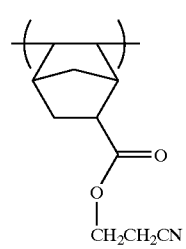 [II-98]
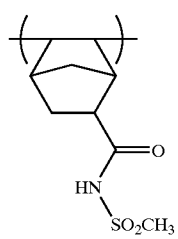 [II-99]
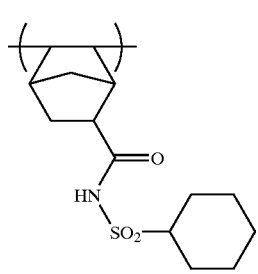 [II-100]
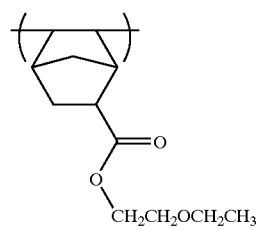 [II-101]
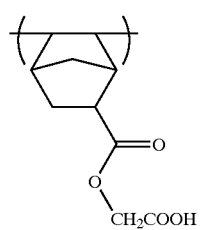 [II-102]
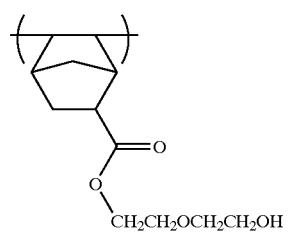 [II-103]
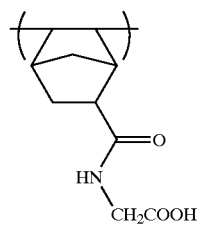 [II-104]
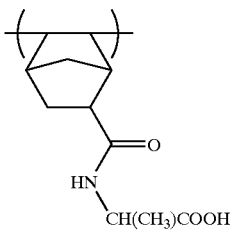 [II-105]
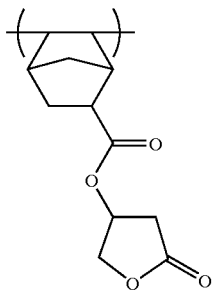 [II-106]
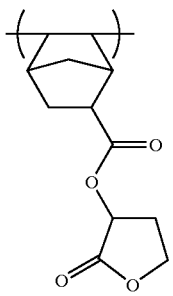 [II-107]
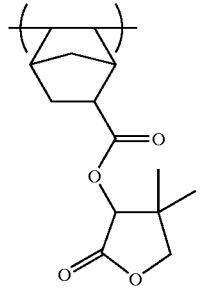 [II-108]
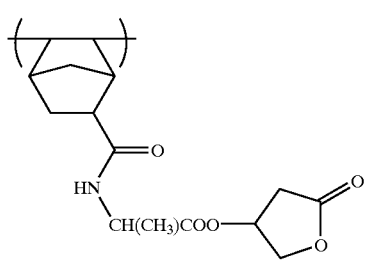 [II-109]

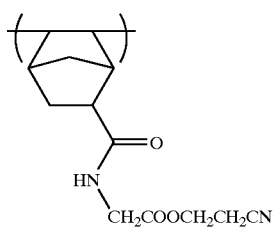
[II-110]
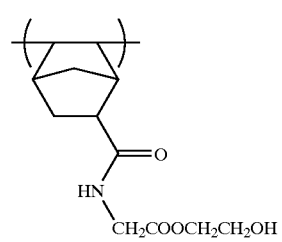
[II-111]
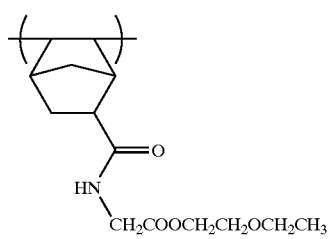
[II-112]
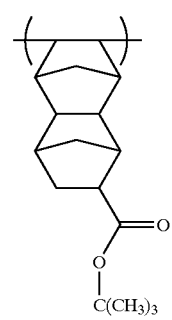
[II-113]
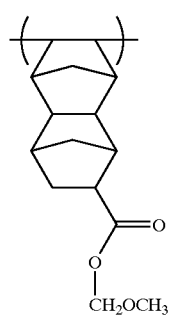
[II-114]
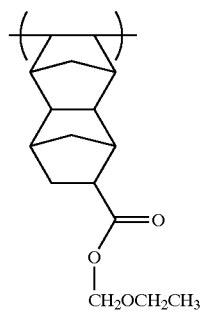
[II-115]
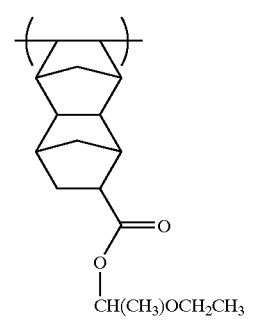
[II-116]
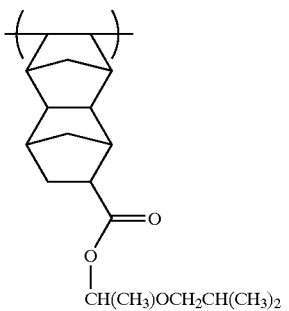
[II-117]
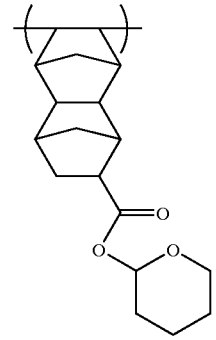
[II-118]
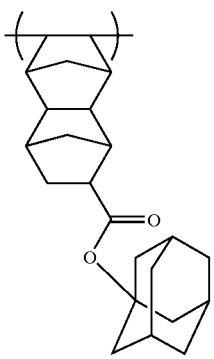
[II-119]

[II-120]
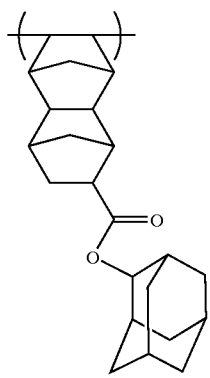
[II-121]
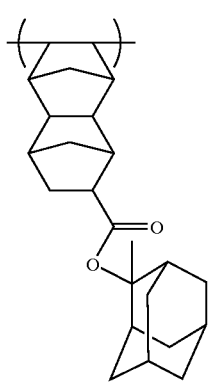
[II-122]
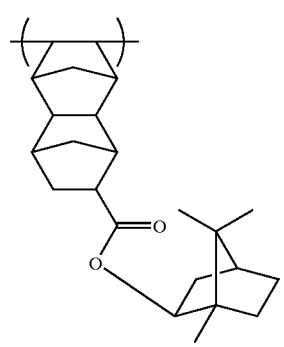
[II-123]
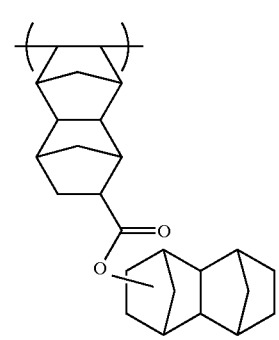
[II-124]
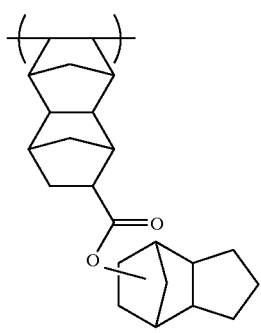
[II-125]
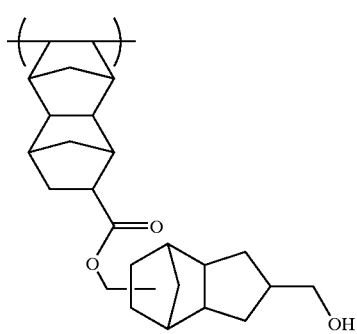
[II-126]
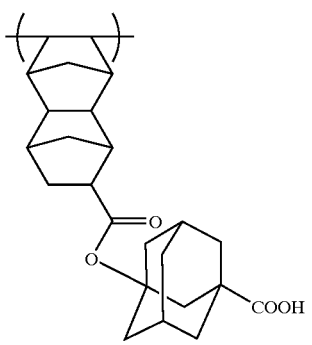
[II-127]
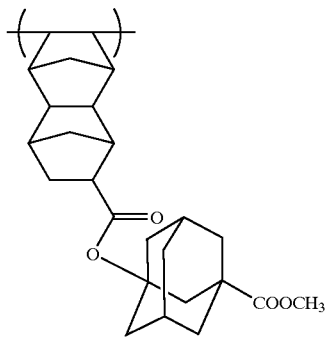

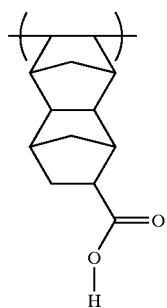 [II-128]
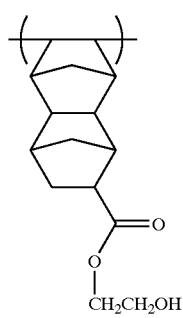 [II-129]
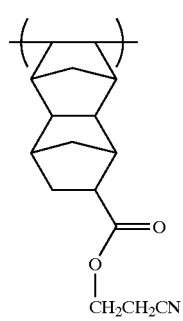 [II-130]
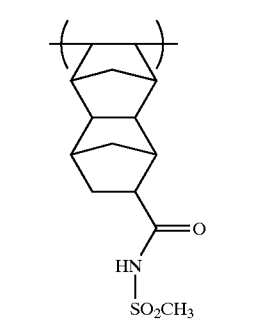 [II-131]
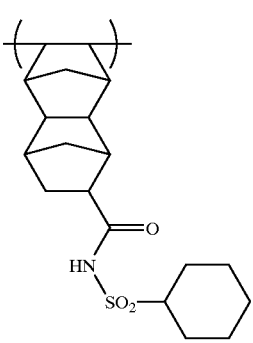 [II-132]
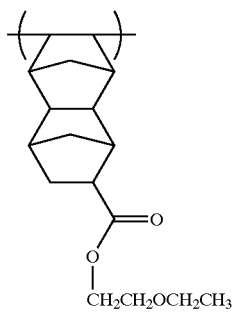 [II-133]
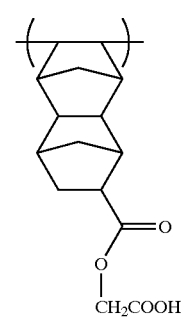 [II-134]
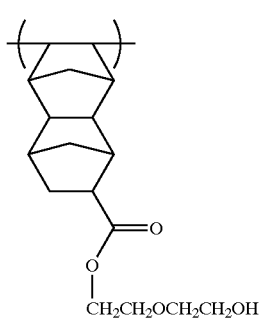 [II-135]
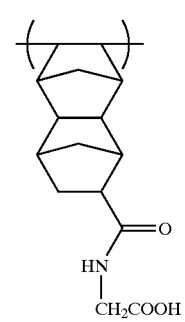 [II-136]
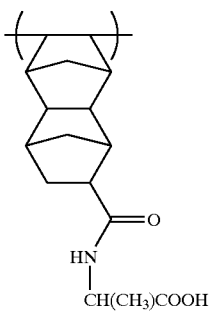 [II-137]

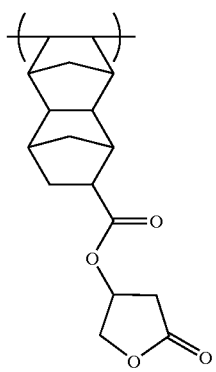
[II-138]
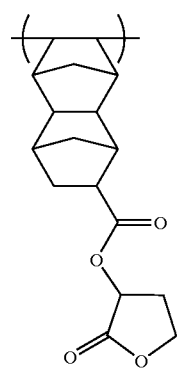
[II-139]
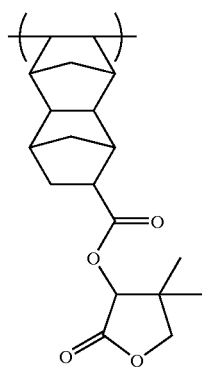
[II-140]
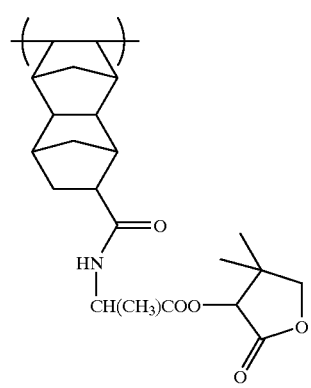
[II-141]
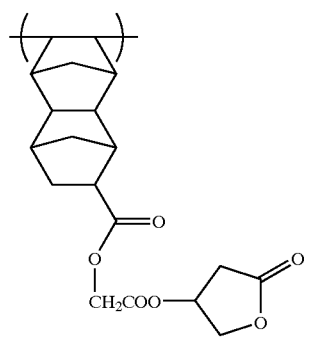
[II-142]
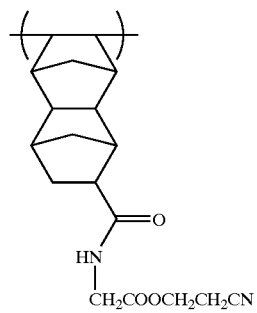
[II-143]
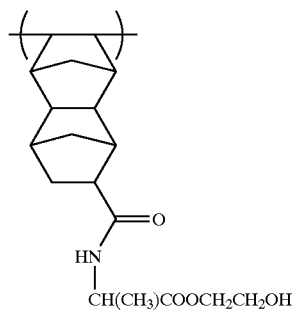
[II-144]
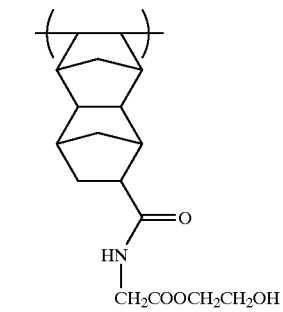
[II-145]
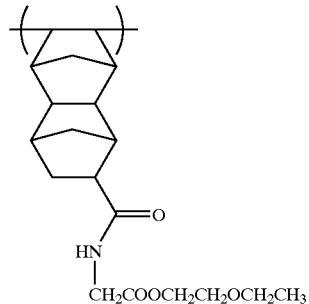
[II-146]

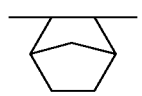 [II-147]
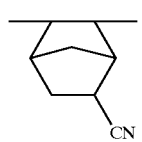 [II-148]
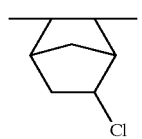 [II-149]
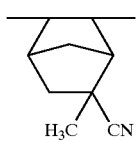 [II-149']
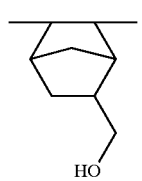 [II-150]
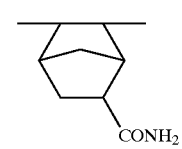 [II-151]
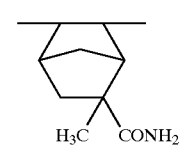 [II-152]
 [II-153]
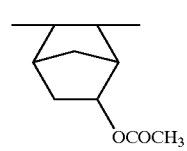 [II-154]
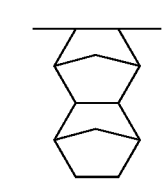 [II-155]
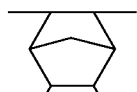 [II-156]
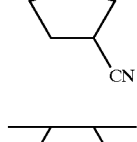 [II-157]
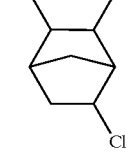 [II-158]
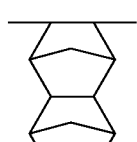 [II-159]
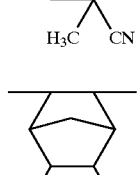 [II-160]
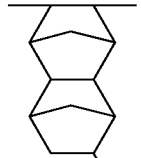 [II-161]
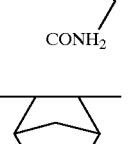 [II-162]
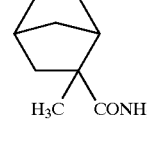

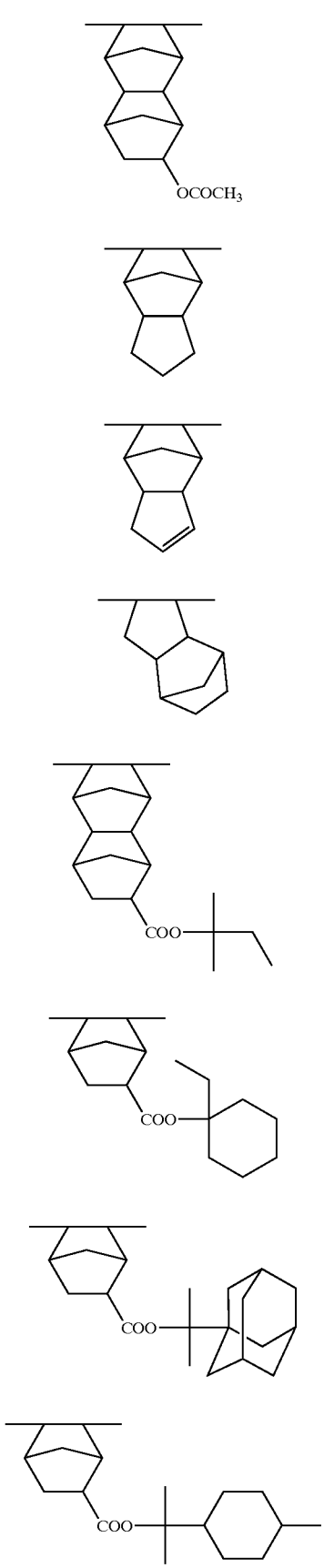
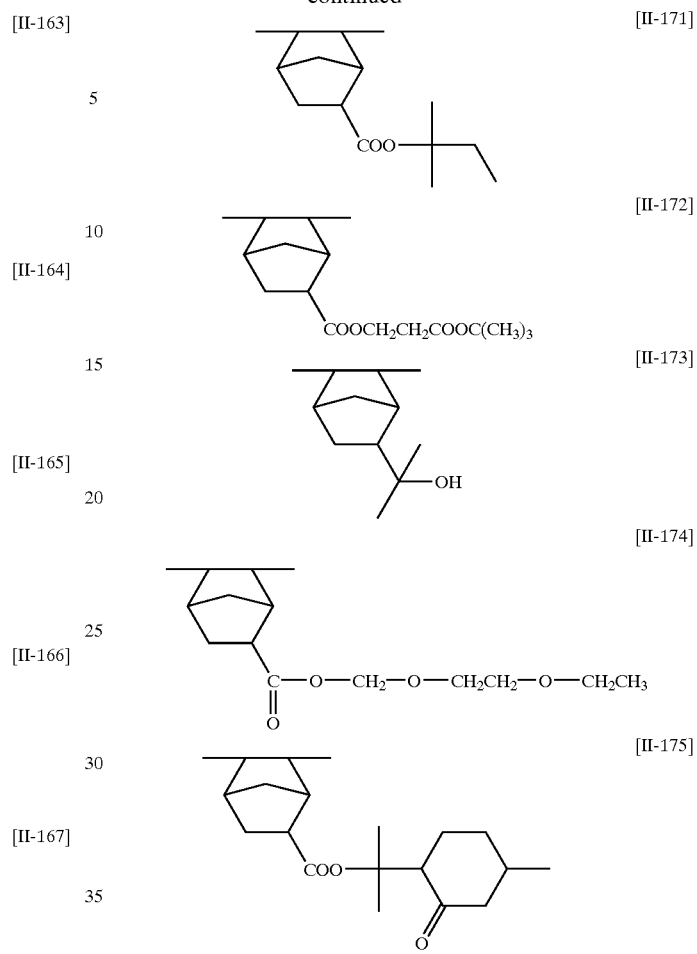

The acid-decomposable resin of the invention may further have a lactone structure-containing repeating unit represented by the following formula (IV):

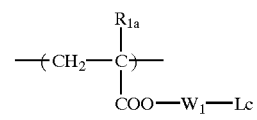 (IV)

Lc:

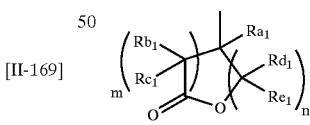

In formula (IV), $R_{1a}$ represents a hydrogen atom or a methyl group.

$W_1$ represents a single bond, an alkylene group, an ether group, a thioether group, a carbonyl group, an ester group, or a group formed by combining at least two of these groups.

$R_{a1}$, $R_{b1}$, $R_{c1}$, $R_{d1}$ and $R_{e1}$ independently represent a hydrogen atom or a $C_1$–$C_4$ alkyl group. m and n independently represent an integer of 0 to 3, provided that m+n is from 2 to 6.

Examples of the $C_1$–$C_4$ alkyl group represented by $R_{a1}$ to $R_{e1}$ each include a methyl group, an ethyl group, a propyl group, an isopropyl group, a n-butyl group, an isobutyl group, a sec-butyl group and a tert-butyl group.

Examples of the alkylene group represented by $W_1$ in formula (IV) include groups represented by the following formula:

—[C(Rf)(Rg)]$_{r_1}$— wherein Rf and Rg, which may be the same or different, each represent a hydrogen atom, an unsubstituted or substituted alkyl group, a halogen atom, a hydroxy group or an alkoxy group. The alkyl group is preferably a lower alkyl group such as methyl, ethyl, propyl, isopropyl or butyl group, and more preferably selected from a methyl group, an ethyl group, a propyl group or an isopropyl group. Examples of the substituent of the alkyl group include a hydroxy group, a halogen atom and an alkoxy group. Examples of the alkoxy group include $C_1$–$C_4$ alkoxy groups such as methoxy, ethoxy, propoxy and butoxy groups. Examples of the halogen atom include chlorine, bromine, fluorine and iodine atoms. $r_1$ is an integer of 1 to 10.

Examples of further substituents of the alkyl group include a carboxyl group, an acyloxy group, a cyano group, an unsubstituted or substituted alkyl group, a halogen atom, a hydroxy group, an unsubstituted or substituted alkoxy group, an acetylamido group, analkoxycarbonyl group and an acyl group.

The alkyl group includes a lower alkyl group such as methyl, ethyl, propyl, isopropyl, butyl, cyclopropyl, cyclobutyl or cyclopentyl group. The substituent of the substituted alkyl group includes a hydroxy group, a halogen atom, or an alkoxy group. The substituent of the substituted alkoxy group includes an alkoxy group. The alkoxy group includes a lower alkoxy group such as methoxy, ethoxy, propoxy or butoxy group. The acyloxy group includes an acetoxy group. The halogen atom includes a chlorine atom, a bromine atom, a fluorine atom and an iodine atom.

Specific examples of repeating unit represented by formula (IV) are illustrated below, but these examples should not be construed as limiting the scope of the invention.

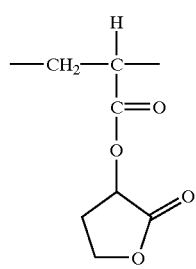

(IV-1)

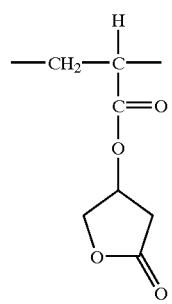

(IV-2)

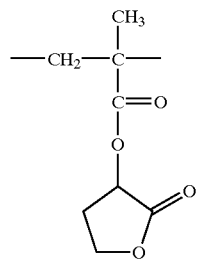

(IV-3)

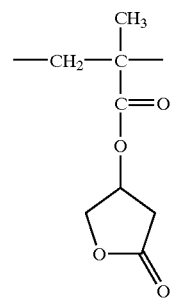

(IV-4)

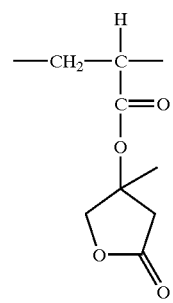

(IV-5)

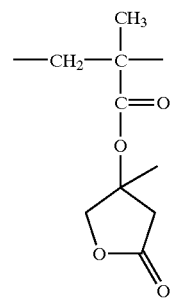

(IV-6)

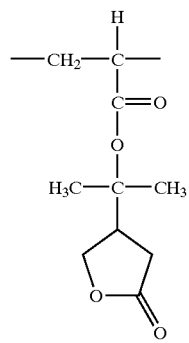

(IV-7)

-continued
(IV-8)
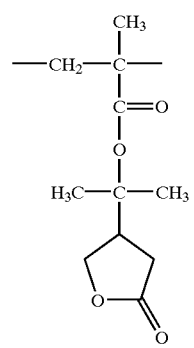
(IV-9)
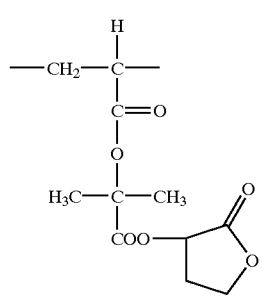
(IV-10)
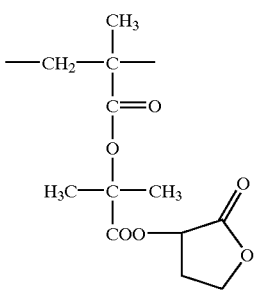
(IV-11)
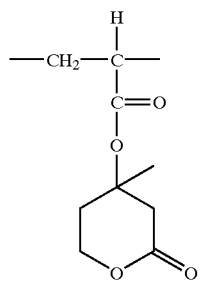
(IV-12)
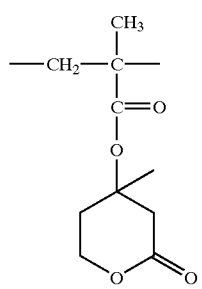
-continued
(IV-13)
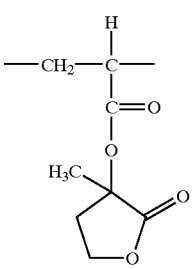
(IV-14)
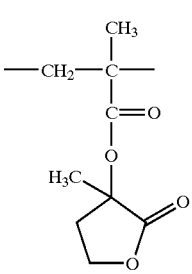
(IV-15)
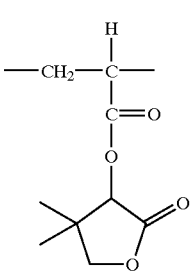
(IV-16)
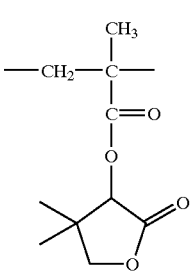
(IV-17)
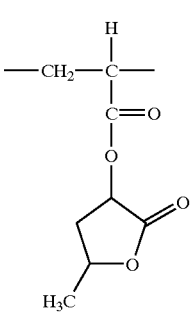

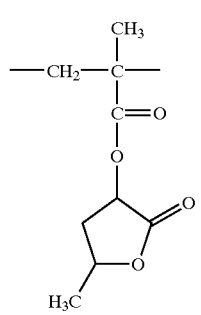 (IV-18)
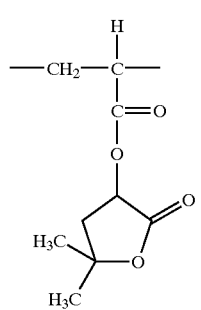 (IV-19)
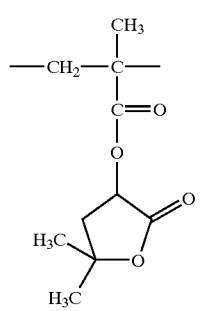 (IV-20)
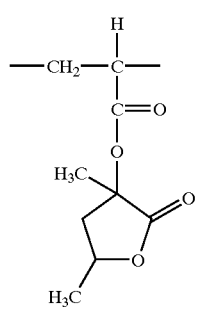 (IV-21)
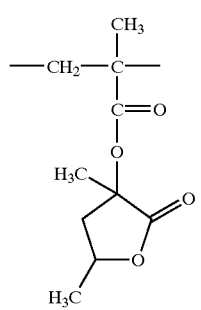 (IV-22)
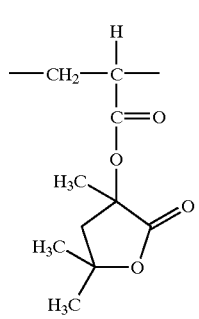 (IV-23)
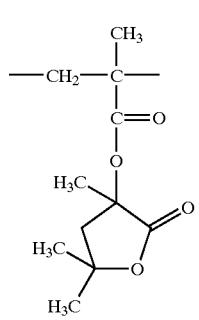 (IV-24)
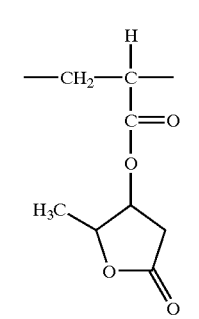 (IV-25)
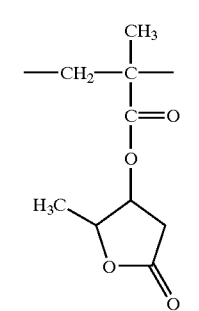 (IV-26)
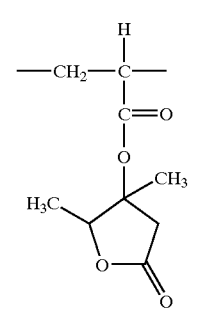 (IV-27)

(IV-28) 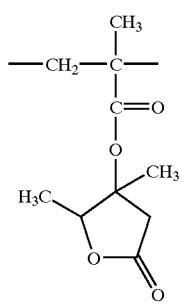

(IV-29) 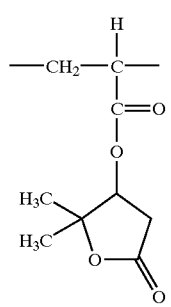

(IV-30) 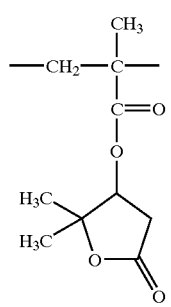

(IV-31) 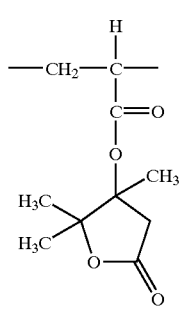

(IV-32) 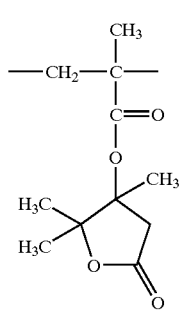

(IV-33) 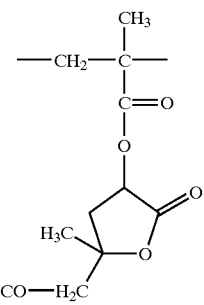

(IV-34) 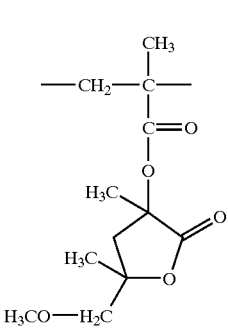

(IV-35) 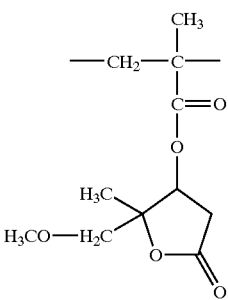

(IV-36) 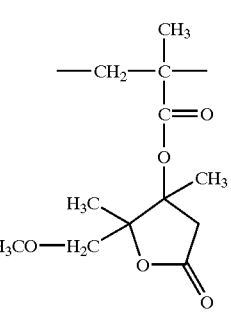

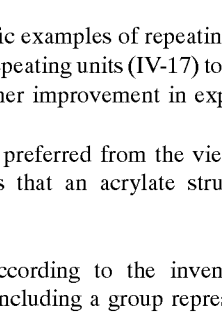

Of the specific examples of repeating unit represented by formula (IV), repeating units (IV-17) to (IV-36) are preferred in view of further improvement in exposure margin.

Further, it is preferred from the viewpoint of improving edge roughness that an acrylate structure is included in formula (IV).

The resin according to the invention may contain a repeating unit including a group represented by any one of the following formulae (V-1) to (V-4):

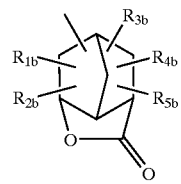
(V-1)

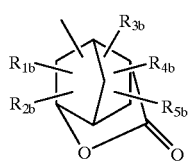
(V-2)

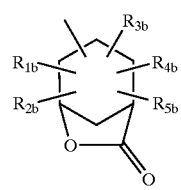
(V-3)

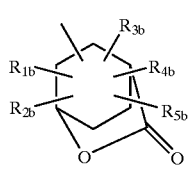
(V-4)

In formulae (V-1) to (V-4), $R_{1b}$ to $R_{5b}$ independently represent a hydrogen atom or an unsubstituted or substituted alkyl, cycloalkyl or alkenyl group, or two of $R_{1b}$ to $R_{5b}$ may combine with each other to form a ring.

The alkyl group represented by each of $R_{1b}$ to $R_{5b}$ in formulae (V-1) to (V-4) is a linear or branched alkyl group, and may have a substituent.

The linear and branched alkyl group includes preferably $C_1$–$C_{12}$ linear and branched alkyl groups, more preferably $C_1$–$C_{10}$ linear and branched alkyl groups, and still more preferably a methyl group, an ethyl group, a propyl group, an isopropyl group, a n-butyl group, an isobutyl group, a sec-butyl group, a tert-butyl group, a pentyl group, a hexyl group, a heptyl group, an octyl group, a nonyl group and a decyl group.

The cycloalkyl group represented by $R_{1b}$ to $R_{5b}$ each includes preferably $C_3$–$C_8$ cycloalkyl groups, such as a cyclopropyl group, a cyclopentyl group, a cyclohexyl group, a cycloheptyl group and a cyclooctyl group.

The alkenyl group represented by $R_{1b}$ to $R_{5b}$ each include $C_2$–$C_6$ alkenyl groups, such as a vinyl group, a propenyl group, a butenyl group and a hexenyl group.

The ring formed by combining any two of $R_{1b}$ to $R_{5b}$ includes 3- to 8-membered rings, such as a cyclopropane ring, a cyclobutane ring, a cyclopentane ring, a cyclohexane ring and a cyclooctane ring.

$R_{1b}$ to $R_{5b}$ in formulae (V-1) to (V-4) may be attached to any of carbons constituting a cyclic skeleton.

Preferred examples of substituent, which the alkyl, cycloalkyl or alkenyl group may have, include $C_1$–$C_4$ alkoxy groups, halogen atoms (fluorine, chlorine, bromine and iodine atoms), $C_2$–$C_5$ acyl groups, $C_2$–$C_5$ acyloxy groups, a cyano group, a hydroxy group, a carboxy group, $C_2$–$C_5$ alkoxycarbonyl groups and a nitro group.

Examples of the repeating unit having a group represented by any one of formulae (V-1) to (V-4) include the repeating unit represented by formula (II-A) or (II-B) wherein at least one of $R_{13}'$ to $R_{16}'$ is a group represented by formula (V-1), (V-2), (V-3) or (V-4) (for example, the $R_5$ of —COOR$_5$ is a group represented by each of formulae (V-1) to (V-4)), and a repeating unit represented by the following formula (AI):

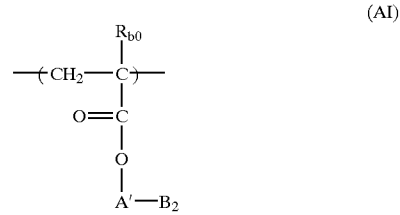
(AI)

In formula (AI), $R_{b0}$ represents a hydrogen atom, a halogen atom, or a $C_1$–$C_4$ substituted or unsubstituted alkyl group. Preferred examples of the substituent of the alkyl group represented by $R_{b0}$ include the groups recited above as the preferred substituents for the alkyl group represented by $R_{1b}$ in each of formulae (V-1) to (V-4).

Examples of the halogen atom represented by $R_{b0}$ include a fluorine atom, a chlorine atom, a bromine atom and an iodine atom. Preferably, $R_{b0}$ is a hydrogen atom.

A' represents a single bond, an ether group, an ester group, a carbonyl group, an alkylene group or a divalent group formed by combining at least two of these groups.

$B_2$ represents a group represented by any one of formulae (V-1) to (V-4).

Examples of the combined divalent group represented by A' include those of the following formulae:

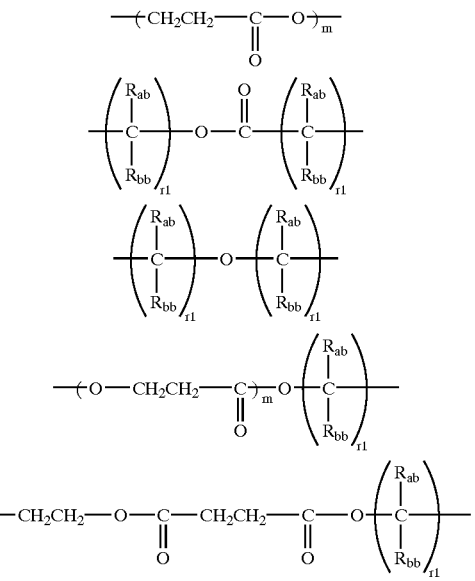

In the above formulae, $R_{ab}$ and $R_{bb}$, which may be the same or different, each represent a hydrogen atom, an unsubstituted or substituted alkyl group, a halogen atom, a hydroxy group or an alkoxy group.

The alkyl group is preferably a lower alkyl group, such as a methyl group, an ethyl group, a propyl group, an isopropyl group or a butyl group, and more preferably selected from a methyl group, an ethyl group, a propyl group and an isopropyl group. Examples of the substituent for the substituted alkyl group include a hydroxy group, a halogen atom and $C_1$–$C_4$ alkoxy groups.

The alkoxy group includes $C_1$–$C_4$ alkoxy groups, such as a methoxy group, an ethoxy group, a propoxy group and a butoxy group. The halogen atom includes a chlorine atom, a bromine atom, a fluorine atom and an iodine atom. r1 is an integer of 1 to 10, preferably an integer of 1 to 4. m is an integer of 1 to 3, preferably 1 or 2.

Specific examples of the repeating unit represented by formula (AI) are illustrated below, but these examples should not be construed as limiting the scope of the invention.

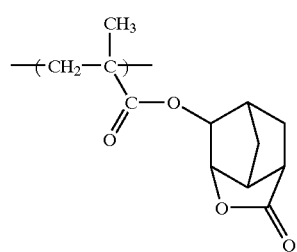
(Ib-1)

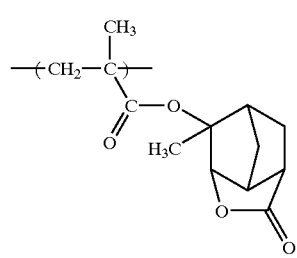
(Ib-2)

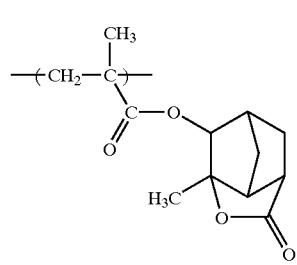
(Ib-3)

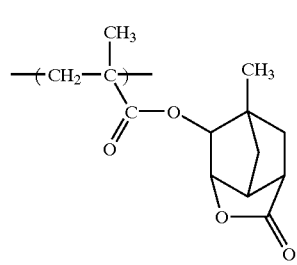
(Ib-4)

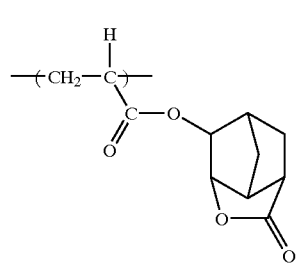
(Ib-5)

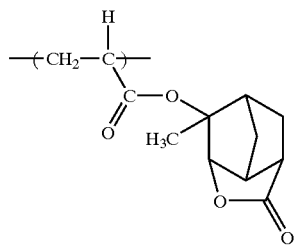
(Ib-6)

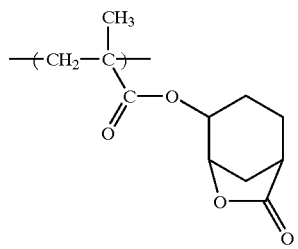
(Ib-7)

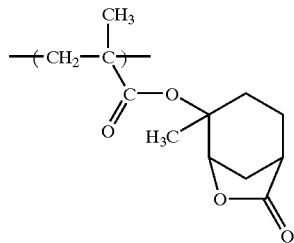
(Ib-8)

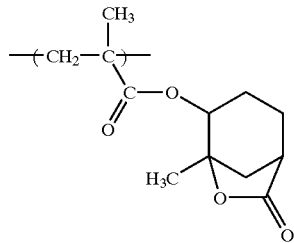
(Ib-9)

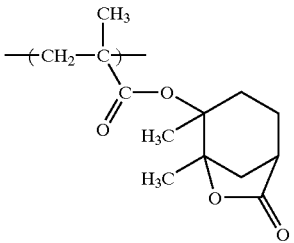
(Ib-10)

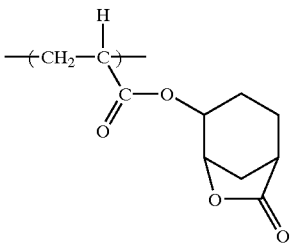
(Ib-11)

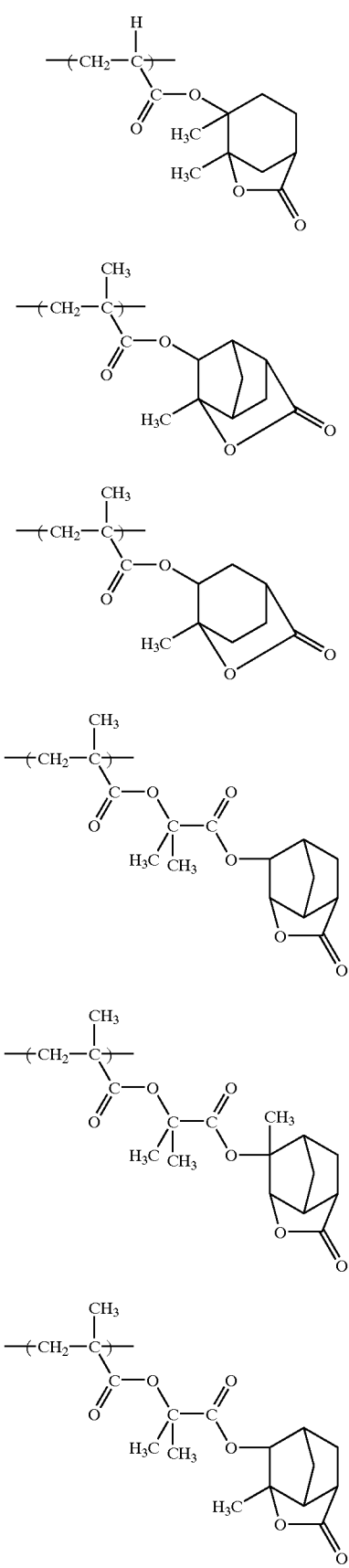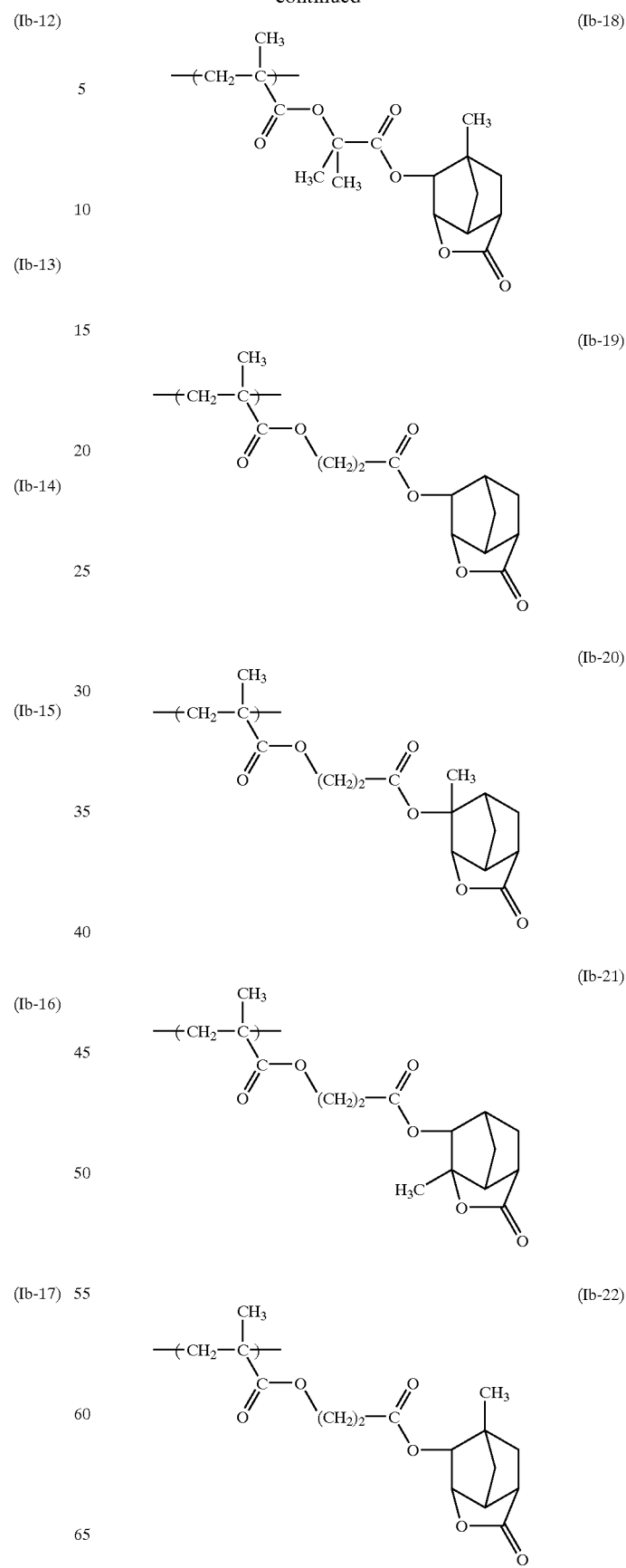

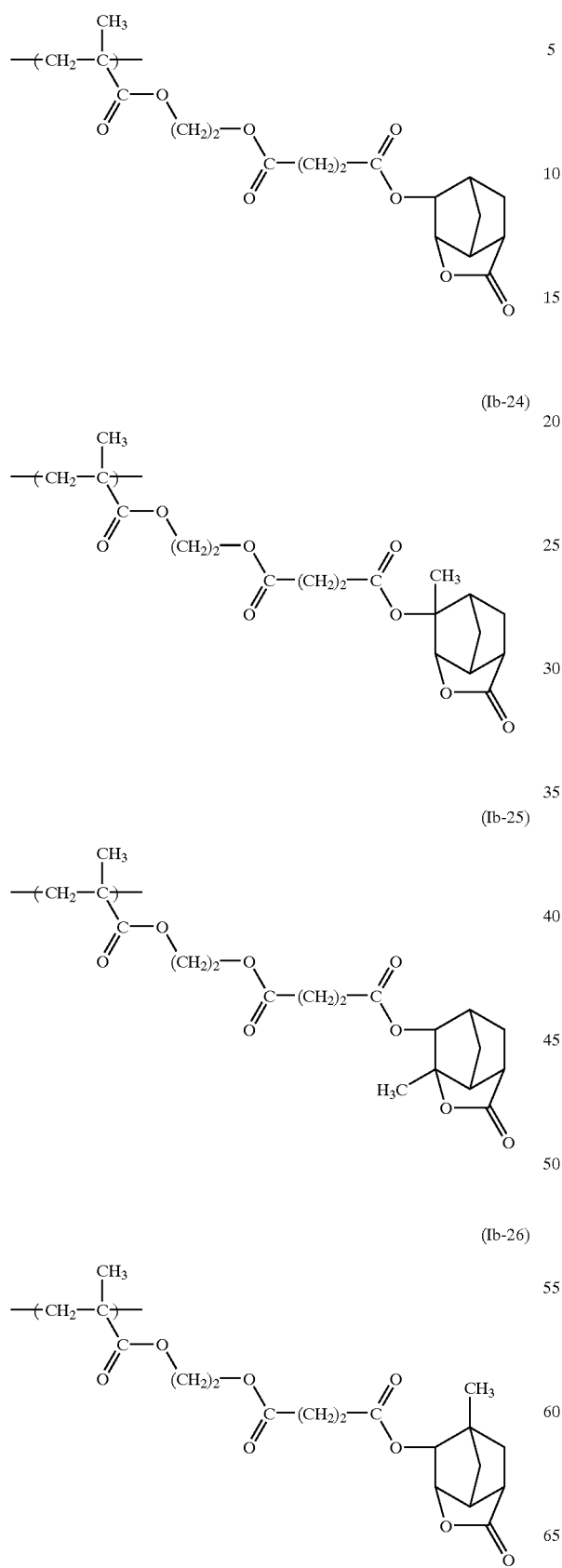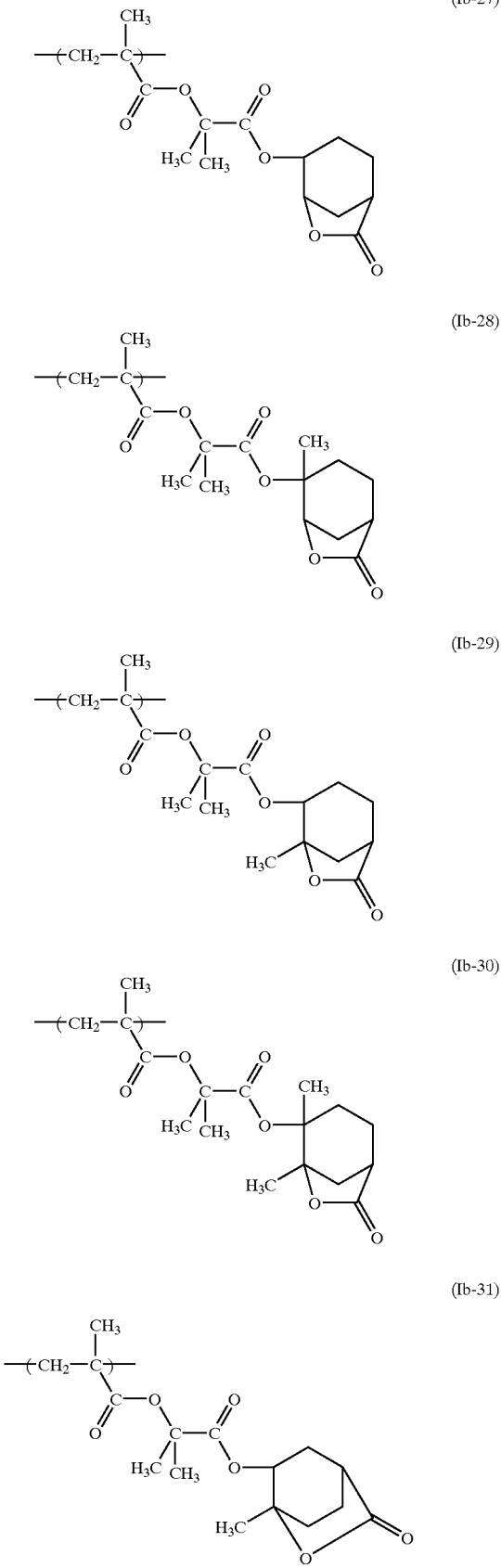

(Ib-32)
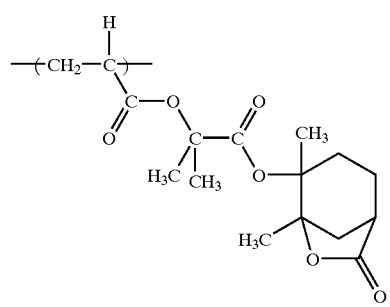
(Ib-33)
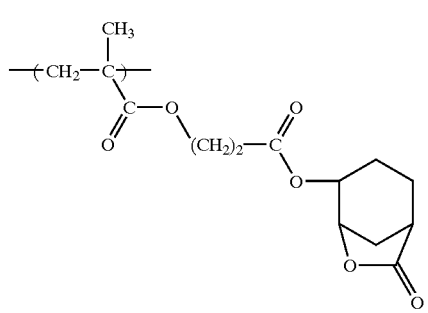
(Ib-34)
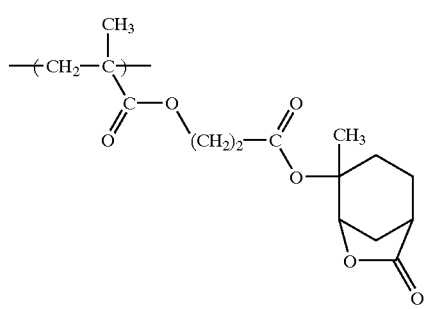
(Ib-35)
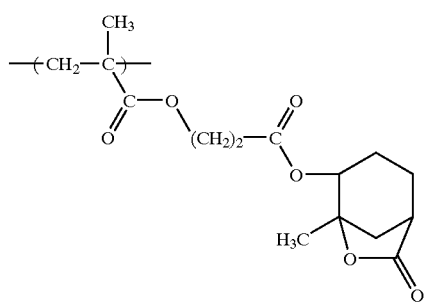
(Ib-36)
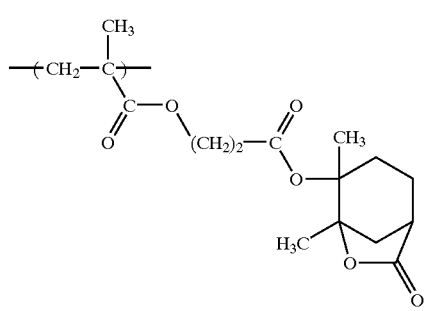
(Ib-37)
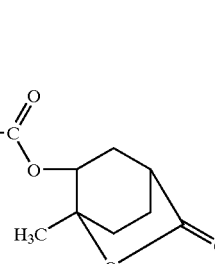
(Ib-38)
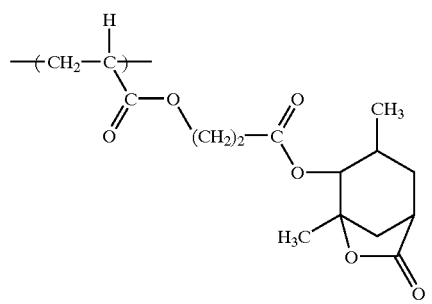
(Ib-39)
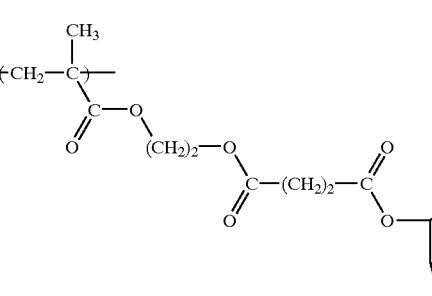
(Ib-40)
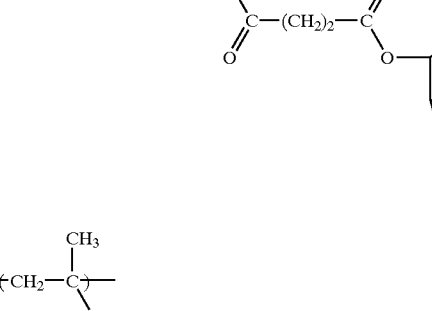
(Ib-41)
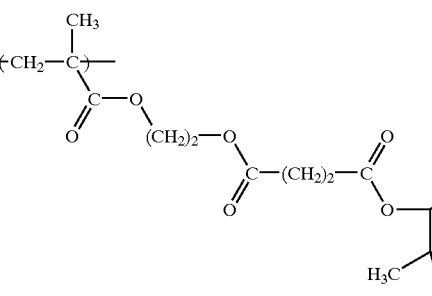

-continued

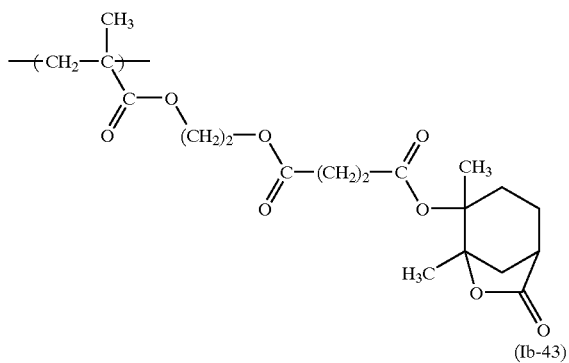

(Ib-42)

(Ib-43)

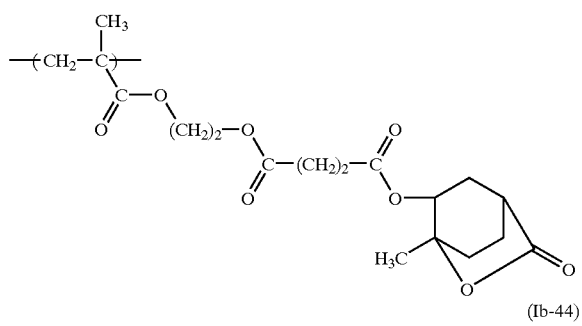

(Ib-44)

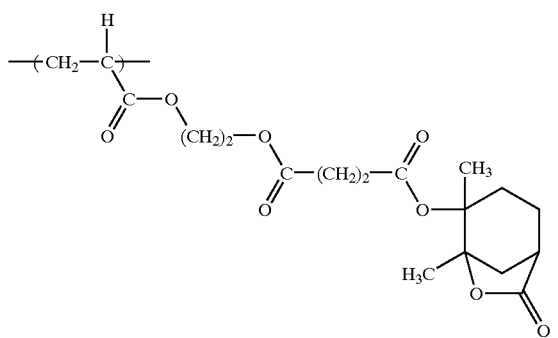

In addition, the acid-decomposable resin of the invention may further contain a repeating unit represented by the following formula (VI):

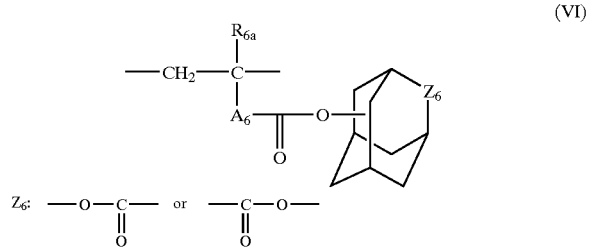

(VI)

$Z_6$: —O—C(=O)— or —C(=O)—O— wherein $A_6$ represents a single bond, an alkylene group, a cycloalkylene group, an ether group, a thioether group, a carbonyl group, an ester group or a group formed by combining any two or more of these groups; and $R_{6a}$ represents a hydrogen atom, a $C_1$–$C_4$ alkyl group, a cyano group, or a halogen atom.

Examples of the alkylene group for $A_6$ in formula (VI) include a group represented by the following formula:

—[C($R_{nf}$)($R_{ng}$)]$_r$— wherein $R_{nf}$ and $R_{ng}$, which may be the same or different, each represent a hydrogen atom, an unsubstituted or substituted alkyl group, a halogen atom, a hydroxy group or an alkoxy group. The alkyl group is preferably a lower alkyl group, such as a methyl group, an ethyl group, a propyl group, an isopropyl group or a butyl group, more preferably selected from a methyl group, an ethyl group, a propyl group and an isopropyl group. Examples of the substituent for the substituted alkyl group include a hydroxy group, a halogen atom and an alkoxy group. Examples of the alkoxy group include $C_1$–$C_4$ alkoxy groups, such as a methoxy group, an ethoxy group, a propoxy group and a butoxy group. Examples of the halogen atom include chlorine, bromine, fluorine and iodine atoms. r is an integer of 1 to 10.

Examples of the cycloalkylene group for $A_6$ in formula (VI) include those containing 3 to 10 carbon atoms, such as a cyclopentylene group, a cyclohexylene group and a cyclooctylene group.

The $Z_6$-containing bridged alicyclic ring may have a substituent. Examples of the substituent include a halogen atom, an alkoxy group (preferably containing 1 to 4 carbon atoms), an alkoxycarbonyl group (preferably containing 1 to 5 carbon atoms), an acyl group (e.g., formyl, benzoyl), an acyloxy group (e.g., propylcarbonyloxy, benozyloxy), an alkyl group (preferably containing 1 to 4 carbon atoms), a carboxy group, a hydroxy group, and an alkylsulfonylcarbamoyl group (e.g., —CONHSO$_2$CH$_3$). The alkyl group as the substituent may further be substituted with a hydroxy group, a halogen atom or an alkoxy group (preferably containing 1 to 4 carbon atoms).

The oxygen atom of the ester group linked to $A_6$ in formula (VI) may be bound to any of carbon atoms constituting the $Z_6$-containing bridged alicyclic ring structure.

Examples of the repeating unit represented by formula (VI) are illustrated below, but these examples should not be construed as limiting the scope of the invention.

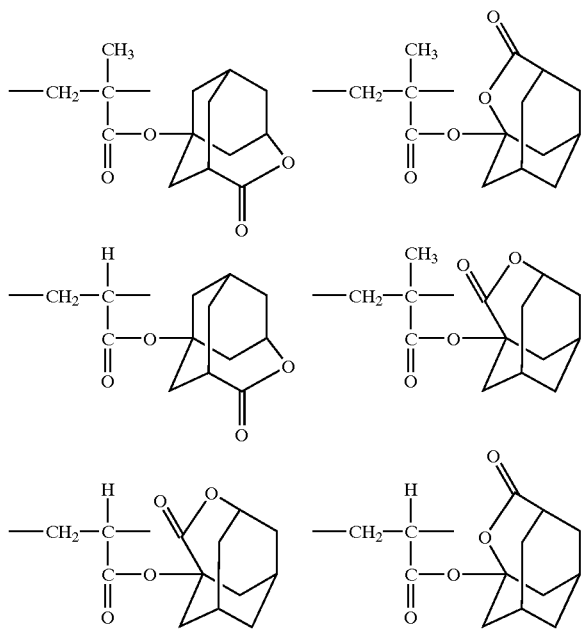

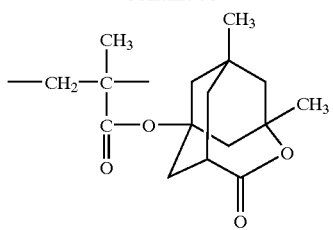
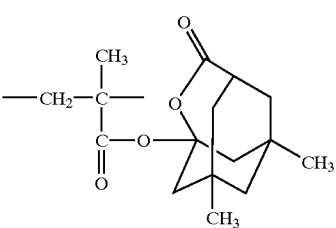
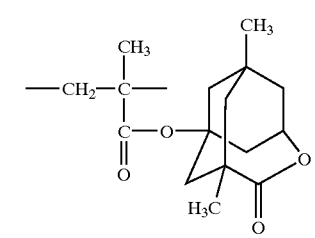
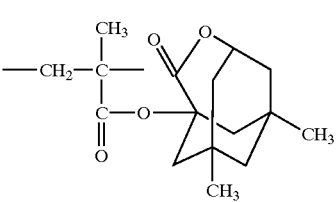
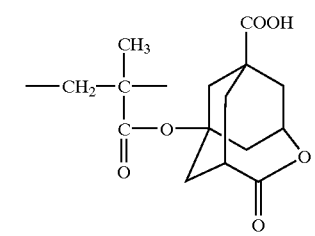
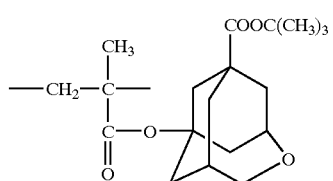
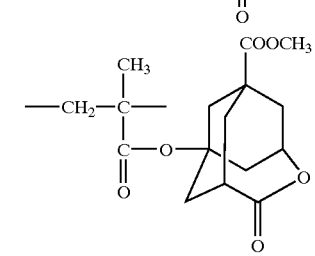

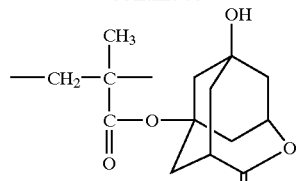
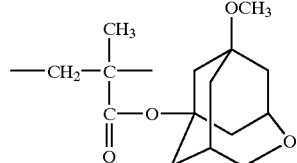
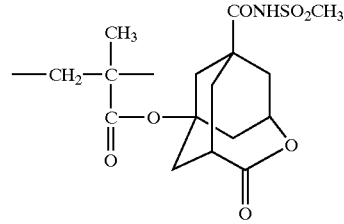

Furthermore, the acid-decomposable resin of the invention may contain a repeating unit having a group represented by the following formula (VII):

(VII)

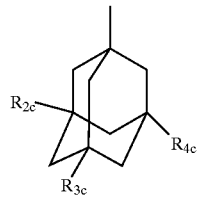

wherein $R_{2c}$ to $R_{4c}$ independently represent a hydrogen atom or a hydroxy group, provided that at least one of $R_{2c}$ to $R_{4c}$ represents a hydroxy group.

The group represented by formula (VII) is preferably a dihydroxy- or monohydroxy-substituted group, more preferably a dihydroxy-substituted group.

Examples of the repeating unit having a group represented by formula (VII) include the repeating units represented by formula (II-A) or (II-B) wherein at least one of $R_{13}'$ to $R_{16}'$ is a group represented by formula (VII) (e.g., $R_5$ of the group —COOR$_5$ is a group represented by any one of formulae (V-1) to (V-4)), and a repeating unit represented by the following formula (AII):

(AII)

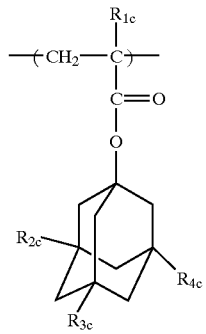

wherein $R_{1c}$ represents a hydrogen atom or a methyl group, and $R_{2c}$ to $R_{4c}$ independently represent a hydrogen atom or a hydroxy group, provided that at least one of $R_{2c}$ to $R_{4c}$ is a hydroxy group.

Examples of the repeating unit having the structure represented by formula (AII) are illustrated below, but these examples should not be construed as limiting the scope of the invention.

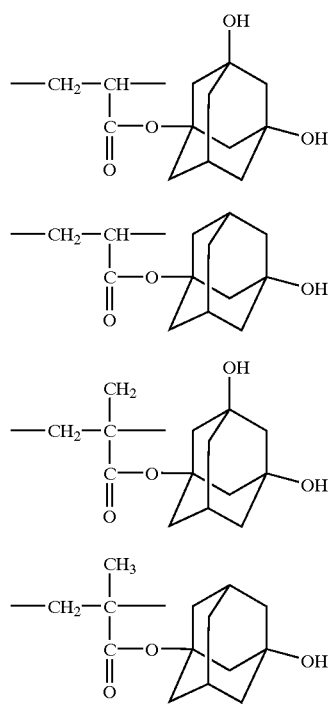

In addition, the resin (B) may contain a repeating unit represented by the following formula (VIII):

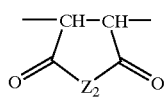

In formula (VIII), $Z_2$ represents —O— or —N($R_{41}$)— wherein $R_{41}$ represents a hydrogen atom, a hydroxy group, an alkyl group, a haloalkyl group or —OSO$_2$—$R_{42}$, and $R_{42}$ represents an alkyl group, a haloalkyl group, a cycloalkyl group or a camphor residue.

The alkyl group for $R_{41}$ or $R_{42}$ is preferably a $C_1$–$C_{10}$ linear or branched alkyl group, more preferably a $C_1$–$C_6$ linear or branched alkyl group, still more preferably a methyl group, an ethyl group, a propyl group, an isopropyl group, a n-butyl group, an isobutyl group, a sec-butyl group or a tert-butyl group.

The haloalkyl group for $R_{41}$ or $R_{42}$ includes a trifluoromethyl group, a nanoflurobutyl group, a pentadecafluorooctyl group and a trichloromethyl group. The cycloalkyl group for $R_{42}$ includes a cyclopentyl group, a cyclohexyl group and a cyclooctyl group.

The alkyl groups and haloalkyl group for $R_{41}$ or $R_{42}$, and the cycloalkyl group and the camphor residue for $R_{42}$ may have a substituent. Examples of the substituent include a hydroxy group, a carboxy group, a cyano group, halogen atoms (e.g., chlorine, bromine, fluorine, iodine), alkoxy groups (preferably containing 1 to 4 carbon atoms, such as methoxy, ethoxy, propoxy and butoxy groups), acyl groups (preferably containing 2 to 5carbon atoms, such as formyl and acetyl groups), acyloxy groups (preferably containing 2 to 5 carbon atoms, such as an acetoxy group), and aryl groups (preferably containing 6 to 14 carbon atoms, such as a phenyl group).

Examples of the repeating unit represented by formula (VIII) include the repeating units [I'-1] to [I'-7] illustrated below, but these examples should not be construed as limiting the scope of the invention in any way.

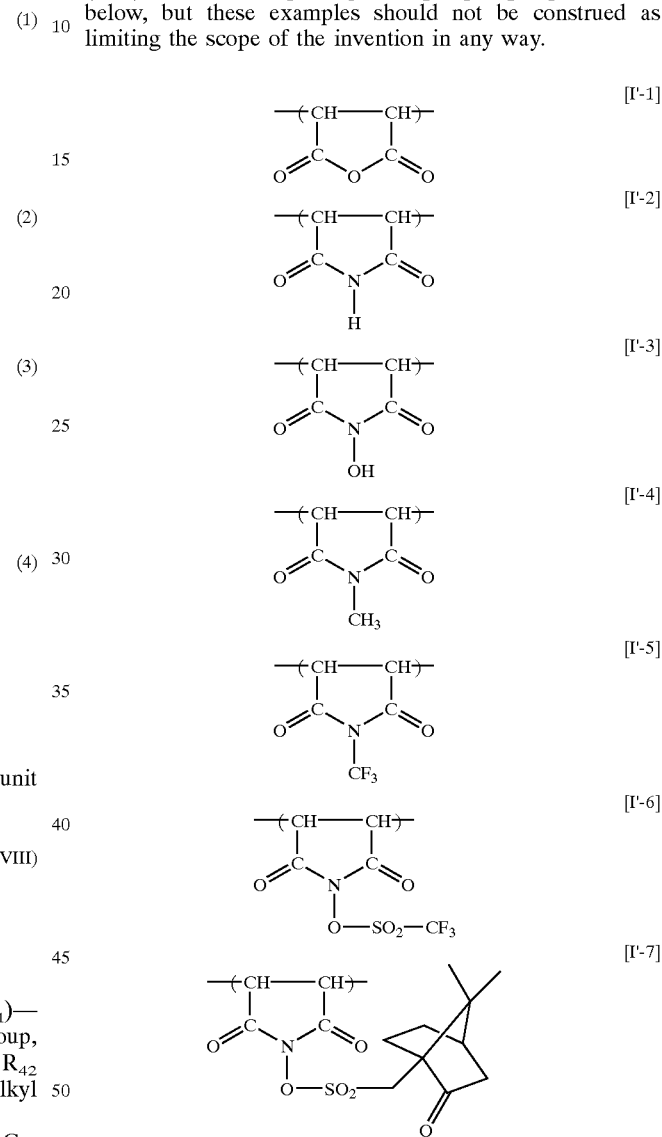

In addition to the repeating units as described above, the acid-decomposable resin of Component (B) may contain various repeating units for the purposes of adjusting dry etching resistance, standard developer suitability, adhesion to substrate, resist profile and properties ordinarily required for resist, such as resolution, heat resistance and sensitivity.

Examples of such repeating units that can meet those purposes include repeating units corresponding to the monomers described below, but these examples should not be construed as limiting the scope of the invention.

Incorporation of such repeating units enables fine adjustments of capabilities required for the acid-decomposable resin, especially:

(1) Solubility in coating solvent
(2) Film formability (glass transition temperature)

(3) Alkali developability (4) Reduction in film thickness (choice of hydrophobic group and alkali-soluble group to introduce)

(5) Adhesion to substrate in the unexposed area, and (6) Dry etching resistance.

Examples of the monomer include compounds having one addition-polymerizable unsaturated bond per molecule, which are selected from acrylic acid esters, methacrylic acid esters, acrylamides, methacrylamides, allyl compounds, vinyl ethers or vinyl esters.

More specifically, the following monomers are exemplified.

Acrylic acid esters (preferably alkyl acrylates which contain 1 to 10 carbon atoms in their respective alkyl moieties), such as methyl acrylate, ethyl acrylate, propyl acrylate, amyl acrylate, cyclohexyl acrylate, ethylhexyl acrylate, octyl acrylate, tert-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, benzyl acrylate, methoxybenzyl acrylate, furfuryl acrylate and tetrahydrofurfuryl acrylate;

Methacrylic acid esters (preferably alkyl methacrylates which contain 1 to 10 carbon atoms in their respective alkyl moieties), such as methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, furfuryl methacrylate and tetrahydrofurfuryl methacrylate;

Acrylamides, such as acrylamide, N-alkylacrylamides (the alkyl moieties of which contain 1 to 10 carbon atoms per moiety, with examples including methyl, ethyl, propyl, butyl, tert-butyl, heptyl, octyl, cyclohexyl and hydroxyethyl groups), N,N-dialkylacrylamides (the alkyl moieties of which contain 1 to 10 carbon atoms per moiety, with examples including methyl, ethyl, butyl, isobutyl, ethylhexyl and cyclohexyl groups), N-hydroxyethyl-N-methylacrylamide and N-2-acetamidoethyl-N-acetylacrylamide;

Methacrylamides, such as methacrylamide, N-alkylmethacrylamides (the alkyl moieties of which contain 1 to 10 carbon atoms per moiety, with examples including methyl, ethyl, tert-butyl, ethylhexyl, hydroxyethyl and cyclohexyl groups), N,N-dialkylmethacrylamides (the alkyl moieties of which include ethyl, propyl and butyl groups) and N-hydroxyethyl-N-methylmethacrylamide;

Allyl compounds, such as allyl esters (e.g., allyl acetate, allyl caproate, allyl caprylate, allyl laurate, allyl palmitate, allyl stearate, allyl benzoate, allyl acetoacetate and allyl lactate) and allyloxyethanol;

Vinyl ethers including alkyl vinyl ethers (such as hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether and tetrahydrofurfuryl vinyl ether);

Vinyl esters, such as vinyl butyrate, vinyl isobutyrate, vinyl trimethylacetate, vinyldiethyl acetate, vinyl valerate, vinyl caproate, vinyl chloroacetate, vinyl dichloroacetate, vinyl methoxyacetate, vinyl butoxyacetate, vinyl acetoacetate, vinyl lactate, vinyl β-phenylbutyrate and vinyl cyclohexylcarboxylate;

Dialkyl itaconates, such as dimethyl itaconate, diethyl itaconate and dibutyl itaconate;

Dialkyl fumarates and monoalkyl fumarates, such as dibutyl fumarate; and

Other monomers including crotonic acid, itaconic acid, maleic anhydride, maleimide, acrylonitrile, methacrylonitrile and maleonitrile.

In addition, any addition-polymerizable unsaturated compounds may undergo copolymerization so long as they can be copolymerized with monomers corresponding to the various repeating units recited above.

In the acid-decomposable resin, the molar ratio of various repeating units is determined appropriately for adjustment to the desired dry etching resistance, standard developer suitability, adhesion to substrate and resist profile, and ordinarily required properties, such as resolution, heat resistance and sensitivity.

Preferred embodiments of the acid-decomposable resin of the invention are as follows:

(1) Resins containing the repeating unit including as a partial structure the alicyclic hydrocarbon moiety represented by any one of formulae (pI) to (pVI) (Side-chain type), (2) Resins containing the repeating unit represented by formula (II-AB) (Main-chain type), and (3) Resins broadly included in (2), but further containing a maleic anhydride derivative and a (meth) acrylate structure in addition to the repeating unit represented by formula (II-AB) (Hybrid type).

The proportion of the repeating unit including as a partial structure the alicyclic hydrocarbon moiety represented by any one of formulae (pI) to (pVI) is preferably from 30 to 70 mole %, more preferably from 35 to 65 mole %, still more preferably from 40 to 60 mole %, of the total repeating units in the acid-decomposable resin.

The proportion of the repeating unit represented by formula (II-AB) is preferably from 10 to 60 mole %, more preferably from 15 to 55 mole %, still more preferably from 20 to 50 mole %, of the total repeating units in the acid-decomposable resin.

The proportion of the repeating units derived from the other monomers as copolymerization components in the acid-decomposable resin can be appropriately determined depending on the desired resist characteristics. Ordinarily, the proportion thereof is preferably at most 99 mole %, more preferably at most 90 mole %, still more preferably at most 80 mole %, to the total mole number of the repeating unit including as a partial structure the alicyclic hydrocarbon moiety represented by any one of formulae (pI) to (pVI) and the repeating unit represented by formula (II-AB).

When the composition of the invention is intended for ArF exposure, it is desirable for the resin to have no aromatic group from the viewpoint of transparency to ArF light.

The acid-decomposable Resin (B) used in the invention can be synthesized by a conventional method (e.g., a radical polymerization method). In a usual synthesis method, for instance, monomer species are placed in a reaction vessel collectively or intermittently, dissolved and homogenized, if desired, in a reaction solvent, e.g., an ether such as tetrahydrofuran, 1,4-dioxane or diisopropyl ether, a ketone such as methyl ethyl ketone or methyl isobutyl ketone, an ester solvent such as ethyl acetate, or a solvent capable of dissolving the composition of the invention, such as propylene glycol monomethyl ether acetate, which is described hereinafter, and then the polymerization thereof is initiated by use of a commercially available radical initiator (e.g., an initiator of azo type, peroxide) in an atmosphere of inert gas such as nitrogen or argon and, if desired, under heating. The additional initiator is added by the lump or in several portions, if desired. At the completion of the reaction, the reaction mixture is poured into a solvent, and the intended polymer is recovered therefrom by a powder or solid recovery method. The concentration of the reaction solution is at least 20 weight %, preferably at least 30 weight %, more preferably at least 40 weight %. The reaction temperature is from 10° C. to 150° C., preferably from 30° C. to 120° C., more preferably from 50° C. to 100° C.

The weight average molecular weight of the resin according to the invention is preferably from 1,000 to 200,000, as measured by GPC and calculated in terms of polystyrene. It is not much desirable for the resin to have the weight average molecular weight lower than 1,000, because deterioration of thermal resistance and dry etching resistance is observed in the resulting resist. The resin having the weight average molecular weight higher than 200,000 is also not desirable, because problems including lowering of developability and deterioration in film formability due to the extremely high viscosity tend to occur.

The proportion of the total resin according to the invention in the positive photoresist composition for exposure to far ultraviolet ray is preferably 40 to 99.99%, more preferably 50 to 99.97% of the total solid content of the composition.

<<(C) Basic Compound>>

It is preferable that the positive photosensitive composition of the invention contains (C) a basic compound in order to restrain fluctuations in characteristics occurred with the passage of time from exposure to heating.

Preferred examples of a structure of the basic compound (C) include structures represented by the following formulae (A) to (E).

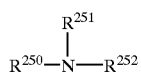
(A)

wherein, $R^{250}$, $R^{251}$ and $R_{252}$ independently represent a hydrogen atom, a $C_1$–$C_{20}$ alkyl group, a $C_1$–$C_{20}$ aminoalkyl group, a $C_1$–$C_{20}$ hydroxyalkyl group, or a substituted or unsubstituted $C_6$–$C_{20}$ aryl group, or $R^{250}$ and $R^{251}$ may combine with each other to form a ring. The alkyl chains each may contain oxygen, sulfur or/and nitrogen atoms.

(B)

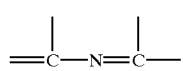
(C)

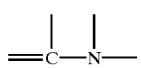
(D)

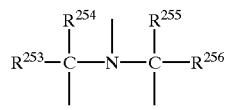
(E)

wherein, $R^{253}$, $R^{254}$, $R^{255}$ and $R^{256}$ independently represent a $C_1$–$C_6$ alkyl group.

Preferred examples of the basic compound (C) include a substituted or unsubstituted guanidine, a substituted or unsubstituted aminopyridine, a substituted or unsubstituted aminoalkylpyridine, a substituted or unsubstituted aminopyrrolidine, a substituted or unsubstituted indazole, a substituted or unsubstituted pyrazole, a substituted or unsubstituted pyrazine, a substituted or unsubstituted pyrimidine, a substituted or unsubstituted purine, a substituted or unsubstituted imidazoline, a substituted or unsubstituted pyrazoline, a substituted or unsubstituted piperazine, a substituted or unsubstituted aminomorpholine, a substituted or unsubstituted aminoalkylmorpholine, a mono-, di- and trialkylamine, a substituted or unsubstituted aniline, a substituted or unsubstituted piperidine, and mono- or diethanolamine. Preferred examples of the substituent include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxy group and a cyano group.

Specific examples thereof include guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl) piperazine, N-(2-aminoethyl)piperidine, 4-amino-2,2,6,6-tetramethylpiperizine, 4-piperizinopiperizine, 2-iminopiperidine, 1-(2-aminoethyl)pyrrolidine, pyrazole, 3-amino-5-methylpyrazole, 5-amino-3-methyl-1-p-tollylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, N-(2-aminoethyl)morpholine, 1,5-diazabicyclo[4.3.0]non-5-ene, 1,8-diazabicyclo[5.4.0]undec-7-ene, 2,4,5-triphenylimidazole, tri(n-butyl)amine, tri(n-octyl)amine, N-phenyldiethanolamine, N-hydroxyethylpiperidine, 2,6-diisopropylaniline and N-cyclohexyl-N'-morpholinoethylthiourea. However, the preferred compounds should not be construed as being limited to those recited above.

Examples of more preferred compounds include a substituted or unsubstituted guanidine, a substituted or unsubstituted aminopyrrolidine, a substituted or unsubstituted pyrazole, a substituted or unsubstituted pyrazoline, a substituted or unsubstituted piperazine, a substituted or unsubstituted aminomorpholine, a substituted or unsubstituted aminoalkylmorpholine, a substituted or unsubstituted piperidine, and a compound having an imidazole structure, a diazabicyclo structure, an onium hydroxide structure, an onium carboxylate structure or an aniline structure.

Examples of the compound having an imidazole structure include imidazole, 2,4,5-triphenylimidazole and benzimidazole. Examples of the compound having a diazabicyclo structure include 1,4-diazabicyclo[2.2.2]octane, 1,5- diazabicyclo[4.3.0]non-5-ene and 1,8-diazabicyclo[5.4.0] undec-7-ene. Examples of the compound having an onium hydroxide structure include triarylsulfonium hydroxides, phenacylsulfonium hydroxide and sulfonium hydroxide having a 2-oxoalkyl group, e.g., triphenylsulfonium hydroxide, tris(tert-butylphenyl)sulfonium hydroxide, bis(tert-butylphenyl)iodonium hydroxide, phenacyithiophenium hydroxide and 2-oxopropylthiophenium hydroxide. The compound having an onium carboxylate structure is a compound whose anion part is a carboxylate instead of the hydroxide in the compound having an onium hydroxide structure as recited above. Examples of the carboxylate include acetate, adamantane-1-carboxylate and perfluoroalkylcarboxylates. Examples of the compound having an aniline structure include 2,6-diisopropylaniline and N,N-dimethylaniline. Each of these compounds should not be construed as being limited to the examples recited above.

The basic compounds of Component (C) may be used alone or as mixtures of two or more thereof. The amount of the basic compound (C) used is ordinarily 0.001 to 10 weight %, preferably 0.01 to 5 weight %, based on the solid content of the positive photosensitive composition. When the amount is smaller than 0.001 weight %, the effect of the addition of basic compound is not obtained. When the amount is greater than 10 weight %, on the other hand, there is a tendency to cause deterioration in sensitivity and developability of the unexposed areas.

<<(D) Surfactant Containing Fluorine or/and Silicon Atoms>>

It is preferable that the positive photosensitive composition of the invention contains a surfactant containing fluorine or/and silicon atoms (including a fluorine-containing surfactant, a silicon-containing surfactant and a surfactant containing both fluorine and silicon atoms), or a combination of two of more thereof.

Incorporation of the surfactant (D) in the positive photosensitive composition enables resist patterns having strong adhesion and reduced development defects to be formed in satisfactory sensitivity and high resolution when an exposure light source of 250 nm or shorter, especially 220 nm or shorter, is used.

Examples of the surfactant (D) include the surfactants disclosed in Japanese Patent Laid-Open Nos. 36663/1987, 226746/1986, 226745/1986, 170950/1987, 34540/1988, 230165/1995, 62834/1996, 54432/1997 and 5988/1997, and U.S. Pat. Nos. 5,405,720, 5,360,692, 5,529,881, 5,296,330, 5,436,098, 5,576,143, 5,294,511 and 5,824,451. In addition, commercially available surfactants as shown below can be used as they are.

Examples of the commercially available surfactants usable include fluorine-containing surfactants and silicon-containing surfactants, such as Eftop EF301 and EF303 (produced by Shin-Akita Kasei K. K.), Florad $FC_{430}$ and $FC_{431}$ (produced by Sumitomo 3M, Inc.), Megafac F171, F173, F176, F189 and R08 (produced by Dainippon Ink & Chemicals, Inc.), Surflon S-382, $SC_{101}$, $SC_{102}$, $SC_{103}$, $SC_{104}$, $SC_{105}$ and $SC_{106}$ (produced by Asahi Glass Co., Ltd.), and Troysol S-366 (produced by Troy Chemical Industries, Inc.). In addition, polysiloxane polymer KP-341 (produced by Shin-Etsu Chemical Industry Co., Ltd.) can be used as the silicon-containing surfactant.

The amount of the surfactant used is preferably from 0.0001 to 2 weight %, more preferably from 0.001 to 1 weight %, to the total positive photosensitive composition (excepting a solvent).

<<(F) Organic Solvent>>

The positive photosensitive composition of the invention is used by dissolving the components described above in an appropriate organic solvent.

Examples of the organic solvent usable include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethylacetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethyl sulfoxide, N-methylpyrrolidone, and tetrahydrofuran.

In the invention, the organic solvents may be used alone or as a mixture of two or more thereof. It is preferred that a mixture of a solvent containing a hydroxy group and a solvent containing no hydroxy group. By using such a mixed solvent, it becomes possible to retard the occurrence of particles during storage of the resist solution Examples of the hydroxy group-containing solvent include ethylene glycol, ethylene glycol monomethyl ether, ethylene glycol monoethyl ether, propylene glycol, propylene glycol monomethyl ether, propylene glycol monoethyl ether, and ethyl lactate. Of these solvents, propylene glycol monomethyl ether and ethyl lactate are preferred in particular.

Examples of the hydroxy group-free solvent include propylene glycol monomethyl ether acetate, ethyl ethoxypropionate, 2-heptanone, γ-butyrolactone, cyclohexanone, butyl acetate, N-methylpyrrolidone, N,N-dimethylacetamide, and dimethyl sulfoxide. Of these solvents, propylene glycol monomethyl ether acetate, ethyl ethoxypropionate, 2-heptanone, γ-butyrolactone, cyclohexanone and butyl acetate are preferred. In particular, propylene glycol monomethyl ether acetate, ethyl ethoxypropionate and 2-heptanone are most preferred.

The mixing ratio (by weight) between the hydroxy group-containing solvent and the hydroxy group-free solvent is from 1/99 to 99/1, preferably from 10/90 to 90/10, more preferably from 20/80 to 60/40. The mixed solvent containing a hydroxy group-free solvent in a proportion of at least 50 weight % is especially desirable in view of coating uniformity.

<<(F) Acid-Decomposable Dissolution-Inhibiting Compound>>

It is preferred that the positive photosensitive composition of the invention contains (F) a dissolution-inhibiting low-molecular compound having a molecular weight of 3,000 or below and a group which is decomposed by the action of an acid to increase solubility in an alkali developer (also referred as to "acid-decomposable dissolution-inhibiting compound (F)).

In order not to lower transparency at 220 nm or shorter in particular, an alicyclic or aliphatic compound containing an acid-decomposable group, such as cholic acid derivatives containing an acid-decomposable group as described in *Proceeding of SPIE*, 2724, 355 (1996), are preferred as the acid-decomposable dissolution-inhibiting compound (F). With respect to the acid-decomposable group and alicyclic structure contained in the compound, those described in the acid-decomposable resins above can be exemplified.

The molecular weight of the acid-decomposable dissolution-inhibiting compound used in the invention is 3,000 or below, preferably from 300 to 3,000, more preferably from 500 to 2,500.

The amount of acid-decomposable dissolution-inhibiting compound (F) added is preferably from 3 to 50 weight %, more preferably 5 to 40 weight %, to the total solid content of the positive photosensitive composition.

Specific examples of the acid-decomposable dissolution-inhibiting compound (F) are illustrated below, but the compound used in the invention should not be construed as being limited to these examples.

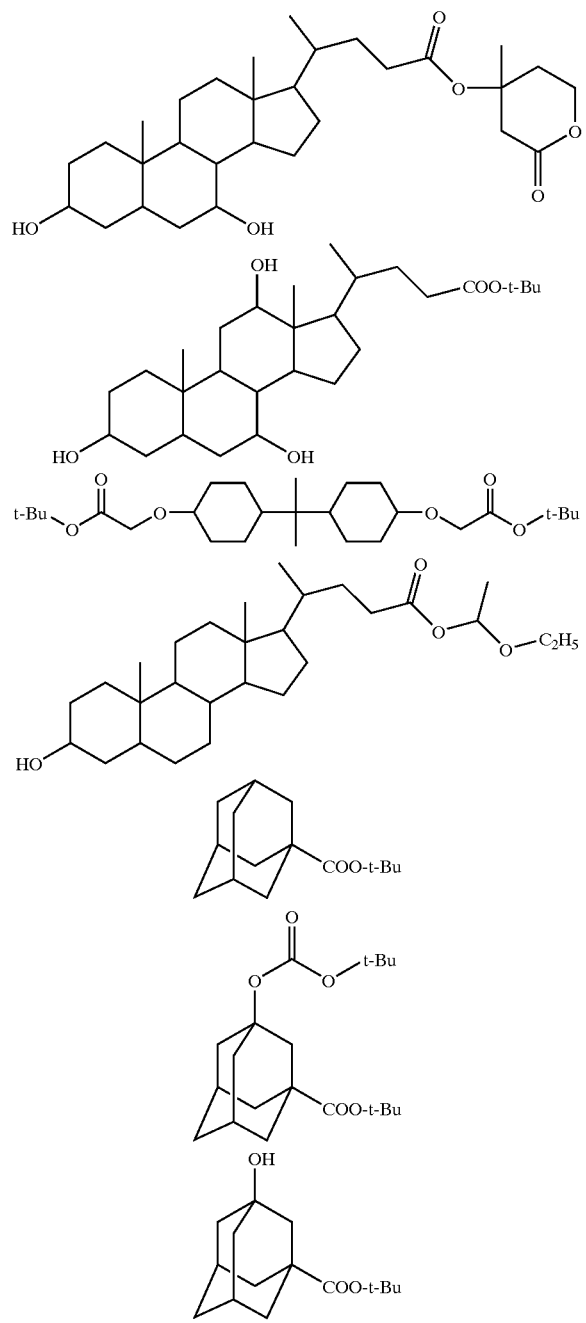

<<(G) Alkali-soluble Resin>>

The positive photosensitive composition of the invention may further contain (G) a resin insoluble in water, soluble in an alkali developer and free from an acid-decomposable group. by the addition of such a resin, the sensitivity of the photosensitive composition can be increased.

In the invention, a novolak resin having a molecular weight of about 1,000 to about 20,000 and a poly (hydroxystyrene) derivative having a molecular weight of about 3,000 to about 50,000 can be used as such a resin. Since these resins have a strong light absorption in the wavelength range of 250 nm or shorter, it is preferred that they are used after subjecting to partial hydrogenation or the content thereof is controlled to not higher than 30 weight % of the total resin.

A resin containing a carboxyl group as an alkali-soluble group can also be used. It is preferable for the resin containing carboxyl group to have a mono- or polycyclic alicyclic hydrocarbon group from the viewpoint of improving dry etching resistance. Specific examples of the resin include a copolymer of (meth) acrylic acid and a methacrylic acid ester containing an alicyclic hydrocarbon structure having no acid decomposing property and an alicyclic hydrocarbon (meth)acrylate resin having a carboxyl group at the terminal thereof.

<<Other Additives>>

The positive photosensitive composition of the invention can further contain dyes, plasticizers, surfactants other than the component (D) recited hereinbefore, photosensitizers, and compounds capable of promoting dissolution in a developer, if desired.

The dissolution-promoting compound to a developer usable in the invention is a low molecular compound having a molecular weight of 1,000 or below and at least two per molecule of phenolic OH groups or at least one per molecule of carboxy group. In the case of the compound having a carboxy group, an alicyclic or aliphatic compound is preferred for the same reason as described above.

The amount of the dissolution-promoting compound added is preferably from 2 to 50 weight %, more preferably from 5 to 30 weight %, to the resin of Component (B) which can be decomposed by the action of an acid to increase solubility in an alkali developer. The addition of the compound in an amount greater than 50 weight % is undesirable because it causes the increase in development residue and provides a new drawback of deforming patterns at the time of development.

The phenolic compound having a molecular weight of 1,000 or below can be synthesized with ease with reference to the methods as described in Japanese Patent Laid-Open Nos. 122938/1992 and 28531/1990, U.S. Pat. No. 4,916,210 and European Patent No. 219,294.

Specific examples of the carboxyl group-containing alicyclic or aliphatic compound include a carboxylic acid derivative having steroid structure, such as cholic acid, deoxycholic acid and lithocholic acid, an adamantanecarboxylic acid derivative, adamantanedicarboxylic acid, cyclohexanecarboxylic acid and cyclohexanedicarboxylic acid, but the compound should not to be construed as being limited to these examples.

In the present invention, a surfactant other than the fluorine and/or silicon-containing surfactant of Component (D) may also be used. Specific examples thereof include nonionic surfactants, for example, polyoxyethylene alkyl ethers (e.g., polyoxyethylene lauryl ether, polyoxyethylene stearyl ether, polyoxyethylene cetyl ether, polyoxyethylene oleyl ether), polyoxyethylene alkyl aryl ethers (e.g., polyoxyethylene octyl phenol ether, polyoxyethylene nonyl phenol ether), polyoxyethylene-polyoxypropylene block copolymers, sorbitan fatty acid esters (e.g., sorbitan monolaurate, sorbitan monopalmitate, sorbitan monostearate, sorbitan monooleate, sorbitan trioleate, sorbitan tristearate), and polyoxyethylenesorbitan fatty acid esters (e.g., polyoxyethylenesorbitan monolaurate, polyoxyethylenesorbitan monopalmitate, polyoxyethylenesorbitan monostearate, polyoxyethylenesorbitan trioleate, polyoxyethylenesorbitan tristearate).

The surfactants may be added alone or as a combination of two or more thereof.

<<Way of Using>>

The positive photosensitive composition of the invention is used by dissolving the components described above in an appropriate organic solvent, preferably the mixed solvent as described above, and coating the resulting solution on the desired substrate in the following manner.

Specifically, the solution of the positive photosensitive composition is coated on a substrate used for the production of precision integrated circuit elements (e.g., silicon/silicon dioxide coating) according to an appropriate coating method, for example, by using a spinner or a coater.

The composition thus coated is exposed to light via the desired mask, baked, and then developed. Thus, resist patterns of good quality can be obtained. The preferable exposure light is far ultraviolet light with wavelengths of 250 nm or shorter, more preferably 220 nm or shorter. Specific examples of such exposure light include KrF excimer laser (248 nm), ArF excimer laser (193 nm), $F_2$ excimer laser (157 nm), X-ray and electron beam. In particular, ArF excimer laser is most preferred.

In the development step, a developer described below is used. As a developer for the positive photosensitive composition, an aqueous alkaline solution containing an inorganic alkali such as sodium hydroxide, potassium hydroxide, sodium carbonate, sodium silicate, sodium metasilicate and aqueous ammonia, a primary amine such as ethylamine and n-propylamine, a secondary amine such as diethylamine and di-n-butylamine, a tertiary amine such as triethylamine and methyldiethylamine, an alcoholamine such as dimethylethanolamine and triethanolamine, a quaternary ammonium salt such as tetramethylammonium hydroxide and tetraethylammonium hydroxide, and a cyclic amine such as pyrrole and piperidine.

To the aqueous alkaline solution, an alcohol or a surfactant may further be added in an appropriate amount.

The invention will now be illustrated in more detail with reference to the following examples, but these examples should not be construed as limiting the scope of the invention in any way.

Synthesis Example of Acid Generator

SYNTHESIS EXAMPLE 1

Synthesis of Acid Generator (I-1)

To a mixture of 16.4 g of $AgBF_4$ and 150 ml of acetonitrile, a solution containing 16.0 g of phenacyl bromide and 12.4 g of di-n-butylsulfide in 50 ml of acetonitrile was added over a 30-minute period. The admixture was stirred for one night at room temperature. The reaction solution was concentrated to form a powdery precipitate. The precipitate was washed with diisopropyl ether to obtain 27 g of phenacyldi-n-butylsulfonium tetrafluoroborate.

The phenacyldi-n-butylsulfonium tetrafluoroborate in an amount of 10 g was dissolved in 200 ml of methanol, to the solution was added 10.1 g of potassium nonafluorobutanesulfonate and the mixture was stirred for one hour at room temperature. The reaction solution was mixed with 500 ml of chloroform, and the mixture was washed two times with each 300 ml of distilled water. By concentrating the organic layer, 9.8 g of Acid Generator (I 1) was obtained.

Other compounds were also synthesized in a similar manner.

Synthesis Example of Resin

SYNTHESIS EXAMPLE (1)

Synthesis of Resin (1) (Side-chain Type)

In a reaction vessel, 2-ethyl-2-adamantylmethacrylate and butyrolactone methacrylate were placed in an proportion of 55:45 and dissolved in a 5:5 mixture of methyl ethyl ketone and tetrahydrofuran, thereby preparing 100 ml of a solution having a solid concentration of 20%. To the solution was added 2 mole % of V-65 produced by Wako Pure Chemical Industries, Ltd., and the solution was added dropwise to 10 ml of methyl ethyl ketone heated to 60° C. over a period of 4 hours in an atmosphere of nitrogen. After the completion of the addition, the reaction solution was heated for 4 hours, 1 mole % of V-65 was again added thereto, and then stirred for 4 hours. After the completion of the reaction, the reaction solution was cooled to room temperature, and poured into 3 liters of a 1:1 mixture of distilled water and isopropyl alcohol to crystallize. The white powder deposited was recovered to obtain Resin (1).

The ratio of monomer units in the resin determined by $C^{13}$-NMR was 46:54. The resin had a weight average molecular weight of 10,700 as measured by GPC and calculated in terms of standard polystyrene.

Resins (2) to (15) were synthesized in a similar manner to Synthesis Example (1) respectively.

The ratio of monomer composition and molecular weight of each of Resins (2) to (15) are shown in Table 1. (The arranging order of Repeating Units 1, 2, 3 and 4 in Table 1 corresponds to the sequence starting from the left in each of the structural formulae shown below).

TABLE 1

| Resin | Repeating Unit 1 (mole %) | Repeating Unit 2 (mole %) | Repeating Unit 3 (mole %) | Repeating Unit 4 (mole %) | Molecular Weight |
|---|---|---|---|---|---|
| 2 | 53 | 40 | 7 | — | 13,400 |
| 3 | 46 | 34 | 20 | — | 9,400 |
| 4 | 42 | 31 | 27 | — | 8,300 |
| 5 | 49 | 42 | 9 | — | 9,900 |
| 6 | 42 | 30 | 28 | — | 10,300 |
| 7 | 39 | 35 | 26 | — | 8,900 |
| 8 | 46 | 22 | 30 | 2 | 12,900 |
| 9 | 42 | 20 | 32 | 6 | 11,600 |
| 10 | 46 | 42 | 12 | — | 9,200 |
| 11 | 38 | 32 | 30 | — | 11,300 |
| 12 | 42 | 18 | 38 | 2 | 13,800 |
| 13 | 38 | 31 | 29 | 2 | 11,100 |
| 14 | 50 | 31 | 19 | — | 11,700 |
| 15 | 40 | 20 | 40 | — | 19,000 |

The structural formulae of Resins (1) to (15) are illustrated below:

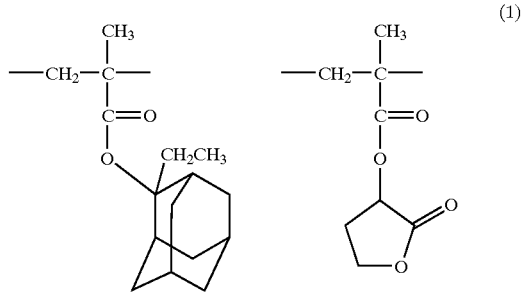

(2)
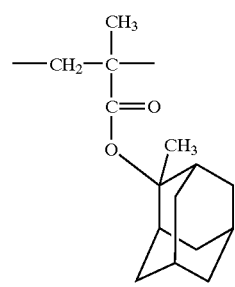 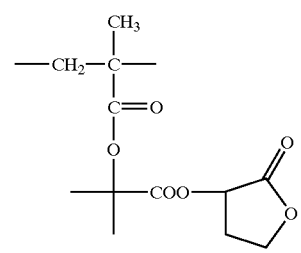
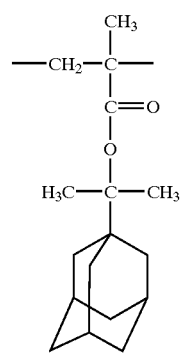
(3)
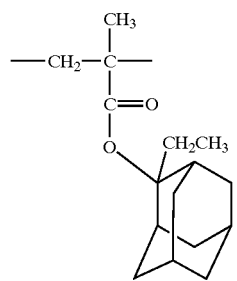 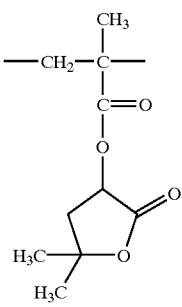
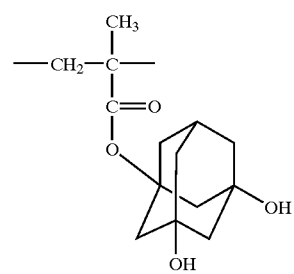
(4)
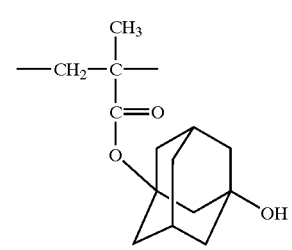
(5)
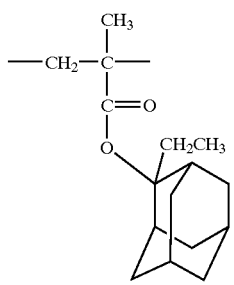 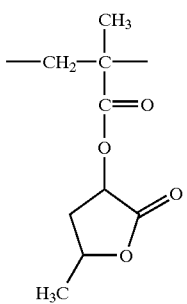
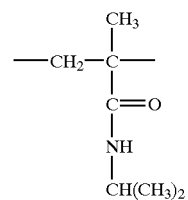
(6)
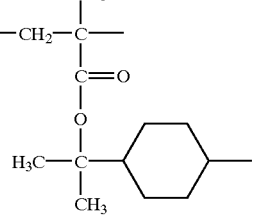 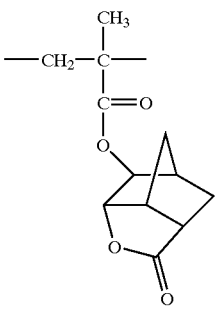
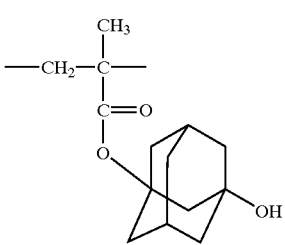
(7)
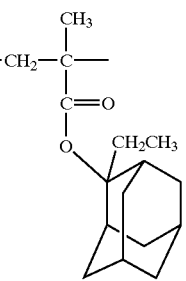 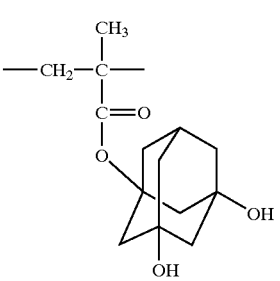

(8)
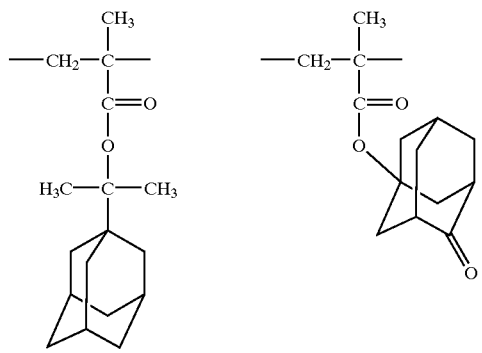
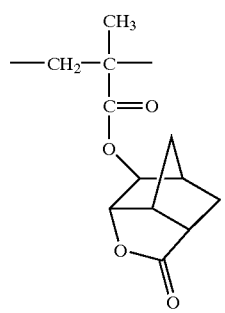
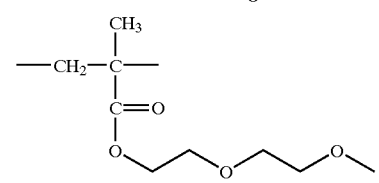
(9)
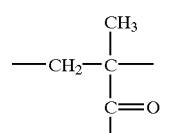
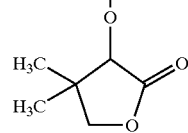
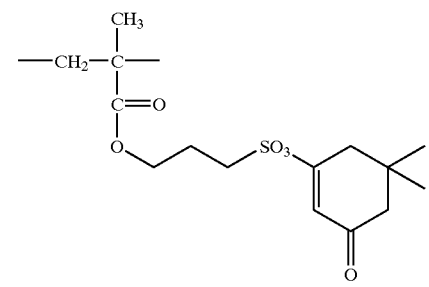
(10)
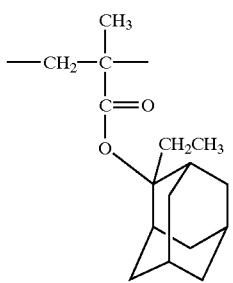
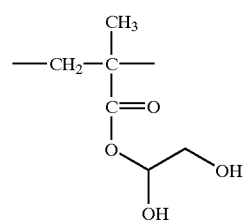
(11)
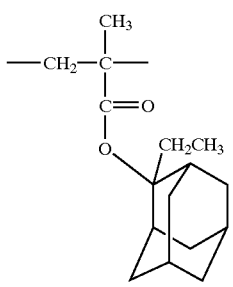
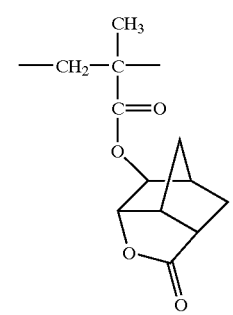
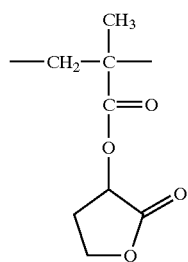
(12)
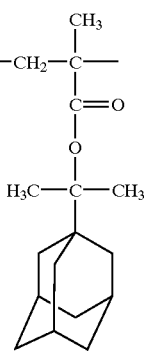

-continued

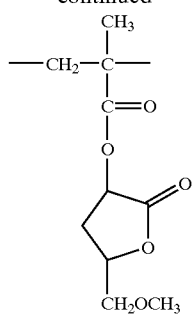

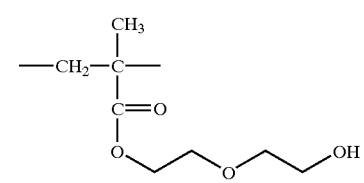

(13)

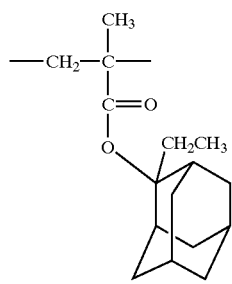 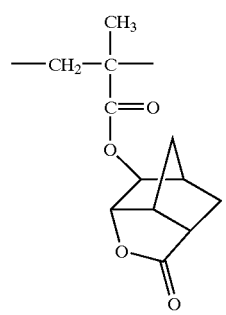

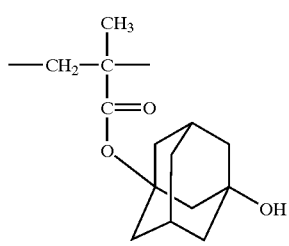

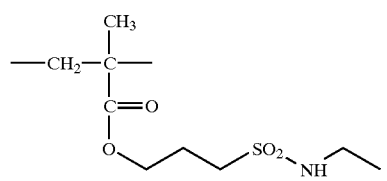

(14)

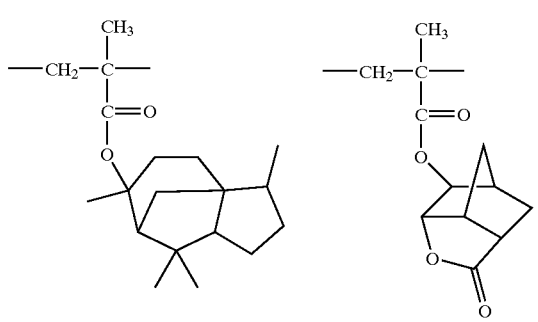

-continued

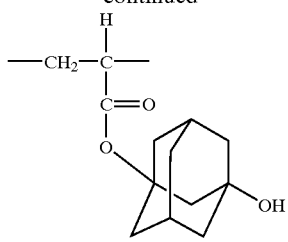

(15)

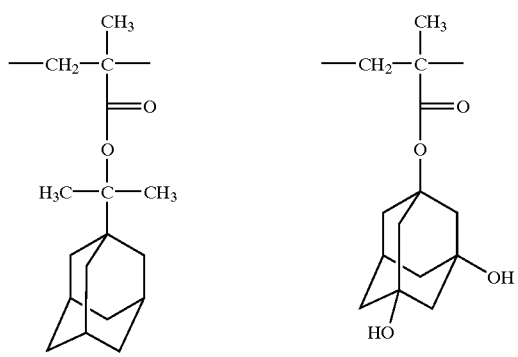

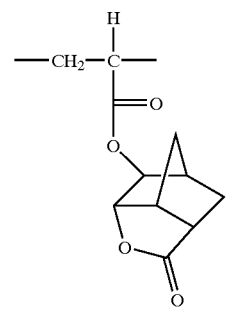

SYNTHESIS EXAMPLE (2)

Synthesis of Resin (16) [Main-chain Type]

In a separable flask were placed norbornenecarboxylic acid tert-butyl ester, norbornenecarboxylic acid butyrolactone ester and maleic anhydride in a molar ratio of 40:10:50, and THF in an amount so as to prepare a solution having a reaction concentration of 60 weight %. The mixture was heated at 60° C. in a stream of nitrogen. After the reaction temperature was stabilized, 2 mole % of a radical initiator (V-601 produced by Wako Pure Chemical Industries, Ltd.) was added to initiate the reaction. The heating was continued for 12 hours. The reaction mixture obtained was diluted with two times of tetrahydrofuran, and then poured into a 1:1 mixture of hexane and isopropyl alcohol to deposit white powder. The powder deposited was collected by filtration and dried to obtain the intended Resin (16).

As a result of molecular weight analysis by GPC, it was found that Resin (16) obtained had a weight average molecular weight of 8,300 as calculated in terms of standard polystyrene. Also, it was confirmed from the NMR spectrum that the molar ratio of norbornenecarboxylic acid tert-butyl ester, norbornenecarboxylic acid butyrolactone ester and maleic anhydride repeating units was 42:8:50.

Resins (17) to (27) were synthesized in a similar manner to Synthesis Example (2) respectively.

The ratio of monomer composition and molecular weight or each of Resins (17) to (27) are shown in Table 2. (The arranging order of Alicyclic Olefin Units 1, 2 and 3 in Table 2 corresponds to the sequence starting from the left in each of the structural formulae shown below).
TABLE 2
| Resin | Alicyclic Olefin Unit 1 (mole %) | Alicyclic Olefin Unit 2 (mole %) | Alicyclic Olefin Unit 3 (mole %) | Maleic Anhydride (mole %) | Molecular Weight |
|---|---|---|---|---|---|
| 17 | 35 | 15 | — | 50 | 8,200 |
| 18 | 20 | 30 | — | 50 | 8,600 |
| 19 | 36 | 14 | — | 50 | 9,100 |
| 20 | 31 | 19 | — | 50 | 7,900 |
| 21 | 35 | 5 | 10 | 50 | 8,300 |
| 22 | 33 | 17 | — | 50 | 8,500 |
| 23 | 38 | 12 | — | 50 | 8,900 |
| 24 | 31 | 6 | 13 | 50 | 8,100 |
| 25 | 33 | 7 | 10 | 50 | 9,100 |
| 26 | 40 | 10 | — | 50 | 9,300 |
| 27 | 34 | 16 | — | 50 | 8,800 |
The structural formulae of Resins (16) to (27) are illustrated below:
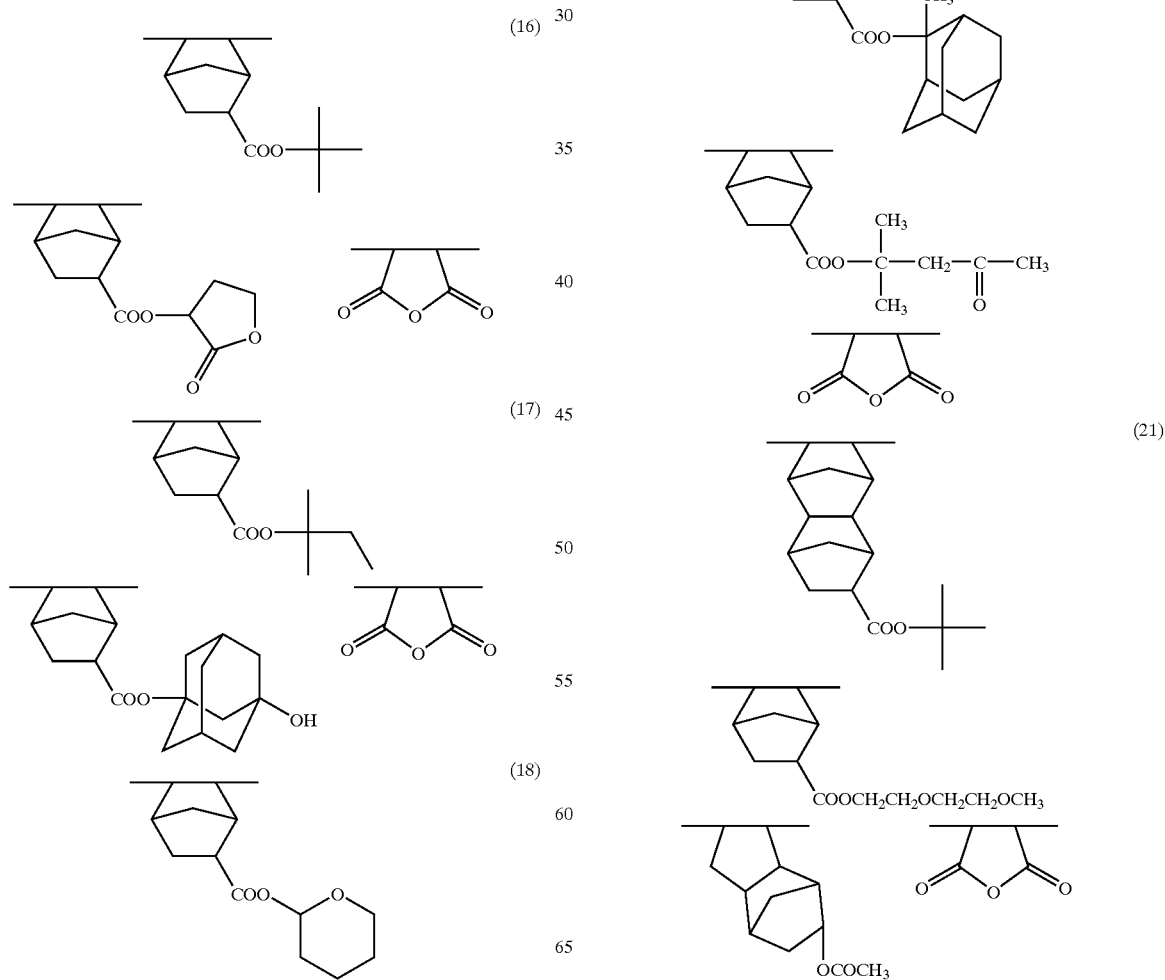

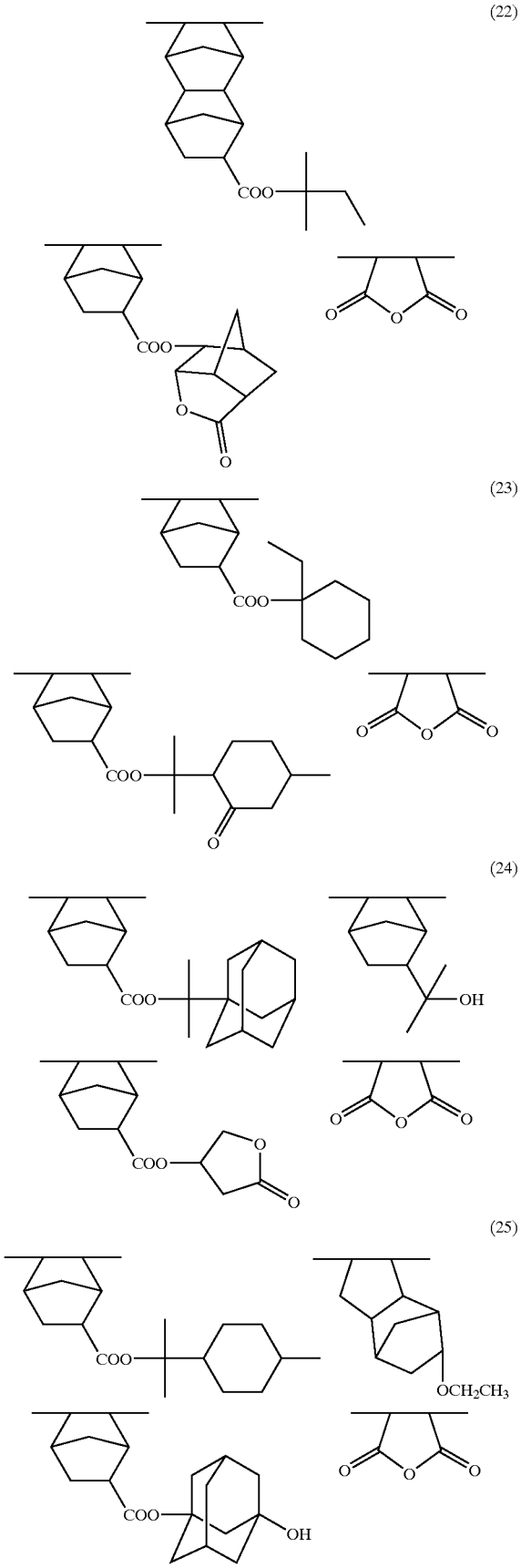

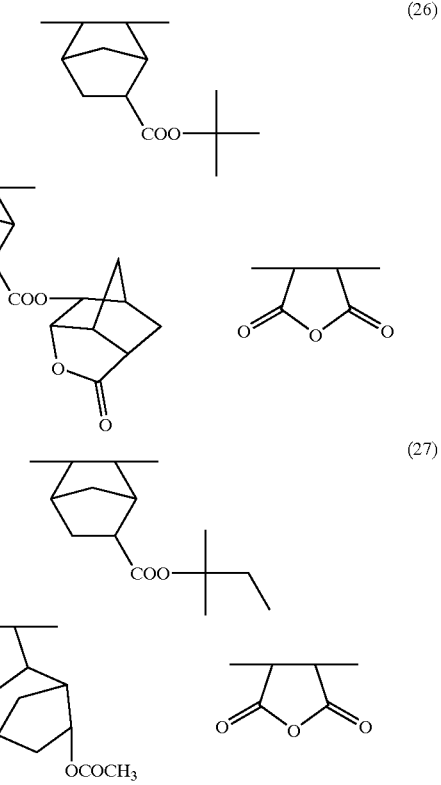

SYNTHESIS EXAMPLE (3)

Synthesis of Resin (28) [Hybrid Type]

In a reaction vessel, norbornene, maleic anhydride, tert-butyl acrylate and 2-methylcyclohexyl-2-propyl acrylate were placed in a molar ratio of 35:35:20:10, and dissolved in tetrahydrofuran, thereby preparing a solution having a solid concentration of 60 weight %. The solution was heated at 65° C. in a stream of nitrogen. After the reaction temperature was stabilized, 2 mole % of a radical initiator (V-601 produced by Wako Pure Chemical Industries, Ltd.) was added to initiate the reaction. The heating was continued for 8 hours. The reaction mixture was diluted with two times of tetrahydrofuran, and then poured into hexane having a volume five times as large as the reaction mixture volume to deposit white powder. The powder deposited was collected by filtration, dissolved in methyl ethyl ketone, reprecipitated from 5 times in volume of a 1:1 mixed solvent of hexane and tert-butyl methyl ether. The thus precipitated white powder was collected by filtration and dried to obtain the intended Resin (28).

As a result of molecular weight analysis by GPC, it was found that Resin (28) obtained had a weight average molecular weight of 12,100 as calculated in terms of standard polystyrene. Also, it was confirmed from the NMR spectrum that the molar ratio of norbornene, maleic anhydride, tert-butyl acrylate and 2-methylcyclohexyl-2-propyl acrylate repeating units was 32:39:19:10.

Resins (29) to (41) were synthesized in a similar manner to synthesis Example (3) respectively.

The ratio of monomer composition and molecular weight h of Resins (29) to (41) and the molecular weight of each are shown in Table 3.

TABLE 3
| Resin | Norbornene | Acid Anhydride | (Meth) acrylate | Mw |
|---|---|---|---|---|
| 29 | 20/15 | 40 | 15/10 | 11,900 |
| 30 | 32 | 37 | 20/8/3 | 10,500 |
| 31 | 16 | 21 | 36/27 | 13,900 |
| 32 | 15 | 22 | 34/29 | 12,300 |
| 33 | 17 | 20 | 33/30 | 12,400 |
| 34 | 8 | 24 | 32/26 | 13,000 |
| 35 | 15 | 19 | 36/30 | 12,700 |
| 36 | 15 | 20 | 29/10/26 | 13,100 |
| 37 | 17 | 21 | 31/31 | 12,800 |
| 38 | 18 | 17/3 | 30/32 | 13,300 |
| 39 | 16 | 19 | 31/12/11/11 | 12,600 |
| 40 | 20 | 22 | 58 | 14,700 |
| 41 | 23 | 28 | 35/14 | 13,300 |
The structural formulae of Resins (28) to (41) are illustrated below:
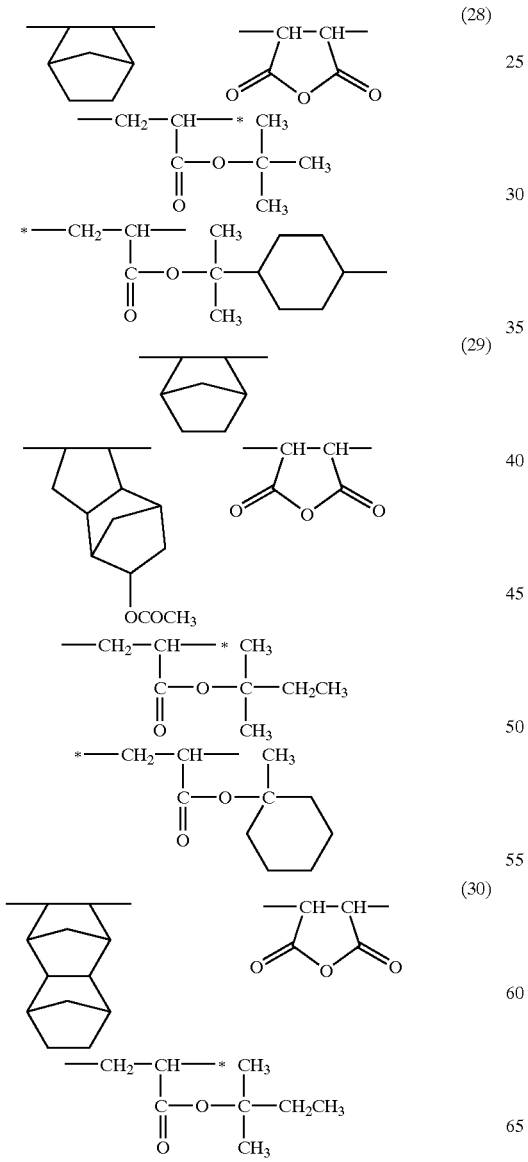
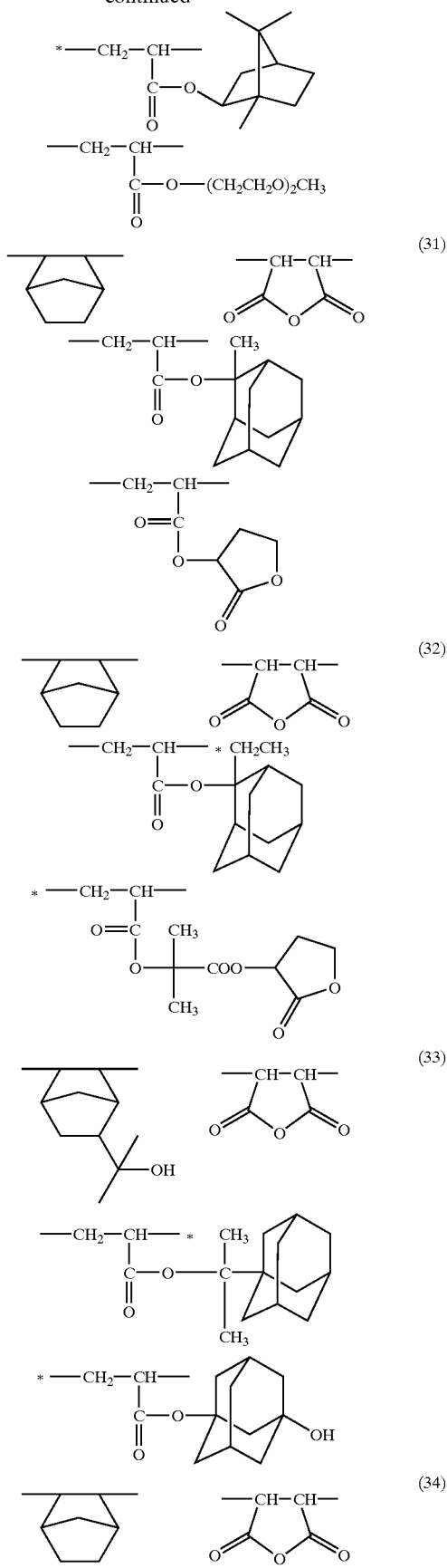

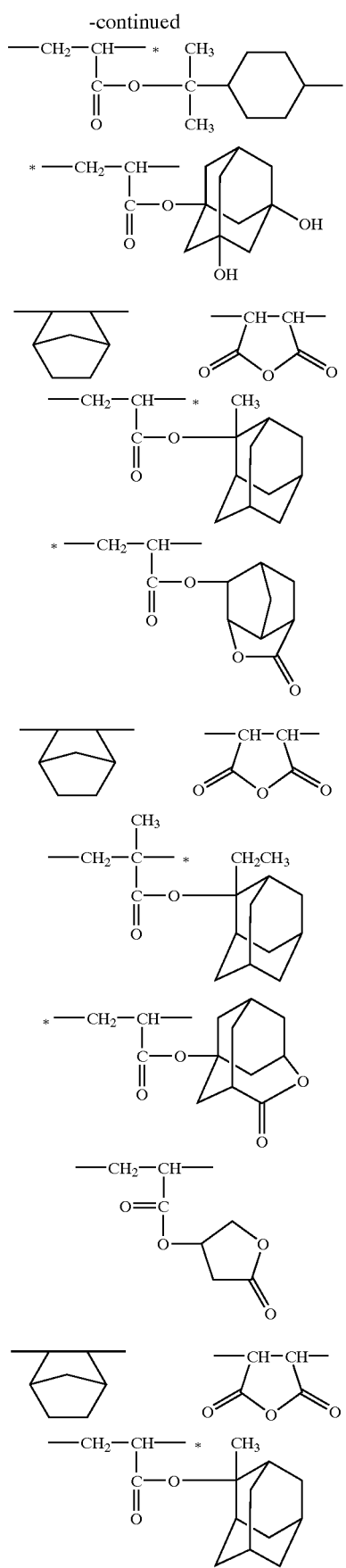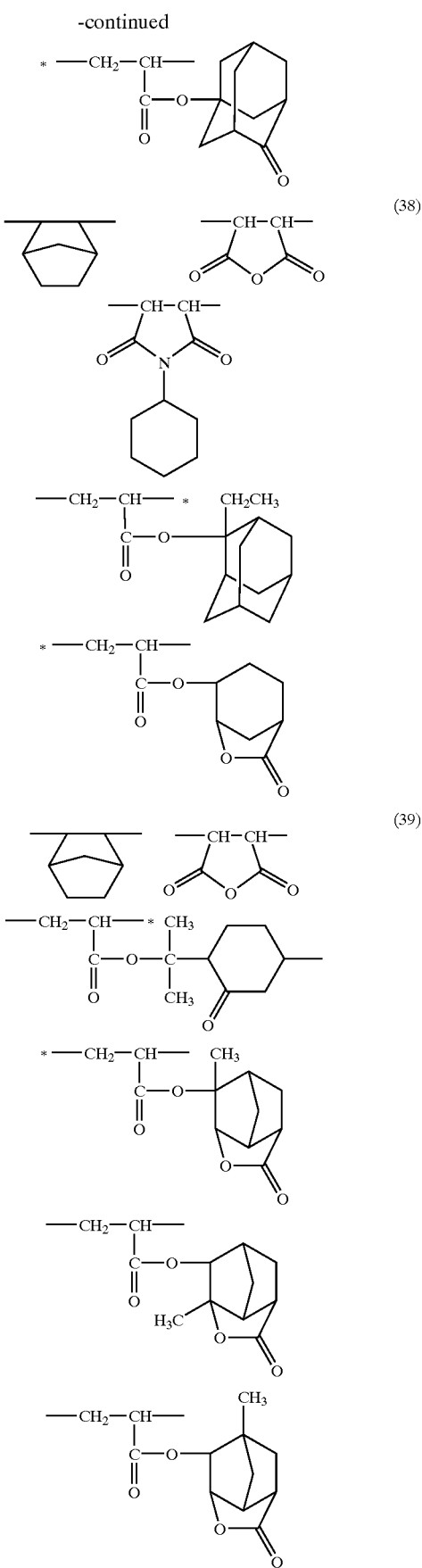

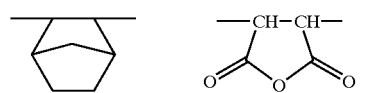

(40)

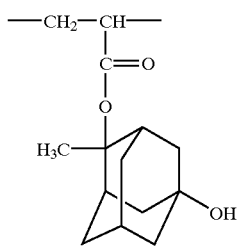

(41)

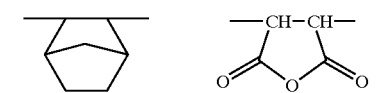

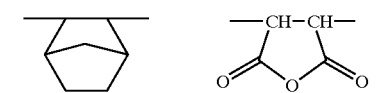

EXAMPLES 1 to 41 AND COMPARATIVE EXAMPLES 1 to 3

<Preparation of Resist>

Each solution having a solid concentration of 12 weight % was prepared by dissolving the components set forth in Tables 4 to 6, and filtered through a 0.1-μm Teflon or polyethylene filter to prepare a photosensitive composition. The composition thus prepared was evaluated by the methods described hereinafter. The results obtained are shown in Tables 7 to 9. The components same as in Examples 1, 16 and 28 were used Comparative Examples 1, 2 and 3, except that the acid generators used were changed to acid generators other than those represented by formula (I) respectively.

TABLE 4

|  | Resin (10 g) | Acid Generator (g) | Basic Compound (g) | Surfactant (0.03 g) | Solvent (ratio by weight) | Other Additive (g) |
|---|---|---|---|---|---|---|
| Example 1 | Resin (1) | I-1 (0.6) | DBN (0.02) | W-1 | A1 = 100 | — |
| Example 2 | Resin (2) | I-2 (0.2) Z33 (0.1) | TPI (0.03) | W-1 | A1 = 100 | — |
| Example 3 | Resin (3) | I-4 (0.3) Z6 (0.15) | TPSA (0.02) | W-2 | A1 = 100 | — |
| Example 4 | Resin (4) | I-3 (0.3) Z3 (0.1) | HEP (0.01) | W-2 | A3/B1 = 80/20 | — |
| Example 5 | Resin (5) | I-10 (0.5) | DIA (0.02) | W-3 | A2/B1 = 90/10 | — |
| Example 6 | Resin (6) | I-16 (0.3) z22 (0.2) | DIA (0.03) | W-3 | A4/B1 = 90/10 | LCB (1) |
| Example 7 | Resin (7) | I-18 (0.6) Z12 (0.05) | TPA (0.007) | W-4 | A1/B1 = 50/50 | — |
| Example 8 | Resin (8) | I-22 (0.2) Z5 (0.1) | DBN (0.02) | W-4 | A1/B1 = 90/10 | — |
| Example 9 | Resin (9) | I-26 (0.3) Z34 (0.1) | TPI (0.03) | W-1 | A5/B2 = 90/10 | — |
| Example 10 | Resin (10) | I-13 (0.4) Z30 (0.2) | TPI (0.02) | W-1 | A1/B1 = 95/5 | — |
| Example 11 | Resin (11) | I-31 (0.4) Z35 (0.4) | TPI (0.03) | W-2 | A1/B1 = 90/10 | — |
| Example 12 | Resin (12) | I-43 (0.3) Z6 (0.1) | TPI (0.03) | W-2 | A1/B1 = 95/5 | — |
| Example 13 | Resin (13) | I-46 (0.6) | TPI (0.03) | W-3 | A1/B1 = 95/5 | — |
| Example 14 | Resin (14) | I-72 (0.1) Z32 (0.1) | DBN (0.02) | W-3 | A1/B1 = 95/5 | — |
| Example 15 | Resin (15) | I-1 (0.3) Z33 (0.75) | TPI (0.03) | W-4 | A1/B1 = 80/20 | — |

TABLE 5

| | Resin (10 g) | Acid Generator (g) | Basic Compound (g) | Surfactant (0.03 g) | Solvent (ratio by weight) | Other Additive (g) |
|---|---|---|---|---|---|---|
| Example 16 | Resin (16) | I-37 (0.2) Z32 (0.3) | TPA (0.01) | W-4 | A1 = 100 | — |
| Example 17 | Resin (17) | I-49 (0.3) Z33 (0.75) | TPI (0.03) | W-4 | A1 = 100 | — |
| Example 18 | Resin (18) | I-61 (0.5) Z26 (0.5) | DCMA (0.01) | W-4 | A1 = 100 | — |
| Example 19 | Resin (19) | I-19 (0.3) Z16 (0.15) | TPI (0.02) | W-4 | A1/B1 = 95/5 | — |
| Example 20 | Resin (20) | I-7 (0.2) Z28 (0.2) | TPI (0.03) | W-4 | A1/B1 = 95/5 | — |
| Example 21 | Resin (21) | I-1 (0.3) I-14 (0.3) | DBN (0.03) | W-1 | A1/B1 = 95/5 | — |
| Example 22 | Resin (22) | I-2 (0.2) Z33 (0.75) | TPI (0.03) | W-1 | A1/B1 = 80/20 | — |
| Example 23 | Resin (23) | I-4 (0.3) Z6 (0.15) | TPSA (0.02) | W-2 | A1/B1 = 90/10 | — |
| Example 24 | Resin (24) | I-3 (0.3) Z3 (0.1) | HEP (0.01) | W-2 | A3/B2 = 80/20 | — |
| Example 25 | Resin (25) | I-10 (0.5) | DIA (0.02) | W-3 | A2/B1 = 90/10 | — |
| Example 26 | Resin (26) | I-16 (0.3) Z22 (0.2) | DIA (0.03) | W-3 | A4/B1 = 90/10 | — |
| Example 27 | Resin (27) | I-18 (0.6) Z12 (0.05) | TPA (0.007) | W-4 | A1/B1 = 50/50 | LCB (1) |
| Example 28 | Resin (28) | I-22 (0.2) Z5 (0.1) | DBN (0.02) | W-4 | A1/B1 = 90/10 | — |
| Example 29 | Resin (29) | I-26 (0.3) Z34 (0.1) | TPI (0.03) | W-1 | A5/B2 = 90/10 | — |
| Example 30 | Resin (30) | I-13 (0.4) Z30 (0.2) | TPI (0.02) | W-1 | A1/B1 = 95/5 | — |

TABLE 6

| | Resin (10 g) | Acid Generator (g) | Basic Compound (g) | Surfactant (0.03 g) | Solvent (ratio by weight) | Other Additive (g) |
|---|---|---|---|---|---|---|
| Example 31 | Resin (31) | I-31 (0.4) Z35 (0.4) | TPI (0.03) | W-2 | A1/B1 = 90/10 | — |
| Example 32 | Resin (32) | I-43 (0.3) Z6 (0.1) | TPI (0.03) | W-2 | A1/B1 = 95/5 | — |
| Example 33 | Resin (33) | I-46 (0.6) | TPI (0.03) | W-3 | A1/B1 = 95/5 | — |
| Example 34 | Resin (34) | I-72 (0.1) Z32 (0.1) | DBN (0.02) | W-3 | A1/B1 = 95/5 | — |
| Example 35 | Resin (35) | I-3 (0.3) Z33 (0.75) | TPI (0.03) | W-4 | A1/B1 = 80/20 | — |
| Example 36 | Resin (36) | I-37 (0.2) I-32 (0.3) | TPI (0.01) | W-4 | A1/B1 = 80/20 | — |
| Example 37 | Resin (37) | I-49 (0.3) Z33 (0.75) | TPI (0.03) | W-4 | A1/B1 = 95/5 | — |
| Example 38 | Resin (38) | I-61 (0.5) Z26 (0.2) | DCMA (0.01) | W-4 | A1/B1 = 95/5 | — |
| Example 39 | Resin (39) | I-19 (0.3) Z16 (0.15) | TPI (0.02) | W-4 | A1/B1 = 95/5 | — |
| Example 40 | Resin (40) | I-7 (0.2) Z28 (0.2) | TPI (0.03) | W-4 | A1/B1 = 95/5 | — |
| Example 41 | Resin (41) | I-1 (0.15) I-15 (0.15) Z33 (0.75) | DBN (0.02) | W-1 | A1/B1 = 95/5 | — |
| Comparative Example 1 | Resin (1) | Z31 (0.6) | DBN (0.02) | W-1 | A1 = 100 | — |
| Comparative Example 2 | Resin (16) | Z31 (0.2) Z32 (0.3) | TPA (0.01) | W-4 | A1 = 100 | — |
| Comparative Example 3 | Resin (28) | Z31 (0.2) Z5 (0.1) | DBN (0.02) | W-4 | A1/B1 = 90/10 | — |

The abbreviations used in Tables 4 to 6 stand for the following compounds:

DBN: 1,5-Diazabicyclo[4.3.0]non-5-ene
TPI: 2,4,5-Triphenylimidazole
TPSA: Triphenylsulfonium acetate
HEP: N-Hydroxyethylpiperidine
DIA: 2,6-Diisopropylaniline
DCMA: Dicyclohexylmethylamine
TPA: Tripentylamine
LCB: tert-Butyl lithocholate
W-1: Megafac F176 (produced by Dainippon Ink & Chemicals, Inc.) (surfactant containing fluorine atom)
W-2: Megafac R08 (produced by Dainippon Ink & Chemicals, Inc.) (surfactant containing fluorine and silicon atoms)
W-3: Polysiloxane polymer KP-341 (produced by Shin-Etsu Chemical Industry Co., Ltd.) (surfactant containing silicon atom)
W-4: Troysol S-366 (produced by Troy Chemical Industries, Inc.)

The abbreviations of the solvents are shown below. When two or more kinds of solvents were used in combination, the ratio thereof is expressed in weight in Tables 4 to 6.

A1: Propylene glycol methyl ether acetate
A2: 2-Heptanone
A3: Ethyl ethoxypropionate
A4: γ-butyrolactone
A5: Cyclohexanone
B1: Propylene glycol methyl ether
B2: Ethyl lactate (1) Evaluation of Profile An anti-reflecting coating (DUV-42 produced by Brewer Science, Inc.) was coated uniformly by means of a spin coater at a thickness of 600 angstroms on a silicon substrate treated with hexamethyldisilazane, dried on a hot plate at 100° C. for 90 seconds, and further heated at 190° C. for 240 seconds. On the substrate, each photosensitive resin composition was coated by means of a spin coater, and dried at 120° C. for 90 seconds to form a 0.30 μm-thick resist film. Each resist film was subjected to exposure via a mask by means of an ArF excimer laser stepper (produced by ISI Co., Ltd.; NA=0.6). Immediately after the exposure, the resist film was heated at 120° C. for 90 seconds on a hot plate. The resist film was developed with a 2.38% aqueous solution of tetramethylammonium hydroxide at 23° C. for 60 seconds, rinsed with pure water for 30 seconds, and dried to obtain line patterns.

Line profiles of 0.15 μm line-and-space (1/1) patterns were observed under a scanning electron microscope. When the line profiles had rectangular shapes, they were rated as A. When the line profiles had slightly tapered or flared shapes, they were rated as B. When the line profiles had utterly tapered or flared shapes, they were rated as C.

(2) Evaluation of Inhibition of Pattern Collapsing

The evaluation was made on 5 successive lines of 0.15 μm line-and-space (1/1) patterns.

Specifically, resolution at which all the 5 lines were resolved without collapsing in the exposure amount necessary for reproducing the 0.15 μm line-and-space (1/1) patterns was measured.

TABLE 7

|  | Profile | Resolution (μm) |
| --- | --- | --- |
| Example 1 | A | 0.105 |
| Example 2 | A | 0.105 |
| Example 3 | A | 0.110 |
| Example 4 | A | 0.105 |
| Example 5 | A | 0.110 |
| Example 6 | A | 0.105 |
| Example 7 | A | 0.110 |
| Example 8 | A | 0.105 |
| Example 9 | A | 0.110 |
| Example 10 | A | 0.110 |
| Example 11 | A | 0.105 |
| Example 12 | A | 0.110 |
| Example 13 | A | 0.105 |
| Example 14 | A | 0.105 |
| Example 15 | A | 0.105 |

TABLE 8

|  | Profile | Resolution (μm) |
| --- | --- | --- |
| Example 16 | A | 0.110 |
| Example 17 | A | 0.110 |
| Example 18 | A | 0.120 |
| Example 19 | A | 0.120 |
| Example 20 | A | 0.110 |
| Example 21 | A | 0.110 |
| Example 22 | A | 0.120 |
| Example 23 | A | 0.110 |
| Example 24 | A | 0.120 |
| Example 25 | A | 0.120 |
| Example 26 | A | 0.110 |
| Example 27 | A | 0.110 |
| Example 28 | A | 0.110 |
| Example 29 | A | 0.120 |
| Example 30 | A | 0.110 |

TABLE 9

|  | Profile | Resolution (μm) |
| --- | --- | --- |
| Example 31 | A | 0.120 |
| Example 32 | A | 0.110 |
| Example 33 | A | 0.120 |
| Example 34 | A | 0.120 |
| Example 35 | A | 0.110 |
| Example 36 | A | 0.110 |
| Example 37 | A | 0.120 |
| Example 38 | A | 0.110 |
| Example 39 | A | 0.120 |
| Example 40 | A | 0.120 |
| Example 41 | A | 0.110 |
| Comparative Example 1 | A | 0.150 |
| Comparative Example 2 | B | 0.140 |
| Comparative Example 3 | C | 0.140 |

As can be seen from the results shown in Tables 7 to 9, the positive photosensitive compositions of Examples 1 to 41 are excellent in the pattern profile. Further, the pattern collapsing did not occur in the positive photosensitive compositions of Examples 1 to 41. On the contrary, the positive photosensitive compositions of Comparative Examples 1 to 3 exhibited reduction in the resolution due to the pattern collapsing.

The positive photosensitive composition according to the invention is excellent in the pattern profile and the inhibition of pattern collapsing.

The entire disclosure of each and every foreign patent application from which the benefit of foreign priority has been claimed in the present application is incorporated herein by reference, as if fully set forth herein.

While the invention has been described in detail and with reference to specific embodiments thereof, it will be apparent to one skilled in the art that various changes and modifications can be made therein without departing from the spirit and scope thereof.

What is claimed is:

1. A positive photosensitive composition comprising (A) an acid generator, which generates an acid upon irradiation with actinic ray or radiation, represented by formula (I) shown below, and (B) a resin having a monocyclic or polycyclic alicyclic hydrocarbon structure and being decomposed by the action of an acid to increase dissolution speed in an alkali developer:

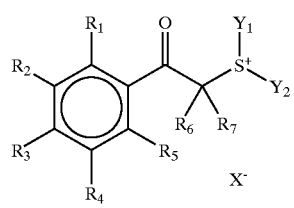
(I)

wherein $R_1$ to $R_5$, which may be the same or different, each represent a hydrogen atom, a nitro group, a halogen atom, or an unsubstituted or substituted alkyl, alkoxy, alkyloxycarbonyl, aryl or acylamino group, or at least two of $R_1$ to $R_5$ may combine with each other to form a cyclic structure; $R_6$ and $R_7$, which may be the same or different, each represent a hydrogen atom, a cyano group, or an unsubstituted or substituted alkyl or aryl group; $Y_1$ and $Y_2$, which may be the same or different, each represent an unsubstituted alkyl group, an alkyl group having a substituent, an ether linkage group or a sulfide linkage group, or an unsubstituted or substituted alkenyl group, provided that when both $Y_1$ and $Y_2$ are alkyl groups, at least either $Y_1$ or $Y_2$ has a hydroxy group, an ether linkage group or a sulfide linkage group, or each of the alkyl groups contains at least 2 carbon atoms, and provided that $Y_1$ and $Y_2$ do not combine with each other to form a ring; at least one of $R_1$ to $R_5$ and at least either $Y_1$ or $Y_2$ may combine with each other to complete a ring, at least one of $R_1$ to $R_5$ and at least either $R_6$ or $R_7$ may combine with each other to complete a ring, at least two structures represented by formula (I) may be linked together in any of the positions of $R_1$ to $R_7$, $Y_1$ and $Y_2$ via a linkage group; and $X^-$ represents a sulfonic acid anion, a carboxylic acid anion, a bis(alkylsulfonyl)imide anion or a tris(alkylsulfonyl)methyl anion.

2. The positive photosensitive composition as claimed in claim 1, which further comprises (C) a basic compound and (D) a fluorine-contained and/or silicon-contained surfactant.

3. The positive photosensitive composition as claimed in claim 2, wherein the basic compound (C) is a compound having at least one structure selected from an imidazole structure, a diazabicyclo structure, an onium hydroxide structure, an onium carboxylate structure, a trialkylamine structure and an aniline structure.

4. The positive photosensitive composition as claimed in claim 1, wherein the resin (B) further contains a repeating unit including a group represented by any one of the following formulae (V-1) to (V-4):

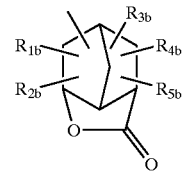
(V-1)

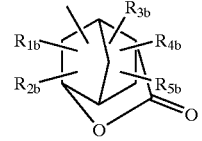
(V-2)

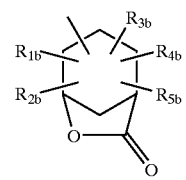
(V-3)

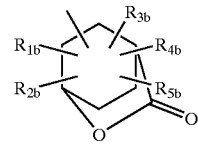
(V-4)

wherein $R_{1b}$ to $R_{5b}$ independently represent a hydrogen atom or an unsubstituted or substituted alkyl, cycloalkyl or alkenyl group, or two of $R_{1b}$ to $R_{5b}$ may combine with each other to form a ring.

5. The positive photosensitive composition as claimed in claim 1, wherein the resin (B) further contains a repeating unit represented by the following formula (VI):

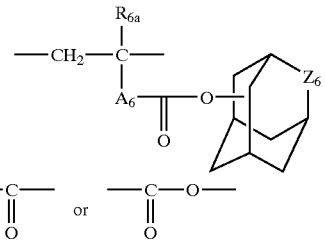
(VI)

wherein $A_6$ represents a single bond, an alkylene group, a cycloalkylene group, an ether group, a thioether group, a carbonyl group, an ester group or a group formed by combining any two or more of these groups; and $R_{6a}$ represents a hydrogen atom, a $C_1$–$C_4$ alkyl group, a cyano group, or a halogen atom.

6. The positive photosensitive composition as claimed in claim 1, wherein the resin (B) further contains a repeating unit having a group represented by the following formula (VII):

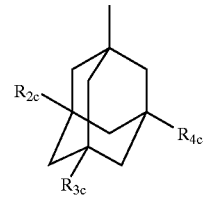
(VII)

wherein $R_{2c}$ to $R_{4c}$ independently represent a hydrogen atom or a hydroxy group, provided that at least one of $R_{2c}$ to $R_{4c}$ represents a hydroxy group.

7. The positive photosensitive composition as claimed in claim 1, wherein the resin (B) further contains a repeating unit represented by the following formula (VIII):

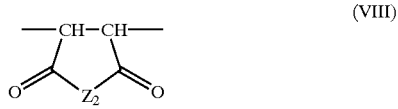

(VIII)

wherein $Z_2$ represents —O— or —N($R_{41}$)— wherein $R_{41}$ represents a hydrogen atom, a hydroxy group, an alkyl group, a haloalkyl group or —OSO$_2$—$R_{42}$, and $R_{42}$ represents an alkyl group, a haloalkyl group, a cycloalkyl group or a camphor residue.

8. The positive photosensitive composition as claimed in claim 1, wherein $Y_1$ and $Y_2$ each represent an alkyl group containing at least 3 carbon atoms.

9. The positive photosensitive composition as claimed in claim 1, wherein $Y_1$ and $Y_2$ each represent an alkyl group containing at least 4 carbon atoms.

10. The positive photosensitive composition as claimed in claim 1, wherein $Y_1$ and $Y_2$ each represent a butyl group or a hydroxyethyl group.

11. The positive photosensitive composition as claimed in claim 1, wherein $X^-$ represents a perfluoroalkanesulfonic acid anion or a benzenesulfonic acid anion substituted with a fluorine atom or a fluorine-containing substituent.

12. A positive photosensitive composition comprising
(A) an acid generator, which generates an acid upon irradiation with actinic ray or radiation, represented by formula (I) shown below,

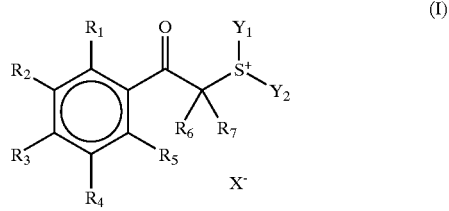

(I)

wherein $R_1$ to $R_5$, which may be the same or different, each represent a hydrogen atom, a nitro group, a halogen atom, or an unsubstituted or substituted alkyl, alkoxy, alkyloxycarbonyl, aryl or acylamino group, or at least two of $R_1$ to $R_5$ may combine with each other to form a cyclic structure; $R_6$ and $R_7$, which may be the same or different, each represent a hydrogen atom, a cyano group, or an unsubstituted or substituted alkyl or aryl group; $Y_1$ and $Y_2$, which may be the same or different, each represent an unsubstituted alkyl group, an alkyl group having a substituent, an ether linkage group or a sulfide linkage group, or an unsubstituted or substituted alkenyl group, provided that when both $Y_1$ and $Y_2$ are alkyl groups, at least either $Y_1$ or $Y_2$ has a hydroxy group, an ether linkage group or a sulfide linkage group, or each of the alkyl groups contains at least 2 carbon atoms; at least one of $R_1$ to $R_5$ and at least either $Y_1$ or $Y_2$ may combine with each other to complete a ring, at least one of $R_1$ to $R_5$ and at least either $R_6$ or $R_7$ may combine with each other to complete a ring, at least two structures represented by formula (I) may be linked together in any of the positions of $R_1$ to $R_7$, $Y_1$ and $Y_2$ via a linkage group; and $X^-$ represents a non-nucleophilic anion, (B) a resin having a monocyclic or polycyclic alicyclic hydrocarbon structure and being decomposed by the action of an acid to increase dissolution speed in an alkali developer, and (F) a dissolution-inhibiting low-molecular compound having a molecular weight of at most 3,000 and a group capable of being decomposed by the action of an acid to increase solubility in an alkali developer.

13. The positive photosensitive composition as claimed in claim 1, wherein the resin (B) further contains a repeating unit having a lactone structure.

14. The positive photosensitive composition as claimed in claim 1, which further comprises (E) a mixture of a hydroxyl group-containing solvent and a hydroxyl group-free solvent.

15. The positive photosensitive composition as claimed in claim 1, wherein the resin (B) is a resin having at least one repeating unit selected from repeating units containing as partial structures alicyclic hydrocarbon moieties represented by formula (pI), (pII), (pIII), (pIV), (pV) or (pVI) shown below and repeating units represented by formula (II-AB) shown below:

(pI)

(pII)

(pIII)

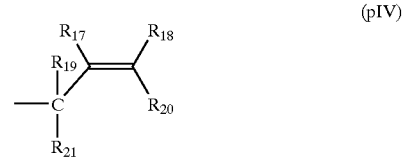

(pIV)

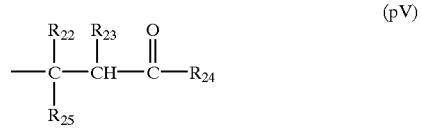

(pV)

(pVI)

wherein $R_{11}$ represents a methyl group, an ethyl group, a n-propyl group, an isopropyl group, a n-butyl group, an isobutyl group or a sec-butyl group; Z represents atoms forming an alicyclic hydrocarbon group together with the carbon atom; $R_{12}$ to $R_{16}$ independently represent a $C_1$–$C_4$ linear or branched alkyl group or an alicyclic hydrocarbon group, provided that at least one of $R_{12}$, $R_{13}$ and $R_{14}$ or either $R_{15}$ or $R_{16}$ is an aliphatic hydrocarbon group; $R_{17}$ to $R_{21}$ independently represent a hydrogen atom, a $C_1$–$C_4$ linear or branched alkyl group or an alicyclic hydrocarbon group, provided that at least one of $R_{17}$ to $R_{21}$ is an aliphatic hydrocarbon group and either $R_{19}$ or $R_{21}$ is a $C_1$–$C_4$ linear or branched alkyl group or an alicyclic hydrocarbon group; and $R_{22}$ to $R_{25}$ independently represent a $C_1$–$C_4$ linear or branched alkyl group or an alicyclic hydrocarbon group, provided that at least one of $R_{22}$ to $R_{25}$ is an alicyclic hydrocarbon group, or $R_{23}$ and $R_{24}$ may combine with each other to form a ring,

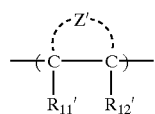

(II-AB)

wherein $R_{11}'$ and $R_{12}'$ independently represent a hydrogen atom, a cyano group, a halogen atom, or an unsubstituted or substituted alkyl group; and Z' represents atoms forming an unsubstituted or substituted alicyclic structure together with the bonded two carbon atoms (C—C).

16. The positive photosensitive composition as claimed in claim 13, wherein the repeating unit having a lactone structure is a repeating unit represented by the following formula (IV):

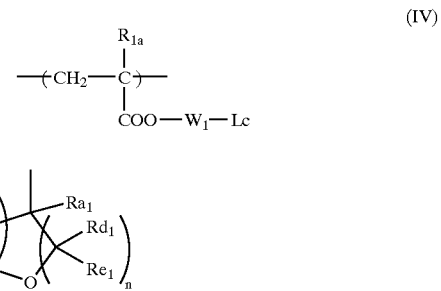

(IV)

wherein $R_{1a}$ represents a hydrogen atom or a methyl group; $W_1$ represents a single bond, an alkylene group, an ether group, a thioether group, a carbonyl group, an ester group, or a group formed by combining at least two of these groups; $R_{a1}$, $R_{b1}$, $R_{c1}$, $R_{d1}$ and $R_{e1}$ independently represent a hydrogen atom or a $C_1$–$C_4$ alkyl group; and m and n independently represent an integer of 0 to 3, provided that m+n is from 2 to 6.

* * * * *